US012604662B2

(12) United States Patent
Kawakami et al.

(10) Patent No.: US 12,604,662 B2
(45) Date of Patent: Apr. 14, 2026

(54) LIGHT-EMITTING DEVICE AND LIGHT-EMITTING APPARATUS

(71) Applicant: SEMICONDUCTOR ENERGY LABORATORY CO., LTD., Atsugi (JP)

(72) Inventors: Sachiko Kawakami, Kanagawa (JP); Yui Yoshiyasu, Kanagawa (JP); Nobuharu Ohsawa, Kanagawa (JP); Tsunenori Suzuki, Kanagawa (JP); Toshiki Sasaki, Kanagawa (JP); Naoaki Hashimoto, Kanagawa (JP); Tomohiro Kubota, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 946 days.

(21) Appl. No.: 17/863,025

(22) Filed: Jul. 12, 2022

(65) Prior Publication Data

US 2023/0076945 A1 Mar. 9, 2023

(30) Foreign Application Priority Data

Jul. 16, 2021 (JP) ................................. 2021-118223

(51) Int. Cl.
*H10K 85/60* (2023.01)
*H10K 50/15* (2023.01)

(52) U.S. Cl.
CPC ....... *H10K 85/6572* (2023.02); *H10K 85/636* (2023.02); *H10K 85/6576* (2023.02); *H10K 50/157* (2023.02)

(58) Field of Classification Search
CPC ........... H10K 2101/10; H10K 2101/90; H10K 85/636; H10K 85/6572; H10K 85/6574;
(Continued)

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | |
|---|---|---|
| JP | 2000-036385 A | 2/2000 |
| JP | 2003-059663 A | 2/2003 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Vu A Nguyen
(74) *Attorney, Agent, or Firm* — Fish & Richardson P.C.

(57) ABSTRACT

A light-emitting device having favorable heat resistance is provided. The light-emitting device includes an anode, a cathode, and an EL layer positioned between the first anode and the cathode. The EL layer includes a light-emitting layer and a first layer. The first layer is positioned between the light-emitting layer and the cathode. The light-emitting layer and the first layer are in contact with each other. The light-emitting layer contains a first organic compound, a second organic compound, and a light-emitting substance. The first layer contains a third organic compound. The first organic compound and the third organic compound each have an electron-transport property. The second organic compound has a hole-transport property. The light-emitting substance emits red light. The first organic compound is represented by General Formula (G100). The third organic compound is represented by General Formula (G300).

(Continued)

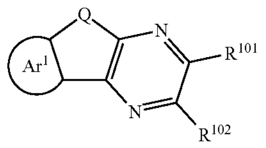

(G100)

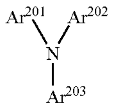

(G200)

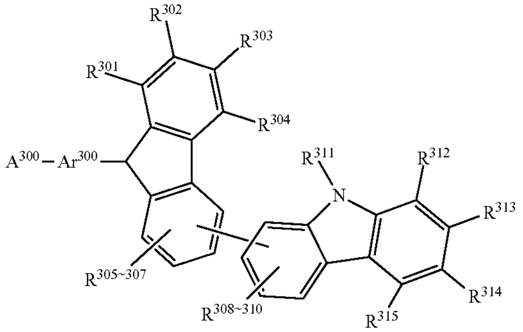

(G300)

11 Claims, 37 Drawing Sheets

(58) Field of Classification Search
CPC ............ H10K 85/6576; C07D 491/048; C07D 495/04
See application file for complete search history.

(56) References Cited

U.S. PATENT DOCUMENTS

| | | | |
|---|---|---|---|
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0203662 | A1 | 6/2020 | Mollard et al. |
| 2021/0313520 | A1 * | 10/2021 | Seo ........................... G09F 9/30 |
| 2022/0209162 | A1 | 6/2022 | Seo et al. |

FOREIGN PATENT DOCUMENTS

| | | | | |
|---|---|---|---|---|
| JP | 2008-098106 | A | 4/2008 | |
| JP | 2008-147072 | A | 6/2008 | |
| JP | 2008-251270 | A | 10/2008 | |
| JP | 2012-160473 | A | 8/2012 | |
| JP | 2014-120218 | A | 6/2014 | |
| JP | 2014-135251 | A | 7/2014 | |
| JP | 2014-232568 | A | 12/2014 | |
| JP | 2015-115178 | A | 6/2015 | |
| JP | 2016-197494 | A | 11/2016 | |
| JP | 2018-521459 | | 8/2018 | |
| JP | 2019-179696 | A | 10/2019 | |
| JP | 2020-160305 | A | 10/2020 | |
| WO | WO-2020026088 | A1 * | 2/2020 | ............. C09K 11/06 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and Beol IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

LIGHT-EMITTING DEVICE AND LIGHT-EMITTING APPARATUS

BACKGROUND OF THE INVENTION

1. Field of the Invention

One embodiment of the present invention relates to an organic compound, a light-emitting device, a display module, a lighting module, a display apparatus, a light-emitting apparatus, an electronic appliance, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

2. Description of the Related Art

Light-emitting devices (organic EL devices) including organic compounds and utilizing electroluminescence (EL) have been put to more practical use. In the basic structure of such light-emitting devices, an organic compound layer containing a light-emitting substance (an EL layer) is interposed between a pair of electrodes. Carriers are injected by application of voltage to the device, and recombination energy of the carriers is used, whereby light emission can be obtained from the light-emitting substance.

Such light-emitting devices are of self-luminous type and thus have advantages over liquid crystal displays, such as high visibility and no need for backlight when used as pixels of a display, and are particularly suitable for flat panel displays. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps or LEDs or linear light sources typified by fluorescent lamps; thus, the light-emitting devices also have great potential as planar light sources which can be used for lighting devices and the like.

Light-emitting apparatuses including light-emitting devices can be used suitably for a variety of electronic appliances as described above, and research and development of light-emitting devices have progressed for more favorable characteristics.

In order to obtain a higher-resolution light-emitting apparatus using an organic EL device, patterning an organic layer by a photolithography method using a photoresist or the like, instead of an evaporation method using a metal mask, has been studied. By using the photolithography method, a high-resolution light-emitting apparatus in which a distance between EL layers is several micrometers can be obtained (see Patent Document 1, for example).

REFERENCE

Patent Document

[Patent Document 1] Japanese Translation of PCT International Application No. 2018-521459

SUMMARY OF THE INVENTION

When patterned by a photolithography method, EL layers are subjected to various kinds of stress such as heating at the time of photomask formation or exposure to a chemical solution or an etching gas at the time of mask removal. In particular, the influence of heat on the whole light-emitting device might significantly degrade the characteristics and lifetime of the light-emitting device.

In view of this, an object of one embodiment of the present invention is to provide a light-emitting apparatus that is manufactured by a photolithography method and includes a light-emitting device with a small reduction in lifetime.

Thus, one embodiment of the present invention provides a light-emitting device using a specific material as a hole-blocking-layer material and a host material or an assist material. Another embodiment of the present invention provides a light-emitting apparatus manufactured by a photolithography method in which one or more selected from a hole-blocking-layer material, a host material, and an assist material in a light-emitting device have a specific structure.

That is, one embodiment of the present invention is a light-emitting device including an anode, a cathode, and an EL layer positioned between the anode and the cathode. The EL layer includes a light-emitting layer and a first layer. The first layer is positioned between the light-emitting layer and the cathode. The light-emitting layer and the first layer are in contact with each other. The light-emitting layer contains a first organic compound and a light-emitting substance. The first layer contains a third organic compound. The light-emitting substance emits red light. The first organic compound includes a condensed heteroaromatic ring skeleton including a diazine ring. The third organic compound includes a bicarbazole skeleton and a heteroaromatic ring skeleton including one selected from a pyridine ring, a diazine ring, and a triazine ring.

Another embodiment of the present invention is the light-emitting device having the above structure, in which the third organic compound includes a bicarbazole skeleton and a condensed heteroaromatic ring skeleton including a pyridine ring or a diazine ring.

Another embodiment of the present invention is a light-emitting device including an anode, a cathode, and an EL layer positioned between the anode and the cathode. The EL layer includes a light-emitting layer and a first layer. The first layer is positioned between the light-emitting layer and the cathode. The light-emitting layer and the first layer are in contact with each other. The light-emitting layer contains a first organic compound, a second organic compound, and a light-emitting substance. The first layer contains a third organic compound. The second organic compound has a hole-transport property. The light-emitting substance emits red light. The first organic compound is represented by General Formula (G100). The third organic compound is represented by General Formula (G300).

[Chemical Formula 1]

(G100)

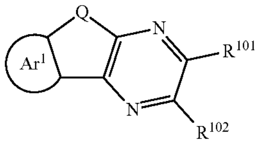

In General Formula (G100), Q represents an oxygen atom or a sulfur atom. $Ar^1$ represents a substituted or unsubstituted aromatic ring or a substituted or unsubstituted condensed aromatic ring. Each of $R^{101}$ and $R^{102}$ independently represents hydrogen or a group having 1 to 100 carbon atoms in total. At least one of $R^{101}$ and $R^{102}$ includes a skeleton having a hole-transport property.

[Chemical Formula 2]

(G300)

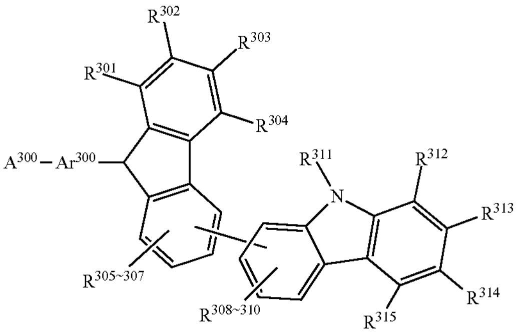

In General Formula (G300), $A^{300}$ represents any of a heteroaromatic ring including a pyridine skeleton, a heteroaromatic ring including a diazine skeleton, and a heteroaromatic ring including a triazine skeleton. Each of $R^{301}$ to $R^{315}$ independently represents hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, or a substituted or unsubstituted heteroaryl group having 3 to 13 carbon atoms in a skeleton. $Ar^{300}$ represents a substituted or unsubstituted arylene group having 6 to 25 carbon atoms, or a single bond.

Another embodiment of the present invention is the light-emitting device having the above structure, in which the second organic compound includes a condensed aromatic hydrocarbon ring or a π-electron rich heteroaromatic ring.

Another embodiment of the present invention is a light-emitting device including an anode, a cathode, and an EL layer positioned between the anode and the cathode. The EL layer includes a light-emitting layer and a first layer. The first layer is positioned between the light-emitting layer and the cathode. The light-emitting layer and the first layer are in contact with each other. The light-emitting layer contains a first organic compound, a second organic compound, and a light-emitting substance. The first layer contains a third organic compound. The first organic compound has an electron-transport property. The light-emitting substance emits red light. The second organic compound is represented by General Formula (G200). The third organic compound is represented by General Formula (G300).

[Chemical Formula 3]

(G200)

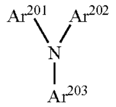

In General Formula (G200), each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group. $Ar^{203}$ represents a substituent including a carbazole skeleton.

[Chemical Formula 4]

(G300)

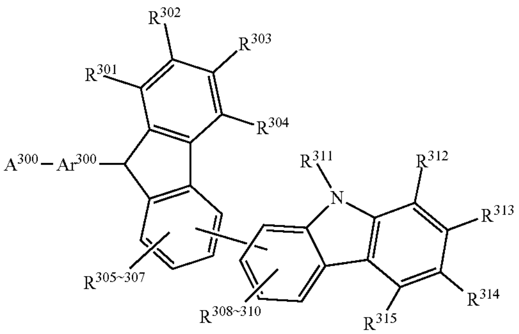

In General Formula (G300), $A^{300}$ represents any of a heteroaromatic ring including a pyridine skeleton, a heteroaromatic ring including a diazine skeleton, and a heteroaromatic ring including a triazine skeleton. Each of $R^{301}$ to $R^{315}$ independently represents hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, or a substituted or unsubstituted heteroaryl group having 3 to 13 carbon atoms in a skeleton. $Ar^{300}$ represents a substituted or unsubstituted arylene group having 6 to 25 carbon atoms, or a single bond.

Another embodiment of the present invention is the light-emitting device having the above structure, in which the first organic compound includes a π-electron deficient heteroaromatic ring.

Another embodiment of the present invention is a light-emitting device including an anode, a cathode, and an EL layer positioned between the anode and the cathode. The EL layer includes a light-emitting layer and a first layer. The first layer is positioned between the light-emitting layer and the cathode. The light-emitting layer and the first layer are in contact with each other. The light-emitting layer contains a first organic compound, a second organic compound, and a light-emitting substance. The first layer contains a third organic compound. The light-emitting substance emits red light. The first organic compound is represented by General Formula (G100). The second organic compound is represented by General Formula (G200). The third organic compound is represented by General Formula (G300).

[Chemical Formula 5]

(G100)

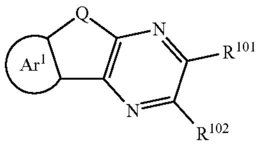

In General Formula (G100), Q represents an oxygen atom or a sulfur atom. $Ar^1$ represents a substituted or unsubstituted aromatic ring or a substituted or unsubstituted condensed aromatic ring. Each of $R^{101}$ and $R^{102}$ independently represents hydrogen or a group having 1 to 100 carbon atoms in total. At least one of $R^{101}$ and $R^{102}$ includes a skeleton having a hole-transport property.

[Chemical Formula 6]

(G200)

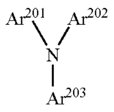

In General Formula (G200), each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group. $Ar^{203}$ represents a substituent including a carbazole skeleton.

[Chemical Formula 7]

(G300)

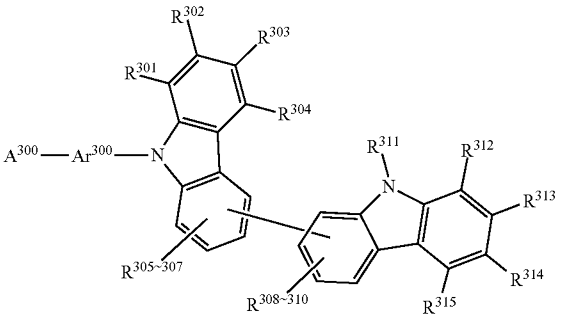

In General Formula (G300), $A^{300}$ represents any of a heteroaromatic ring including a pyridine skeleton, a heteroaromatic ring including a diazine skeleton, and a heteroaromatic ring including a triazine skeleton. Each of $R^{301}$ to $R^{315}$ independently represents any of hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, and a substituted or unsubstituted heteroaryl group having 3 to 13 carbon atoms in a skeleton. $Ar^{300}$ represents a substituted or unsubstituted arylene group having 6 to 25 carbon atoms, or a single bond.

Another embodiment of the present invention is the light-emitting device having the above structure, in which the light-emitting substance emits phosphorescent light.

Another embodiment of the present invention is the light-emitting device having the above structure, in which the light-emitting substance is an organometallic complex.

Another embodiment of the present invention is the light-emitting device having the above structure, in which the light-emitting substance is an iridium complex.

Another embodiment of the present invention is a light-emitting apparatus including a light-emitting device A and a light-emitting device B that are adjacent to each other over an insulating surface. The light-emitting device A includes an anode A, a cathode A, and an EL layer A interposed between the anode A and the cathode A. The light-emitting device B includes an anode B, a cathode B, and an EL layer B interposed between the anode B and the cathode B. The EL layer A includes a light-emitting layer A. The EL layer B includes a light-emitting layer B. The light-emitting layer A contains a first organic compound A, a second organic compound A, and a light-emitting substance A. The light-emitting layer B contains a light-emitting substance B. The light-emitting substance A emits red light. The second organic compound A has a hole-transport property. A distance between an end portion of the light-emitting layer A and an end portion of the light-emitting layer B facing each other is greater than or equal to 2 μm and less than or equal to 5 μm. The first organic compound A includes a condensed heteroaromatic ring skeleton including a diazine ring.

Another embodiment of the present invention is a light-emitting apparatus including a light-emitting device A and a light-emitting device B that are adjacent to each other over an insulating surface. The light-emitting device A includes an anode A, a cathode A, and an EL layer A interposed between the anode A and the cathode A. The light-emitting device B includes an anode B, a cathode B, and an EL layer B interposed between the anode B and the cathode B. The EL layer A includes a light-emitting layer A. The EL layer B includes a light-emitting layer B. The light-emitting layer A contains a first organic compound A, a second organic compound A, and a light-emitting substance A. The light-emitting layer B contains a light-emitting substance B. The light-emitting substance A emits red light. The second organic compound A has a hole-transport property. A distance between an end portion of the light-emitting layer A and an end portion of the light-emitting layer B facing each other is greater than or equal to 2 m and less than or equal to 5 μm. The first organic compound is represented by General Formula (G100).

[Chemical Formula 8]

(G100)

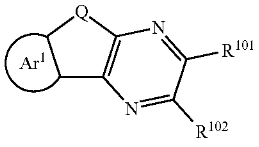

In General Formula (G100), Q represents an oxygen atom or a sulfur atom. $Ar^1$ represents a substituted or unsubstituted aromatic ring or a substituted or unsubstituted condensed aromatic ring. Each of $R^{101}$ and $R^{102}$ independently represents hydrogen or a group having 1 to 100 carbon atoms in total. At least one of $R^{101}$ and $R^{102}$ includes a skeleton having a hole-transport property.

Another embodiment of the present invention is the light-emitting apparatus having the above structure, in which the EL layer A further includes a first layer A. The first layer A is positioned between the light-emitting layer A and the cathode A. The first layer A contains a third organic compound. The third organic compound includes a bicarbazole skeleton and a heteroaromatic ring skeleton including one selected from a pyridine ring, a diazine ring, and a triazine ring.

Another embodiment of the present invention is the light-emitting apparatus having the above structure, in which the third organic compound includes a bicarbazole skeleton and a condensed heteroaromatic ring skeleton including a pyridine ring or a diazine ring.

Another embodiment of the present invention is the light-emitting apparatus having the above structure, in which the EL layer A further includes a first layer A. The first layer A is positioned between the light-emitting layer A and the cathode A. The first layer A contains a third organic compound. The third organic compound A is represented by General Formula (G300).

[Chemical Formula 9]

(G300)

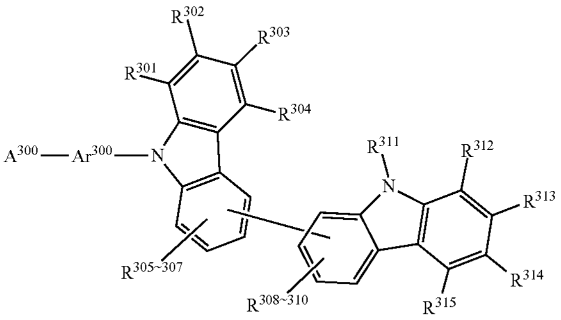

In General Formula (G300), $A^{300}$ represents any of a heteroaromatic ring including a pyridine skeleton, a heteroaromatic ring including a diazine skeleton, and a heteroaromatic ring including a triazine skeleton. Each of $R^{301}$ to $R^{315}$ independently represents any of hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, a substituted or unsubstituted heteroaryl group having 3 to 13 carbon atoms in a skeleton. $Ar^{300}$ represents a substituted or unsubstituted arylene group having 6 to 25 carbon atoms, or a single bond.

Another embodiment of the present invention is a light-emitting apparatus including a light-emitting device A and a light-emitting device B that are adjacent to each other over an insulating surface. The light-emitting device A includes an anode A, a cathode A, and an EL layer A interposed between the anode A and the cathode A. The light-emitting device B includes an anode B, a cathode B, and an EL layer B interposed between the anode B and the cathode B. The EL layer A includes a light-emitting layer A and a first layer A. The first layer A is positioned between the light-emitting layer A and the cathode A. The EL layer B includes a light-emitting layer B. The light-emitting layer A contains a first organic compound A, a second organic compound A, and a light-emitting substance A. The first layer A contains a third organic compound. The light-emitting layer B contains a light-emitting substance B. The light-emitting substance A emits red light. A distance between an end portion of the light-emitting layer A and an end portion of the light-emitting layer B facing each other is greater than or equal to 2 μm and less than or equal to 5 μm. The third organic compound includes a bicarbazole skeleton and a heteroaromatic ring skeleton including one selected from a pyridine ring, a diazine ring, and a triazine ring.

Another embodiment of the present invention is the light-emitting apparatus having the above structure, in which the third organic compound includes a bicarbazole skeleton and a condensed heteroaromatic ring skeleton including a pyridine ring or a diazine ring.

Another embodiment of the present invention is a light-emitting apparatus including a light-emitting device A and a light-emitting device B that are adjacent to each other over an insulating surface. The light-emitting device A includes an anode A, a cathode A, and an EL layer A interposed between the anode A and the cathode A. The light-emitting device B includes an anode B, a cathode B, and an EL layer B interposed between the anode B and the cathode B. The EL layer A includes a light-emitting layer A and a first layer A. The first layer A is positioned between the light-emitting layer A and the cathode A. The EL layer B includes a light-emitting layer B. The light-emitting layer A contains a first organic compound A, a second organic compound A, and a light-emitting substance A. The first layer A contains a third organic compound. The light-emitting layer B contains a light-emitting substance B. The light-emitting substance A emits red light. The first organic compound A has an electron-transport property. The second organic compound A has a hole-transport property. A distance between an end portion of the light-emitting layer A and an end portion of the light-emitting layer B facing each other is greater than or equal to 2 μm and less than or equal to 5 μm. The third organic compound is represented by General Formula (G300).

[Chemical Formula 10]

(G300)

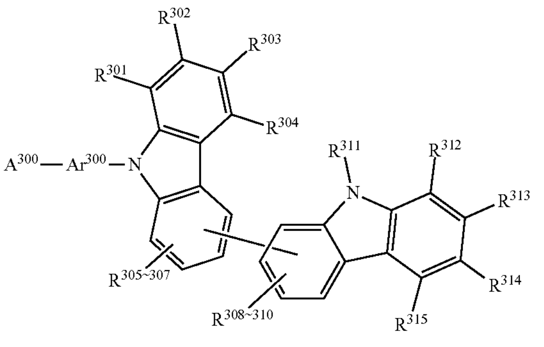

In General Formula (G300), $A^{300}$ represents any of a heteroaromatic ring including a pyridine skeleton, a heteroaromatic ring including a diazine skeleton, and a heteroaromatic ring including a triazine skeleton. Each of $R^{301}$ to $R^{315}$ independently represents any of hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, a substituted or unsubstituted heteroaryl group having 3 to 13 carbon atoms in a skeleton. $Ar^{300}$ represents a substituted or unsubstituted arylene group having 6 to 25 carbon atoms, or a single bond.

Another embodiment of the present invention is a light-emitting apparatus including a light-emitting device A and a light-emitting device B that are adjacent to each other over an insulating surface. The light-emitting device A includes an anode A, a cathode A, and an EL layer A interposed between the anode A and the cathode A. The light-emitting device B includes an anode B, a cathode B, and an EL layer B interposed between the anode B and the cathode B. The EL layer A includes a light-emitting layer A and a first layer A. The first layer A is positioned between the light-emitting layer A and the cathode A. The EL layer B includes a light-emitting layer B. The light-emitting layer A contains a first organic compound A, a second organic compound A, and a light-emitting substance A. The first layer A contains a third organic compound. The light-emitting layer B contains a light-emitting substance B. The light-emitting substance A emits red light. A distance between an end portion of the light-emitting layer A and an end portion of the light-emitting layer B facing each other is greater than or equal to 2 μm and less than or equal to 5 μm. The first organic compound is represented by General Formula (G100). The second organic compound is represented by General Formula (G200). The third organic compound is represented by General Formula (G300).

[Chemical Formula 11]

(G100)

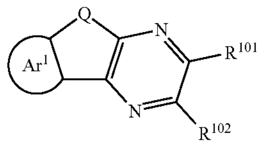

In General Formula (G100), Q represents an oxygen atom or a sulfur atom. $Ar^1$ represents a substituted or unsubstituted aromatic ring or a substituted or unsubstituted condensed aromatic ring. Each of $R^{101}$ and $R^{102}$ independently represents hydrogen or a group having 1 to 100 carbon atoms in total. At least one of $R^{101}$ and $R^{102}$ includes a skeleton having a hole-transport property.

[Chemical Formula 12]

(G200)

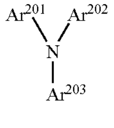

In General Formula (G200), each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group. $Ar^{203}$ represents a substituent including a carbazole skeleton.

[Chemical Formula 13]

(G300)

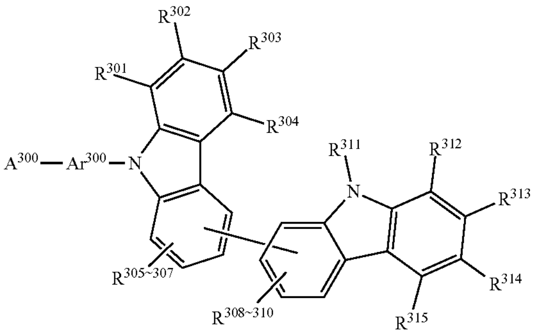

In General Formula (G300), $A^{300}$ represents any of a heteroaromatic ring including a pyridine skeleton, a heteroaromatic ring including a diazine skeleton, and a heteroaromatic ring including a triazine skeleton. Each of $R^{301}$ to $R^{315}$ independently represents any of hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, a substituted or unsubstituted heteroaryl group having 3 to 13 carbon atoms in a skeleton. $Ar^{300}$ represents a substituted or unsubstituted arylene group having 6 to 25 carbon atoms, or a single bond.

Another embodiment of the present invention is the light-emitting apparatus having the above structure, in which the EL layer B includes a first layer B, and the first layer B contains the third organic compound.

Another embodiment of the present invention is the light-emitting apparatus having the above structure, in which the light-emitting substance A emits phosphorescent light.

Another embodiment of the present invention is the light-emitting apparatus having the above structure, in which the light-emitting substance A is an organometallic complex.

Another embodiment of the present invention is the light-emitting apparatus having the above structure, in which the light-emitting substance A is an iridium complex.

Another embodiment of the present invention is the light-emitting apparatus having the above structure, in which the light-emitting substance B emits light with a peak wavelength different from that of the light-emitting substance A.

Another embodiment of the present invention is the light-emitting apparatus having the above structure, in which the first organic compound includes a π-electron deficient heteroaromatic ring.

Another embodiment of the present invention is the light-emitting apparatus having the above structure, in which the π-electron deficient heteroaromatic ring is one or more selected from a heteroaromatic ring including a polyazole skeleton, a heteroaromatic ring including a pyridine skeleton, a heteroaromatic ring including a diazine skeleton, and a heteroaromatic ring including a triazine skeleton.

Another embodiment of the present invention is the light-emitting apparatus having the above structure, in which the second organic compound includes a condensed aromatic hydrocarbon ring or a π-electron deficient heteroaromatic ring.

Another embodiment of the present invention is the light-emitting apparatus having the above structure, in which the π-electron rich heteroaromatic ring is a condensed aromatic ring including at least one of a pyrrole skeleton, a furan skeleton, and a thiophene skeleton in a ring.

Another embodiment of the present invention is the light-emitting apparatus having the above structure, in which the glass transition temperature (Tg) of one or more selected from the first organic compound, the second organic compound, and the third organic compound is higher than or equal to 120° C. and lower than or equal to 180° C.

Another embodiment of the present invention is the light-emitting apparatus having the above structure, in which the glass transition temperature (Tg) of two or more selected from the first organic compound, the second organic compound, and the third organic compound is higher than or equal to 120° C. and lower than or equal to 180° C.

Another embodiment of the present invention is an electronic appliance including any of the above-described light-emitting apparatuses, a sensor, an operation button, and a speaker or a microphone.

Note that the light-emitting apparatus in this specification includes, in its category, an image display device that uses a light-emitting device. The light-emitting apparatus may also include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

One embodiment of the present invention can provide a light-emitting apparatus including a light-emitting device that is fabricated by a photolithography method and has a small reduction in lifetime.

Note that the description of these effects does not preclude the existence of other effects. One embodiment of the present invention does not necessarily have all the effects listed above. Other effects will be apparent from and can be derived from the descriptions of the specification, the drawings, the claims, and the like.

BRIEF DESCRIPTION OF THE DRAWINGS

In the accompanying drawings:

FIGS. 10A, 10B1, 10B2, and 10C illustrate electronic appliances;

DETAILED DESCRIPTION OF THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

Figure 1:
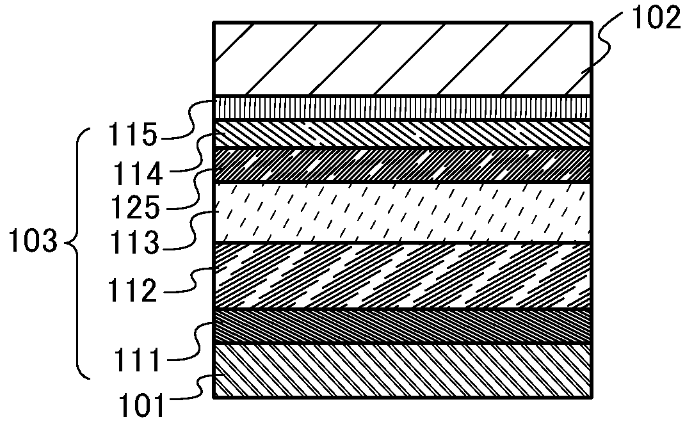
FIG. 1 schematically illustrates a light-emitting device.

FIG. 1 illustrates a light-emitting device of a light-emitting apparatus of one embodiment of the present invention. The light-emitting device includes an EL layer 103 between a pair of electrodes (an anode 101 and a cathode 102). The EL layer 103 is in contact with the anode 101 and the cathode 102, and emits light in accordance with a current flow made by voltage application between the anode 101 and the cathode 102.

The EL layer 103 includes a light-emitting layer 113. The EL layer 103 may also include a hole-injection layer 111, a hole-transport layer 112, an electron-transport layer 114, and an electron-injection layer 115, for example, and preferably includes a hole-blocking layer 125. In addition, the EL layer 103 may include an electron-blocking layer, an exciton-blocking layer, and an intermediate layer (a charge-generation layer), for example. Note that these are just examples; the layers other than the light-emitting layer 113 are not necessarily provided, and a layer having a plurality of functions may be provided instead of a plurality of layers having respective functions.

The light-emitting layer 113 contains a light-emitting substance and a first organic compound. A second organic compound may be further contained.

The light-emitting substance is a substance emitting red light and preferably a phosphorescent substance. Specifically, the light-emitting substance is preferably an organometallic complex containing iridium as a central metal, particularly preferably an organic iridium complex including a pyrimidine skeleton or a pyrazine skeleton as a ligand because the T1 level is adjusted to be suitable for red emission.

The first organic compound is an organic compound having an electron-transport property. The first organic compound is preferably an organic compound including a π-electron deficient heteroaromatic ring.

As the first organic compound, it is preferable to use an organic compound including a skeleton of triazine, triphenylene, dibenzo[f,h]quinoxaline, benzofuropyrimidine (Bfpm), phenanthrofuropyrazine (Pnfpr), naphthofuropyrazine (Nfpr), naphthofuropyrimidine (Nfpm), phenanthrofuropyrimidine (Pnfpm), benzofuropyrazine (Bfpr), benzofuropyridine (Bfpy), phenanthrofuropyridine (Pnfpy), naphthofuropyridine (Nfpy), pyrimidine, pyridine, quinoline, benzoquinoline, quinazoline, benzoquinazoline, quinoxaline, benzoquinoxaline, triazatriphenylene, tetraazatriphenylene, hexaazatriphenylene, phenanthroline, or the like and a skeleton of diarylamine, carbazole, indole, pyrrole, benzocarbazole, dibenzocarbazole, indolocarbazole, indenocarbazole, dibenzofuran, furan, benzofuran, benzonaphthofuran, bisnaphthofuran, thiophene, or the like, and having a Tg of 100° C. or higher, preferably 120° C. or higher. In particular, an organic compound including a condensed heteroaromatic ring skeleton including a diazine ring, such as dibenzo[f,h]quinoxaline, benzofuropyrimidine (Bfpm), phenanthrofuropyrazine (Pnfpr), naphthofuropyrazine (Nfpr), naphthofuropyrimidine (Nfpm), phenanthrofuropyrimidine (Pnfpm), benzofuropyrazine (Bfpr), pyrimidine, quinazoline, benzoquinazoline, quinoxaline, or benzoquinoxaline is preferable, and an organic compound including a condensed heteroaromatic ring skeleton including a quinoxaline ring or a quinazoline ring is more preferable.

More specifically, an organic compound represented by General Formula (G100), which has a high glass transition temperature (Tg) and thus has favorable heat resistance, is preferable for higher heat resistance of the light-emitting device.

[Chemical Formula 14]

(G100)

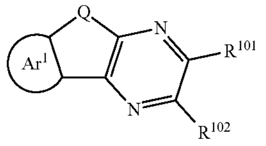

In General Formula (G100), Q represents an oxygen atom or a sulfur atom. $Ar^1$ represents a substituted or unsubstituted aromatic ring or a substituted or unsubstituted condensed aromatic ring. Each of $R^{101}$ and $R^{102}$ independently represents hydrogen or a group having 1 to 100 carbon atoms in total, and at least one of $R^{101}$ and $R^{102}$ includes a skeleton having a hole-transport property.

In the organic compound represented by General Formula (G100), $Ar^1$ is preferably any one of substituted or unsubstituted naphthalene, substituted or unsubstituted phenanthrene, and substituted or unsubstituted chrysene because the T1 level of the compound can be adjusted to the absorption band of the above-described phosphorescent complex. Bonding a condensed ring larger than these substances might cause a further reduction in the T1 level, in which case red light emission cannot be obtained efficiently.

In the organic compound represented by General Formula (G100), at least one of $R^{101}$ and $R^{102}$ is preferably a group including a condensed ring for a higher glass transition temperature (Tg).

In General Formula (G100), $Ar^1$ is preferably represented by any one of General Formula (t1) to General Formula (t3) because the T1 level of the compound can be adjusted to the absorption band of the above-described phosphorescent complex.

[Chemical Formula 15]

(t1)

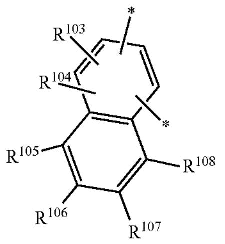

(t2)

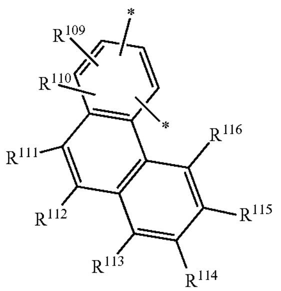

(t3)

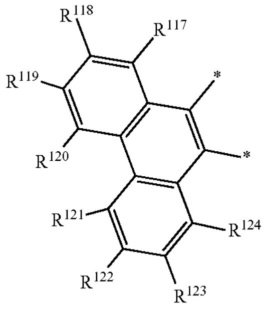

In General Formulae (t1) to (t3), each of $R^{103}$ to $R^{124}$ independently represents any one of hydrogen, a substituted or unsubstituted alkyl group having 1 to 6 carbon atoms, a substituted or unsubstituted cycloalkyl group having 3 to 7 carbon atoms, and a substituted or unsubstituted aryl group having 6 to 30 carbon atoms. In addition, * represents a bonding portion in General Formula (G100).

In the above structures, General Formula (G100) is preferably an organic compound represented by any one of General Formula (G100-1) to General Formula (G100-4).

[Chemical Formula 16]

(G100-1)

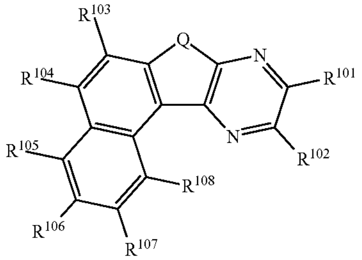

-continued (G100-2)

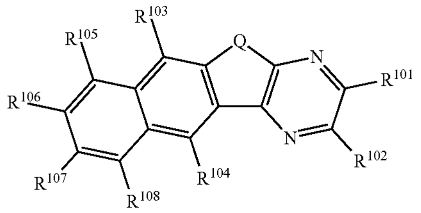

(G100-3)

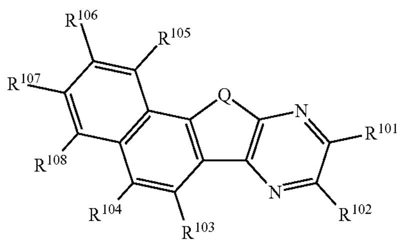

(G100-4)

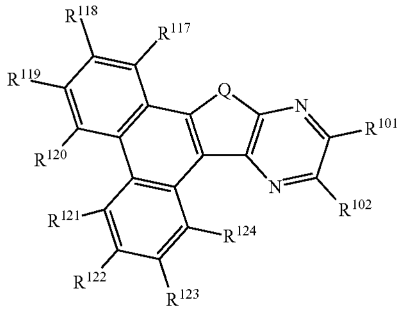

In General Formulae (G100-1) to (G100-4), Q represents an oxygen atom or a sulfur atom. Each of $R^{101}$ and $R^{102}$ independently represents hydrogen or a group having 1 to 100 carbon atoms in total, and at least one of $R^{101}$ and $R^{102}$ includes a skeleton having a hole-transport property. Each of $R^{103}$ to $R^{108}$ and $R^{117}$ to $R^{124}$ independently represents any one of hydrogen, a substituted or unsubstituted alkyl group having 1 to 6 carbon atoms, a substituted or unsubstituted cycloalkyl group having 3 to 7 carbon atoms, and a substituted or unsubstituted aryl group having 6 to 30 carbon atoms.

In the above structures, the skeleton having a hole-transport property is preferably any of a substituted or unsubstituted diarylamino group, a substituted or unsubstituted condensed aromatic hydrocarbon ring, and a substituted or unsubstituted π-electron rich condensed heteroaromatic ring, in which case the HOMO level of the compound can be made shallow and a difference of HOMO level between the hole-transport layer and the hole-injection layer can be made small, so that holes can easily move therebetween. That is, improvement in current characteristics of the light-emitting device is expected.

In some of the above structures, the skeleton having a hole-transport property is preferably any one of a substituted or unsubstituted condensed aromatic hydrocarbon ring and a substituted or unsubstituted π-electron rich condensed heteroaromatic ring for a higher glass transition temperature (Tg). In addition, the condensed ring is preferably a substituted or unsubstituted condensed heteroaromatic ring including any one of a dibenzothiophene skeleton, a dibenzofuran skeleton, and a carbazole skeleton, in which case the HOMO level of the compound can be kept suitably. In the case where the condensed ring is an aromatic hydrocarbon group, the condensed ring is preferably a substituted or unsubstituted condensed aromatic hydrocarbon ring including any one of a naphthalene skeleton, a fluorene skeleton, a triphenylene skeleton, and a phenanthrene skeleton, in which case the T1 level of the compound can be adjusted to the absorption band of the above-described phosphorescent complex.

In the above structures, it is preferable that each of $R^{101}$ and $R^{102}$ in General Formula (G100) independently represents hydrogen or a group having 1 to 100 carbon atoms in total and at least one of $R^{101}$ and $R^{102}$ include a group represented by General Formula (u1).

[Chemical Formula 17]

$$A^{101}\text{-}(\alpha^{100})_n\text{-}* \quad \text{(u1)}$$

In General Formula (u1), $\alpha^{100}$ represents a substituted or unsubstituted arylene group having 6 to 25 carbon atoms, and n represents an integer of 0 to 4. $A^{101}$ represents a substituted or unsubstituted aryl group having 6 to 30 carbon atoms in total or a substituted or unsubstituted heteroaryl group having 3 to 30 carbon atoms in total.

In General Formula (u1), $A^{101}$ is preferably any one of General Formula ($A^{101}$-1) to General Formula ($A^{101}$-17).

[Chemical Formula 18]

($A^{101}$-1)

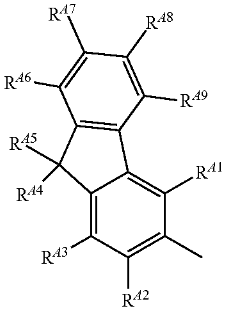

($A^{101}$-2)

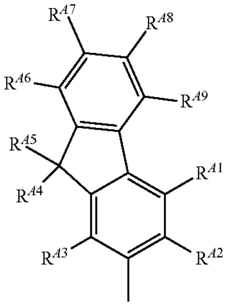

($A^{101}$-3)

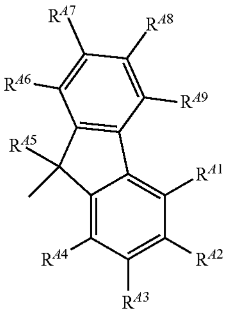

-continued ($A^{101}$-4)

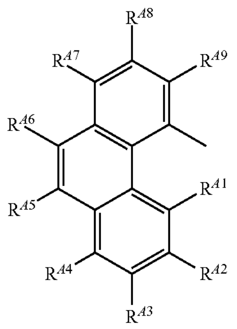

($A^{101}$-5)

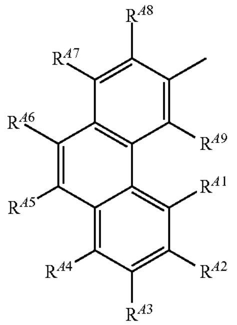

($A^{101}$-6)

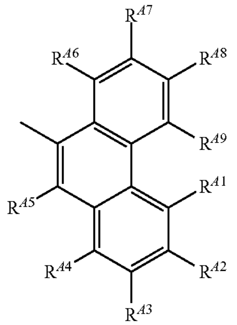

($A^{101}$-7)

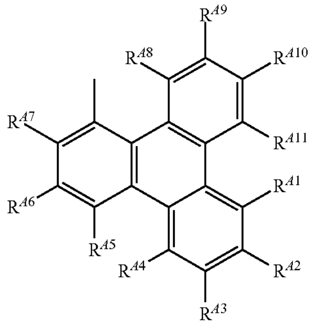

-continued
(A101-8)
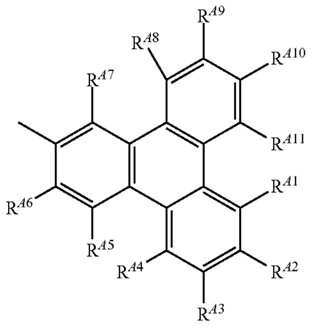
(A101-9)
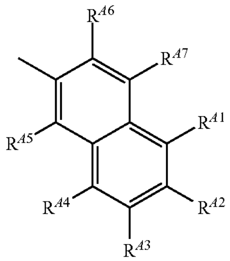
(A101-10)
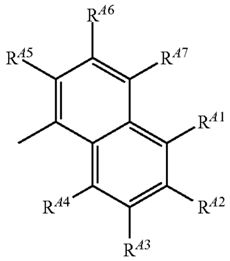
(A101-11)
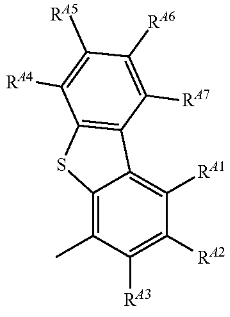
(A101-12)
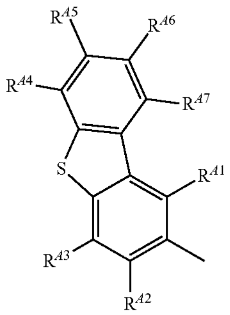
-continued
(A101-13)
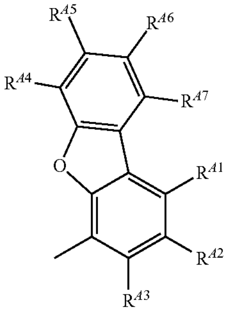
(A101-14)
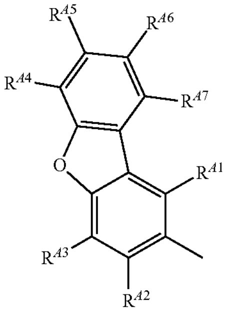
(A101-15)
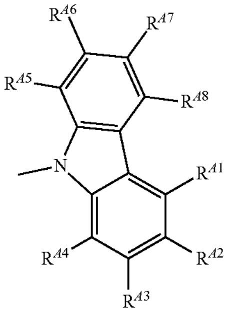
(A101-16)
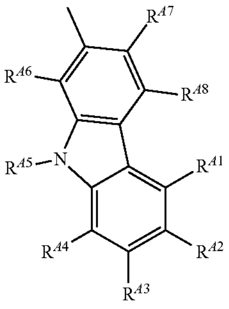
(A101-17)
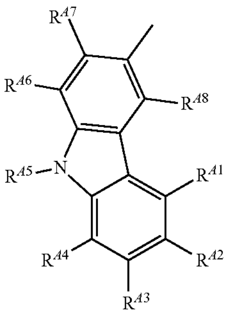

In General Formulae ($A^{101}$-1) to ($A^{101}$-17), each of $R^{A1}$ to $R^{A11}$ independently represents any one of hydrogen, a substituted or unsubstituted alkyl group having 1 to 6 carbon atoms, a substituted or unsubstituted cycloalkyl group having 3 to 7 carbon atoms, and a substituted or unsubstituted aryl group having 6 to 30 carbon atoms.

In General Formula (u1), $\alpha^{100}$ is preferably any one of General Formula (Ar-1) to General Formula (Ar-14).

[Chemical Formula 19]

(Ar-1)

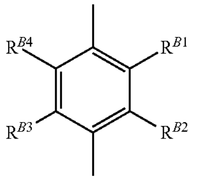

(Ar-2)

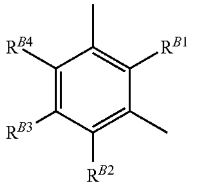

(Ar-3)

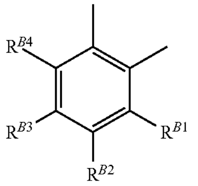

(Ar-4)

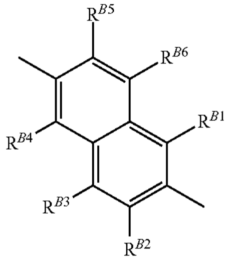

(Ar-5)

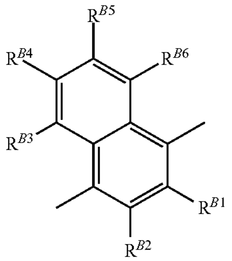

(Ar-6)

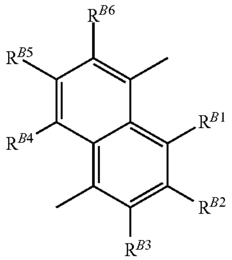

-continued (Ar-7)

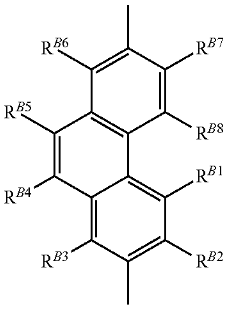

(Ar-8)

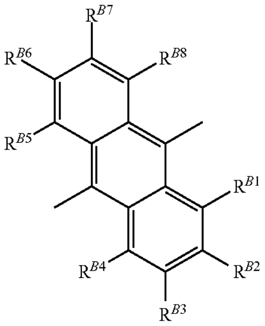

(Ar-9)

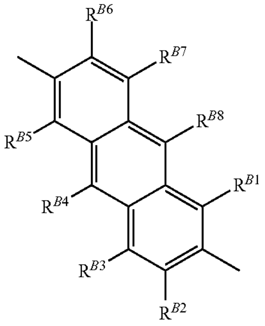

(Ar-10)

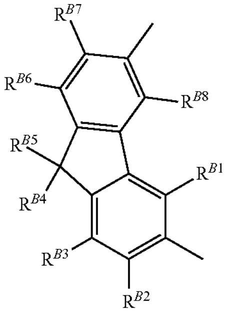

(Ar-11)

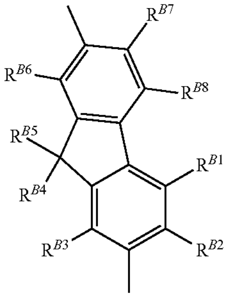

-continued (Ar-12)

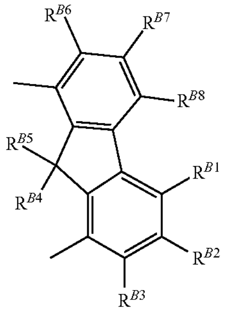

(Ar-13)

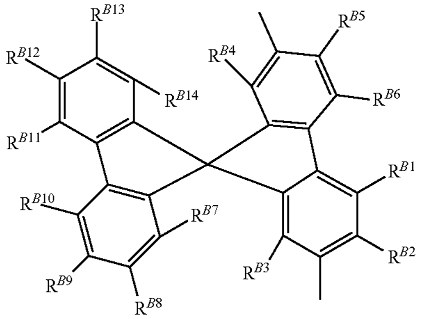

(Ar-14)

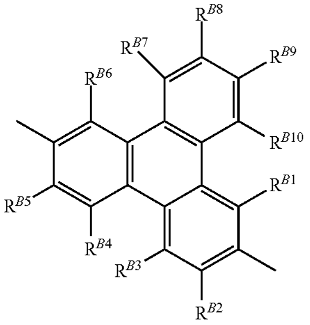

In General Formulae (Ar-1) to (Ar-14), each of $R^{B1}$ to $R^{B14}$ independently represents any one of hydrogen, a substituted or unsubstituted alkyl group having 1 to 6 carbon atoms, a substituted or unsubstituted cycloalkyl group having 3 to 7 carbon atoms, and a substituted or unsubstituted aryl group having 6 to 30 carbon atoms.

In the organic compound represented by General Formula (G100), typical examples of the alkyl group having 1 to 6 carbon atoms include a methyl group, an ethyl group, a propyl group, an isopropyl group, a butyl group, an isobutyl group, a sec-butyl group, a tert-butyl group, a pentyl group, an isopentyl group, and a hexyl group. Examples of the cycloalkyl group having 3 to 7 carbon atoms include a cyclopropyl group, a cyclobutyl group, a cyclopentyl group, a cyclohexyl group, and a cycloheptyl group. Examples of the aryl group having 6 to 30 carbon atoms include a phenyl group, a tolyl group, a xylyl group, a biphenyl group, an indenyl group, a naphthyl group, a fluorenyl group, a spirofluorenyl group, a phenanthrenyl group, and a triphenylenyl group. Examples of the arylene group having 6 to 25 carbon atoms include a 1,2-, 1,3-, and 1,4-phenylene groups, a 2,6-, 3,5-, and 2,4-toluylene groups, a 4,6-dimethylbenzene-1,3-diyl group, a 2,4,6-trimethylbenzene-1,3-diyl group, a 2,3,5,6-tetramethylbenzene-1,4-diyl group, a 3,3'-, 3,4'-, and 4,4'-biphenylene groups, a 1,1':3',1"-terbenzene-3,3"-diyl group, a 1,1':4',1"-terbenzene-3,3"-diyl group, a 1,1':4',1"-terbenzene-4,4"-diyl group, a 1,1':3',1":3",1'"-quaterbenzene-3,3'"-diyl group, a 1,1':3',1":4",1'"-quaterbenzene-3,4'"-diyl group, a 1,1':4',1":4",1'"-quaterbenzene-4,4'"-diyl group, a 1,4-, 1,5-, 2,6-, and 2,7-naphthylene groups, a 2,7-fluorenylene group, a 9,9-dimethyl-2,7-fluorenylene group, a 9,9-diphenyl-2,7-fluorenylene group, a 9,9-dimethyl-1,4-fluorenylene group, a spiro-9,9'-bifluorene-2,7-diyl group, a 9,10-dihydro-2,7-phenanthrenylene group, a 2,7-phenanthrenylene group, a 3,6-phenanthrenylene group, a 9,10-phenanthrenylene group, a 2,7-triphenylenylene group, a 3,6-triphenylenylene group, a 2,8-benzo[a]phenanthrenylene group, a 2,9-benzo[a]phenanthrenylene group, and a 5,8-benzo[c]phenanthrenylene group. Examples of the substituted or unsubstituted heteroaryl group having 3 to 30 carbon atoms in total include a group including a carbazole ring, a group including a dibenzofuran ring, a group including a dibenzothiophene ring, a group including a benzonaphthofuran ring, a group including a benzonaphthothiophene ring, a group including an indolocarbazole ring, a group including a benzofurocarbazole ring, a group including a benzothienocarbazole ring, a group including an indenocarbazole ring, and a group including a dibenzocarbazole ring.

In the case where the group in the organic compound represented by General Formula (G100) includes a substituent, the substituent is preferably an alkyl group having 1 to 6 carbon atoms such as a methyl group, an ethyl group, a propyl group, an isopropyl group, a butyl group, an isobutyl group, a sec-butyl group, a tert-butyl group, a pentyl group, an isopentyl group, a sec-pentyl group, a neopentyl group, or a hexyl group; a cycloalkyl group having 5 to 7 carbon atoms such as a cyclopentyl group, a cyclohexyl group, or a cycloheptyl group; or an aryl group having 6 to 13 carbon atoms in a ring such as a phenyl group, a tolyl group, a xylyl group, a biphenyl group, an indenyl group, a naphthyl group, a fluorenyl group, or a 9,9-dimethylfluorenyl group.

Specifically, the organic compound represented by General Formula (G100) is preferably any of the following represented by Structural Formulae (100) to (112): 11-[(3'-dibenzothiophen-4-yl)biphenyl-3-yl]phenanthro[9',10':4,5]furo[2,3-b]pyrazine (abbreviation: 11mDBtBPPnfpr) (100), 11-[(3'-dibenzothiophen-4-yl)biphenyl-4-yl]phenanthro[9',10':4,5]furo[2,3-b]pyrazine (101), 11-[(3'-(9H-carbazol-9-yl)biphenyl-3-yl]phenanthro[9',10':4,5]furo[2,3-b]pyrazine (102), 12-(9'-phenyl-3,3'-bi-9H-carbazol-9-yl)phenanthro[9',10':4,5]furo[2,3-b]pyrazine (abbreviation: 12PCCzPnfpr) (103), 9-[(3'-9-phenyl-9H-carbazol-3-yl)biphenyl-4-yl]naphtho[1',2':4,5]furo[2,3-b]pyrazine (abbreviation: 9pmPCBPNfpr) (104), 9-(9'-phenyl-3,3'-bi-9H-carbazol-9-yl)naphtho[1',2':4,5]furo[2,3-b]pyrazine (abbreviation: 9PCCzNfpr) (105), 10-(9'-phenyl-3,3'-bi-9H-carbazol-9-yl)naphtho[1',2':4,5]furo[2,3-b]pyrazine (abbreviation: 10PCCzNfpr) (106), 9-[3'-(6-phenylbenzo[b]naphtho[1,2-d]furan-8-yl)biphenyl-3-yl]naphtho[1',2':4,5]furo[2,3-b]pyrazine (abbreviation: 9mBnfBPNfpr) (107), 9-{3-[6-(9,9-dimethylfluoren-2-yl)dibenzothiophen-4-yl]phenyl}naphtho[1',2':4,5]furo[2,3-b]pyrazine (abbreviation: 9mFDBtPNfpr) (108), 9-[3'-(6-phenyldibenzothiophen-4-yl)biphenyl-3-yl]naphtho[1',2':4,5]furo[2,3-b]pyrazine (abbreviation: 9mDBtBPNfpr-02) (109), 9-[3-(9'-phenyl-3,3'-bi-9H-carbazol-9-yl)phenyl]naphtho[1',2':4,5]furo[2,3-b]pyrazine (abbreviation: 9mPCCzPNfpr) (110), 9-[3'-(2,8-diphenyldibenzothiophen-4-yl)biphenyl-3-yl]naphtho[1',2':4,5]furo[2,3-b]pyrazine (111), and 11-[3'-(2,8-diphenyldibenzothiophen-4-yl)biphenyl-3-yl]phenanthro[9',10':4,5]furo[2,3-b]pyrazine (112).

[Chemical Formula 20]
(100)
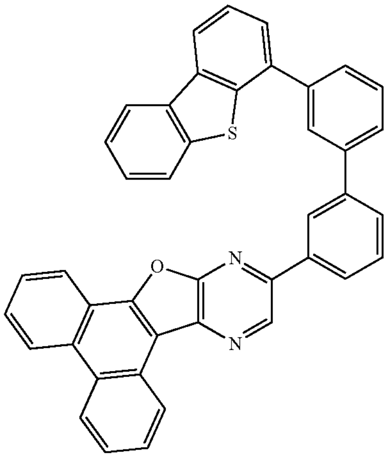
(101)
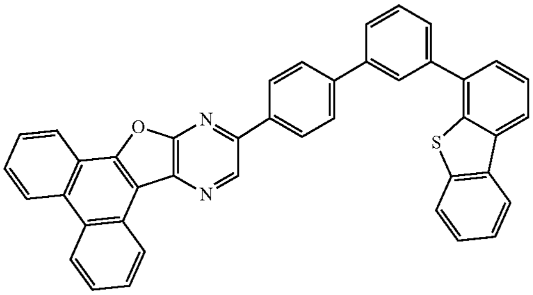
(102)
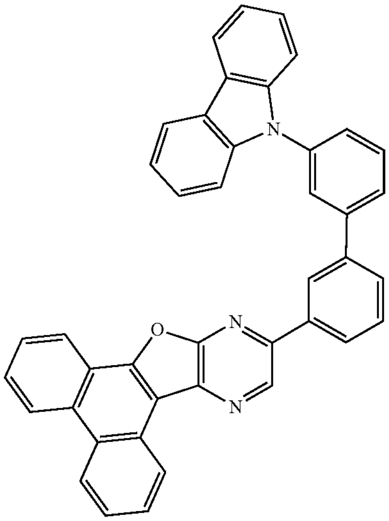
(103)
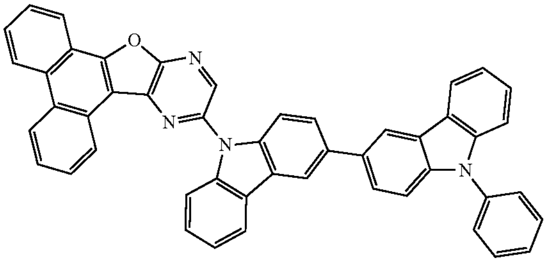
-continued
(104)
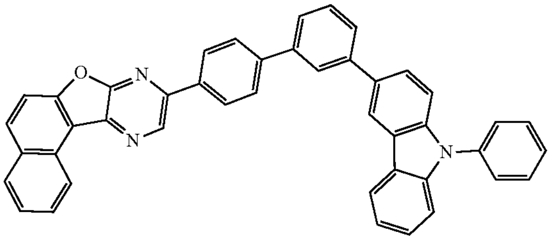
(105)
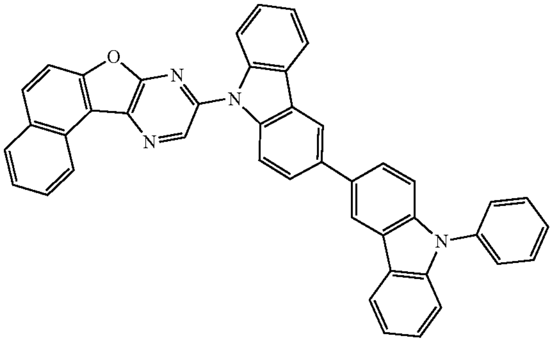
(106)
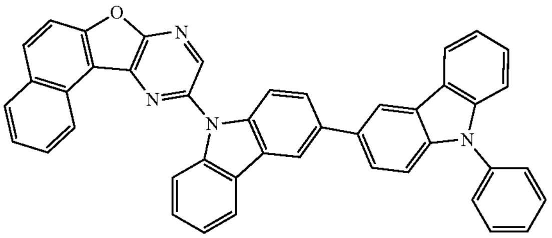
(107)
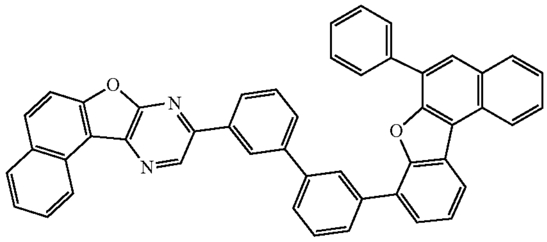
[Chemical Formula 21]
(108)
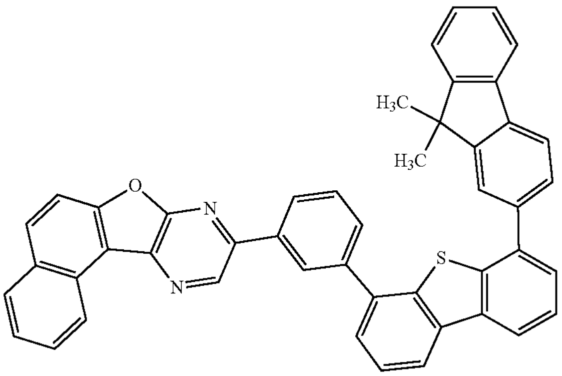

-continued (109)

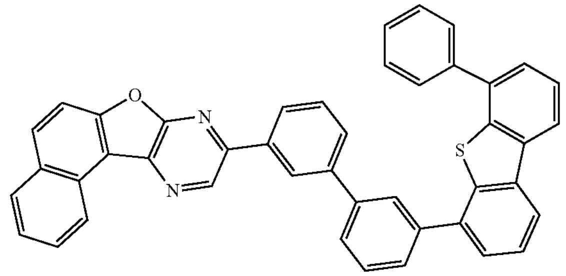

(110)

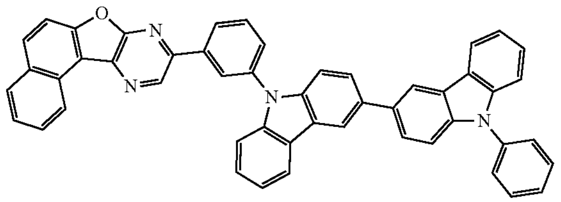

(111)

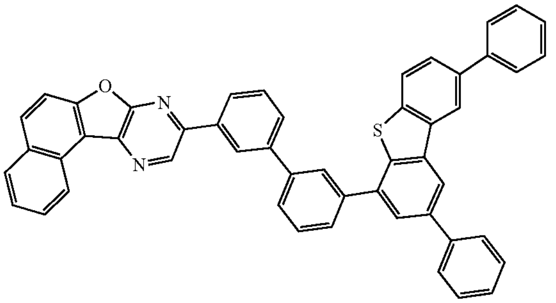

(112)

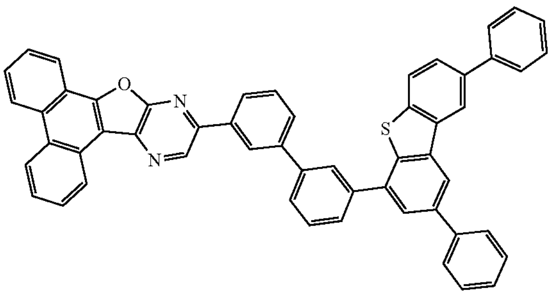

The second organic compound is an organic compound having a hole-transport property and is preferably an organic compound including a π-electron rich heteroaromatic ring.

As the second organic compound, an organic compound including a carbazole skeleton, a 3,3'-bicarbazole skeleton, or a 2,3'-bicarbazole skeleton and having a Tg of 100° C. or higher, preferably 120° C. or higher can be used. Note that a substituted or unsubstituted aryl group having 6 to 30 carbon atoms is preferably bonded to a nitrogen atom in the carbazole skeleton, the 3,3'-bicarbazole skeleton, or the 2,3'-bicarbazole skeleton.

In particular, the second organic compound is preferably an organic compound represented by any of General Formula (G200) to General Formula (G203).

[Chemical Formula 22]

(G200)

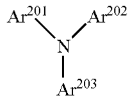

In General Formula (G200), each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group, and $Ar^{203}$ represents a substituent including a carbazole skeleton.

Alternatively, the second organic compound is preferably an organic compound represented by General Formula (G201), in which case the HOMO level can be made shallow and hole transfer can be facilitated.

[Chemical Formula 23]

(G201)

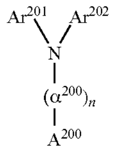

In General Formula (G201), each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group; $\alpha^{200}$ represents a substituted or unsubstituted phenylene group or a substituted or unsubstituted biphenyldiyl group; n represents 0 or 1; and $A^{200}$ represents a substituted or unsubstituted 3-carbazolyl group.

Alternatively, the second organic compound is preferably an organic compound represented by General Formula (G202), in which case the hole-transport property can be improved. When an amino group and a carbazolyl group that is a π-electron rich skeleton co-exist in a molecule and are positioned to have a resonance structure, the HOMO level can be made shallow, thereby facilitating hole transfer.

[Chemical Formula 24]

(G202)

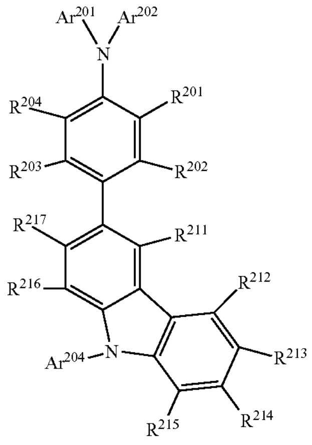

In General Formula (G202), each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group. Each of $R^{201}$ to $R^{204}$ and $R^{211}$ to $R^{217}$ independently represents hydrogen, an alkyl group having 1 to 10 carbon atoms, an unsubstituted phenyl group or a phenyl group including as a substituent at least one alkyl group having 1 to 10 carbon atoms, or an unsubstituted biphenyl group or a biphenyl group including as a substituent at least one alkyl group having 1 to 10 carbon atoms. $Ar^{204}$ represents an alkyl group having 1 to 10 carbon atoms, an unsubstituted phenyl group or a phenyl group including as a substituent at least one alkyl group having 1 to 10 carbon atoms, an unsubstituted biphenyl group or a biphenyl group including as a substituent at least one alkyl group having 1 to 10 carbon atoms, or an unsubstituted terphenyl group or a terphenyl group including as a substituent at least one alkyl group having 1 to 10 carbon atoms.

Alternatively, the second organic compound is preferably an organic compound represented by General Formula (G203), in which case the hole-transport property can be improved.

[Chemical Formula 25]

(G203)

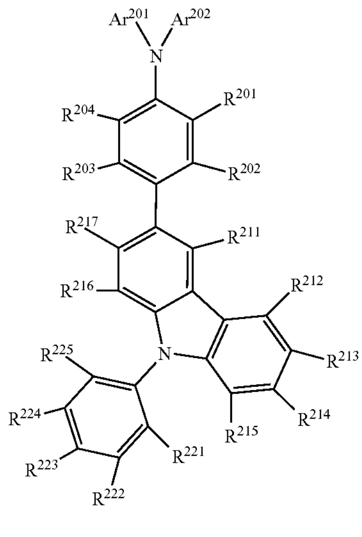

In General Formula (G203), each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group. Each of $R^{201}$ to $R^{204}$, $R^{211}$ to $R^{217}$, and $R^{221}$ to $R^{225}$ independently represents hydrogen, an alkyl group having 1 to 10 carbon atoms, an unsubstituted phenyl group or a phenyl group including as a substituent at least one alkyl group having 1 to 10 carbon atoms, or an unsubstituted biphenyl group or a biphenyl group including as a substituent at least one alkyl group having 1 to 10 carbon atoms.

In General Formulae (G200) to (G203), it is preferable that each of $Ar^{201}$ and $Ar^{202}$ independently represent a substituted or unsubstituted 2-fluorenyl group, a substituted or unsubstituted spiro-9,9'-bifluoren-2-yl group, or a biphenyl-4-yl group.

In the organic compound represented by General Formula (G200), examples of the alkyl group having 1 to 10 carbon atoms include a methyl group, an ethyl group, an n-propyl group, an isopropyl group, an n-butyl group, an isobutyl group, a tert-butyl group, a sec-butyl group, a neopentyl group, an n-hexyl group, an n-octyl group, and an n-decyl group.

In the case where the group in the organic compound represented by General Formula (G200) includes a substituent, the substituent is preferably an alkyl group having 1 to 6 carbon atoms such as a methyl group, an ethyl group, a propyl group, an isopropyl group, a butyl group, an isobutyl group, a sec-butyl group, a tert-butyl group, a pentyl group, a sec-pentyl group, a neopentyl group, an isopentyl group, or a hexyl group; a cycloalkyl group having 5 to 7 carbon atoms such as a cyclopentyl group, a cyclohexyl group, or a cycloheptyl group; or an aryl group having 6 to 13 carbon atoms in a ring such as a phenyl group, a tolyl group, a xylyl group, a biphenyl group, an indenyl group, a naphthyl group, a fluorenyl group, or a 9,9-dimethylfluorenyl group.

Specifically, the organic compound represented by any of General Formula (G200) to (G203) is preferably any of the following organic compounds represented by Structural Formulae (200) to (212): N-(1,1'-biphenyl-4-yl)-N-[4-(9-phenyl-9H-carbazol-3-yl)phenyl]-9,9-dimethyl-9H-fluoren-2-amine (abbreviation: PCBBiF) (200), N-[4-(9-phenyl-9H-carbazol-3-yl)phenyl]-bis(9,9-dimethyl-9H-fluoren-2-yl) amine (abbreviation: PCBFF) (201), N-(1,1'-biphenyl-4-yl)-N-[4-(9-phenyl-9H-carbazol-3-yl)phenyl]-9,9-dimethyl-9H-fluoren-4-amine (202), N-[4-(9-phenyl-9H-carbazol-3-yl)phenyl]-(9,9-dimethyl-9H-fluoren-2-yl)-9,9-dimethyl-9H-fluoren-4-amine (203), N-(1,1'-biphenyl-4-yl)-N-[4-(9-phenyl-9H-carbazol-3-yl)phenyl]-9,9-diphenyl-9H-fluoren-2-amine (204), N-(1,1'-biphenyl-4-yl)-N-[4-(9-phenyl-9H-carbazol-3-yl)phenyl]-9,9-diphenyl-9H-fluoren-4-amine (205), N-(1,1'-biphenyl-4-yl)-N-[4-(9-phenyl-9H-carbazol-3-yl)phenyl]-9,9'-spirobi(9H-fluoren)-2-amine (abbreviation: PCBBiSF) (206), N-(1,1'-biphenyl-4-yl)-N-[4-(9-phenyl-9H-carbazol-3-yl)phenyl]-9,9'-spirobi(9H-fluoren)-4-amine (207), N-[4-(9-phenyl-9H-carbazol-3-yl)phenyl]-N-(1,1':3',1"-terphenyl-4-yl)-9,9-dimethyl-9H-fluoren-2-amine (208), N-[4-(9-phenyl-9H-carbazol-3-yl)phenyl]-N-(1,1':4',1"-terphenyl-4-yl)-9,9-dimethyl-9H-fluoren-2-amine (209), N-[4-(9-phenyl-9H-carbazol-3-yl)phenyl]-N-(1,1':3',1"-terphenyl-4-yl)-9,9-dimethyl-9H-fluoren-4-amine (210), and N-[4-(9-phenyl-9H-carbazol-3-yl)phenyl]-N-(1,1':4',1"-terphenyl-4-yl)-9,9-dimethyl-9H-fluoren-4-amine (211).

-continued
[Chemical Formula 26]
(200)
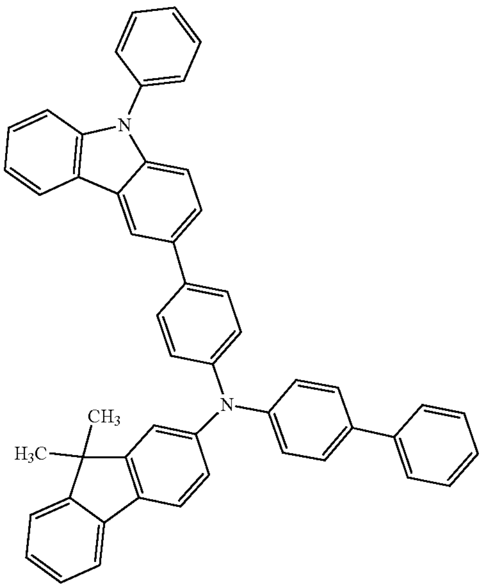
(201)
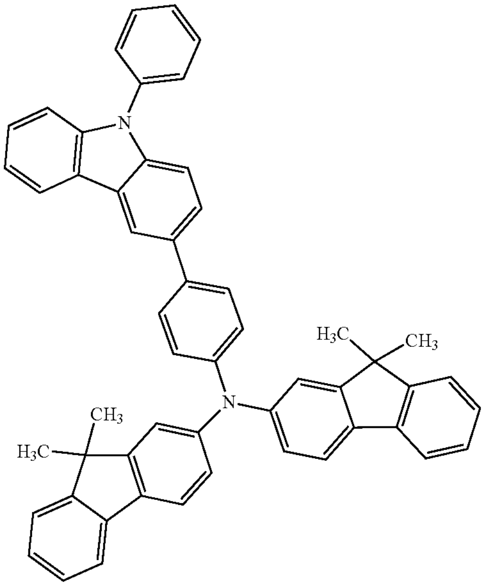
(202)
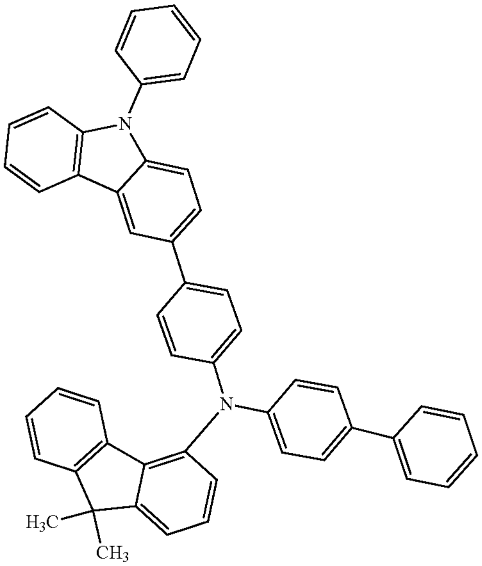
(203)
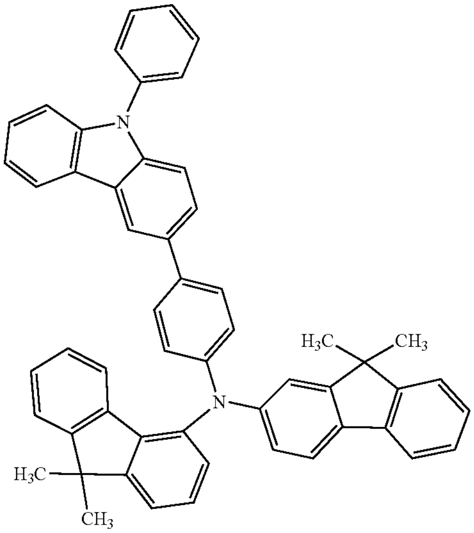

-continued
(204)
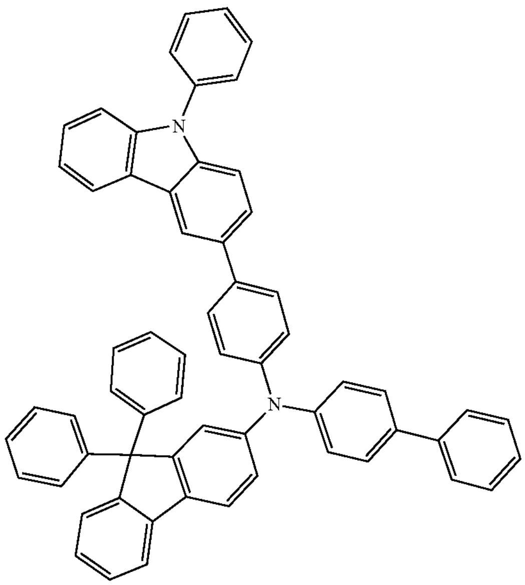
(205)
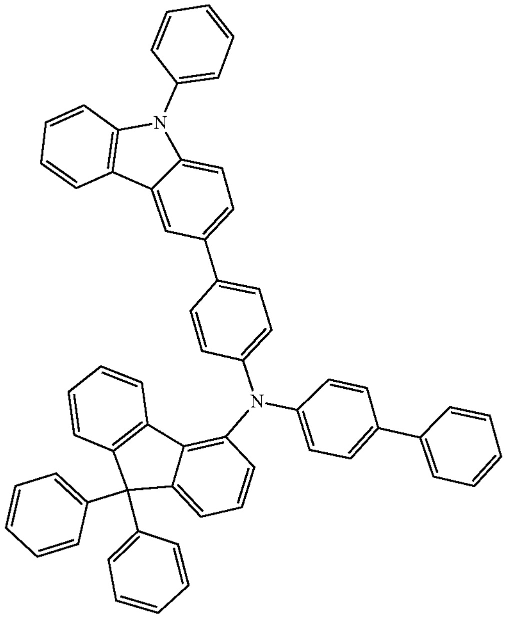
-continued
[Chemical Formula 27]
(206)
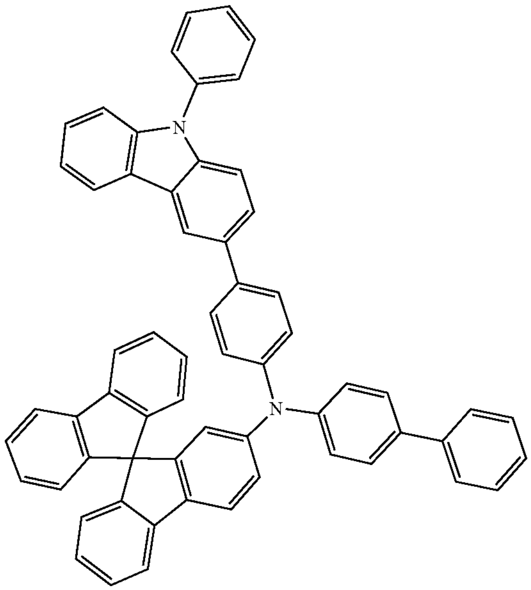
(207)
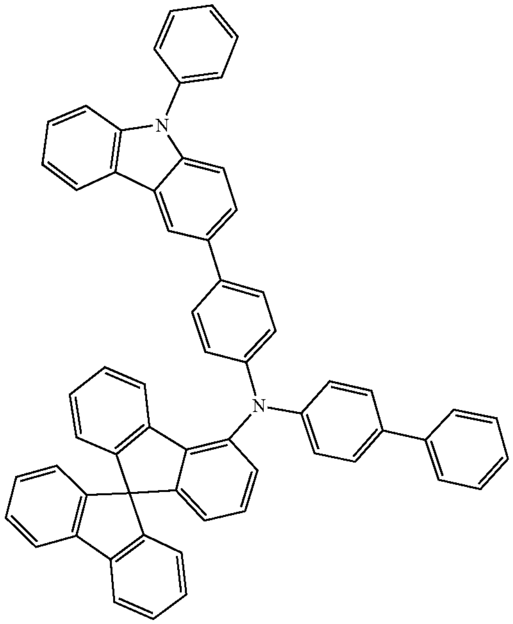

-continued (208)

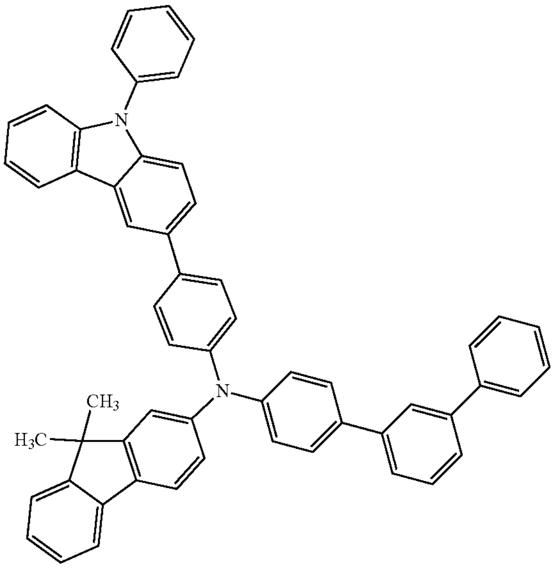

(209)

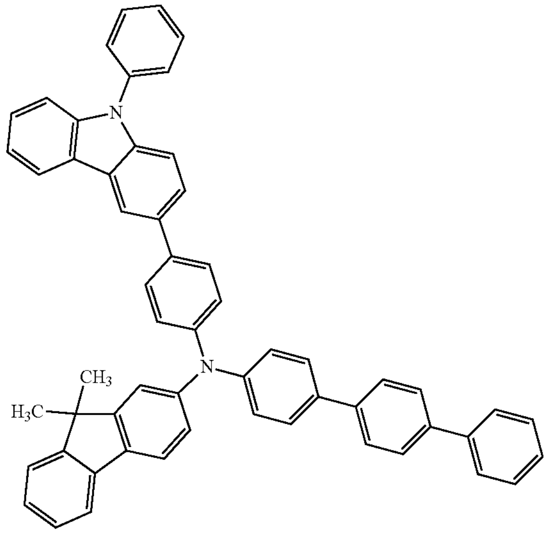

-continued (210)

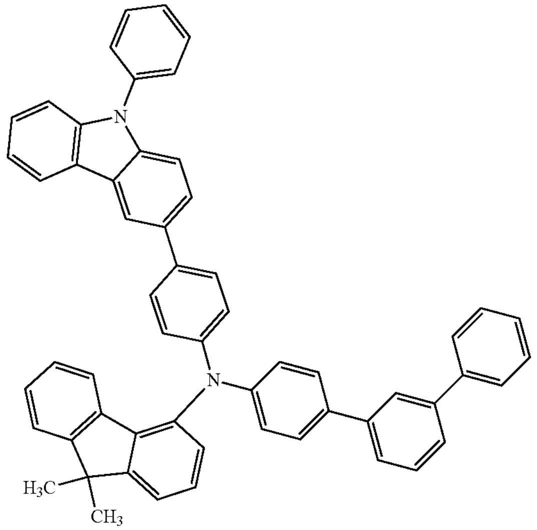

(211)

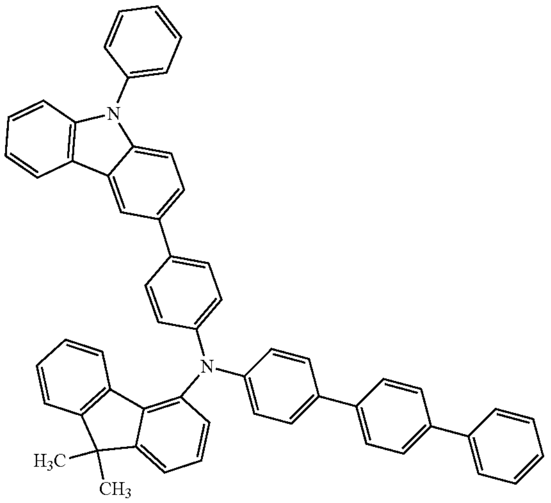

In the case where the EL layer 103 includes the hole-blocking layer 125, the hole-blocking layer 125 is provided to be in contact with the light-emitting layer 113. The hole-blocking layer 125 is formed to include the third organic compound having an electron-transport property and capable of blocking holes. As the third organic compound, a material having a high electron-transport property, a low hole-transport property, and a deep HOMO level is suitably used. Specifically, it is preferable to use a substance having a deeper HOMO level than the material contained in the light-emitting layer 113 by 0.5 eV or more and having an electron mobility higher than or equal to $1\times10^{-6}$ $cm^2/Vs$ when the square root of the electric field strength [V/cm] is 600.

As the third organic compound, it is preferable to use an organic compound having a Tg of 100° C. or higher, preferably 120° C. or higher, further preferably 140° C. or higher, and it is more preferable to use a heteroaromatic compound having a Tg of 100° C. or higher, preferably 120° C. or higher, further preferably 140° C. or higher in terms of improving heat resistance of the light-emitting device.

In addition, the third organic compound is preferably an organic compound including a bicarbazole skeleton and a heteroaromatic ring skeleton having at least one of a pyridine ring, a diazine ring, and a triazine ring. Here, the heteroaromatic ring having a pyridine ring means, for example, a pyridine ring itself and a pyridine ring condensed to a benzene ring (i.e., a quinoline ring and an isoquinoline ring).

Note that it is particularly preferable that the heteroaromatic ring skeleton of the third organic compound be a condensed heteroaromatic ring skeleton including a pyridine ring or a diazine ring.

A bicarbazole skeleton is a skeleton represented by General Formula (g300). An organic compound including such a skeleton has high heat resistance, and thus can achieve a light-emitting device with favorable heat resistance when used for the hole-blocking layer 125. Note that the skeleton represented by General Formula (g300) is bonded to the heteroaromatic ring skeleton or the condensed heteroaromatic ring skeleton at a position indicated by *. The bicarbazole skeleton may be bonded to the heteroaromatic ring skeleton or the condensed heteroaromatic ring skeleton through an arylene group.

[Chemical Formula 28]

(g300)

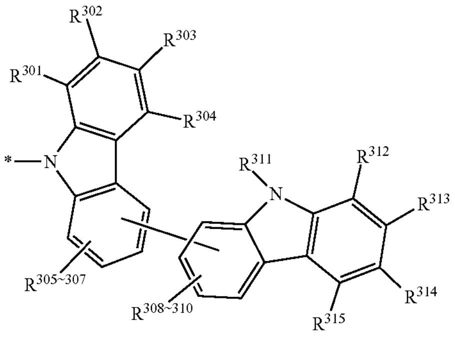

In General Formula (g300), each of $R^{301}$ to $R^{315}$ independently represents any of hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, and a substituted or unsubstituted heteroaryl group having 3 to 13 carbon atoms in a skeleton.

The third organic compound is preferably an organic compound represented by any of General Formulae (G300) to (G303), each of which has a high glass transition temperature (Tg) and thus has favorable heat resistance, because the heat resistance of the light-emitting device can be improved. Thus, the third organic compound preferably includes a bicarbazole skeleton and a condensed aromatic ring including a pyrazine ring that is a kind of a diazine ring.

[Chemical Formula 29]

(G300)

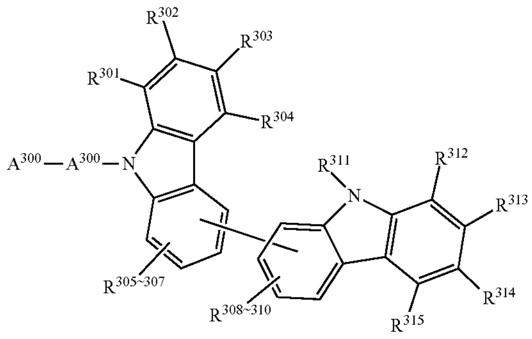

In General Formula (G300), $A^{300}$ represents any of a heteroaromatic ring including a pyridine skeleton, a heteroaromatic ring including a diazine skeleton, and a heteroaromatic ring including a triazine skeleton. Each of $R^{301}$ to $R^{315}$ independently represents any of hydrogen, a substituted or unsubstituted alkyl group having 1 to 6 carbon atoms, a substituted or unsubstituted cycloalkyl group having 5 to 7 carbon atoms, a substituted or unsubstituted aryl group having 6 to 13 carbon atoms in a skeleton, and a substituted or unsubstituted heteroaryl group having 3 to 13 carbon atoms in a skeleton. $Ar^{300}$ represents a substituted or unsubstituted arylene group having 6 to 25 carbon atoms, or a single bond. Preferably, an anthracenylene group is not included as the arylene group of $Ar^{300}$.

[Chemical Formula 30]

(G301)

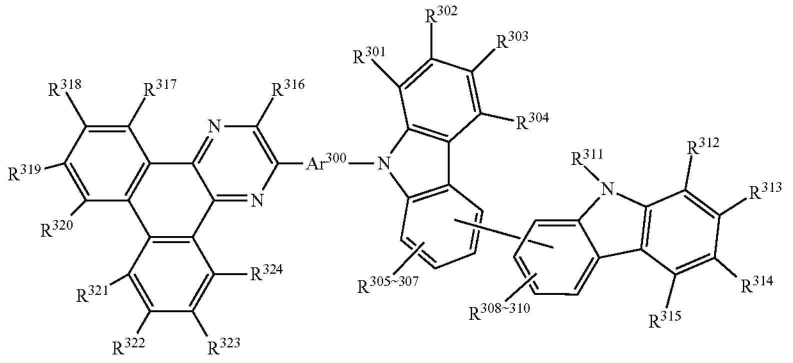

In General Formula (G301), each of $R^{301}$ to $R^{324}$ independently represents any of hydrogen, a substituted or unsubstituted alkyl group having 1 to 6 carbon atoms, a substituted or unsubstituted cycloalkyl group having 5 to 7 carbon atoms, and a substituted or unsubstituted aryl group having 6 to 13 carbon atoms. $Ar^{300}$ represents a substituted or unsubstituted arylene group having 6 to 25 carbon atoms, or a single bond. Preferably, an anthracenylene group is not included as an arylene group of $Ar^{300}$.

[Chemical Formula 31]

(G302)

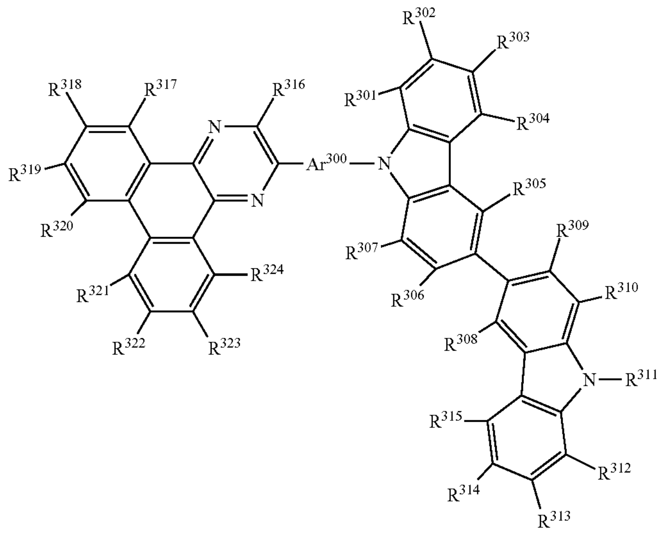

In General Formula (G302), each of $R^{301}$ to $R^{324}$ independently represents any of hydrogen, a substituted or unsubstituted alkyl group having 1 to 6 carbon atoms, a substituted or unsubstituted cycloalkyl group having 5 to 7 carbon atoms, and a substituted or unsubstituted aryl group having 6 to 13 carbon atoms. $Ar^{300}$ represents a substituted or unsubstituted arylene group having 6 to 25 carbon atoms, or a single bond. Preferably, an anthracenylene group is not included as an arylene group of $Ar^{300}$.

[Chemical Formula 32]

(G303)

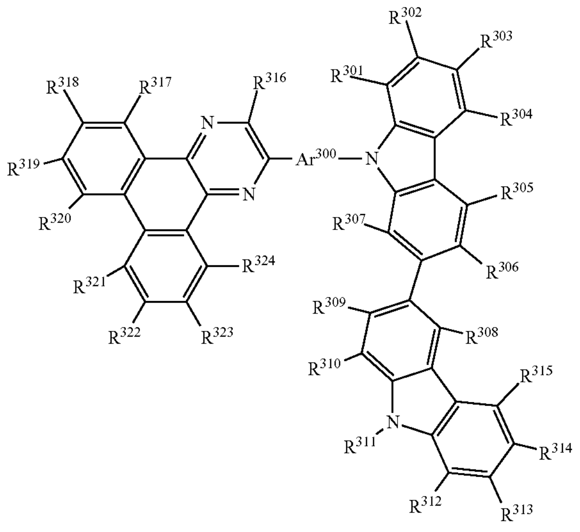

In General Formula (G303), each of $R^{301}$ to $R^{324}$ independently represents hydrogen, a substituted or unsubstituted alkyl group having 1 to 6 carbon atoms, a substituted or unsubstituted cycloalkyl group having 5 to 7 carbon atoms, or a substituted or unsubstituted aryl group having 6 to 13 carbon atoms. $Ar^{300}$ represents a substituted or unsubstituted arylene group having 6 to 25 carbon atoms, or a single bond. Preferably, an anthracenylene group is not included as an arylene group in $Ar^{300}$.

Examples of the alkyl group having 1 to 6 carbon atoms in each of General Formulae (G300), (G301), (G302), and (G303) include a methyl group, an ethyl group, a propyl group, an isopropyl group, a butyl group, an isobutyl group, a sec-butyl group, a tert-butyl group, a pentyl group, an isopentyl group, and a hexyl group. Examples of the cycloalkyl group having 5 to 7 carbon atoms include a cyclopentyl group, a cyclohexyl group, and a cycloheptyl group. Examples of the aryl group having 6 to 13 carbon atoms include a phenyl group, a tolyl group, a xylyl group, a biphenyl group, an indenyl group, a naphthyl group, and a fluorenyl group. Examples of the arylene group having 6 to 25 carbon atoms include a 1,2-, 1,3-, and 1,4-phenylene groups, a 2,6-, 3,5-, and 2,4-toluylene groups, a 4,6-dimethylbenzene-1,3-diyl group, a 2,4,6-trimethylbenzene-1,3-diyl group, a 2,3,5,6-tetramethylbenzene-1,4-diyl group, a 3,3'-, 3,4'-, and 4,4'-biphenylene groups, a 1,1':3',1"-terbenzene-3,3"-diyl group, a 1,1':4',1"-terbenzene-3,3"-diyl group, a 1,1':4',1"-terbenzene-4,4"-diyl group, a 1,1':3',1":3",1'"-quaterbenzene-3,3'"-diyl group, a 1,1':3',1":4",1'"-quater benzene-3,4'''-diyl group, a 1,1':4',1'':4'',1'''-quaterbenzene-4,4'''-diyl group, a 1,4-, 1,5-, 2,6-, and 2,7-naphthylene groups, a 2,7-fluorenylene group, a 9,9-dimethyl-2,7-fluorenylene group, a 9,9-diphenyl-2,7-fluorenylene group, a 9,9-dimethyl-1,4-fluorenylene group, a spiro-9,9'-bifluorene-2,7-diyl group, a 9,10-dihydro-2,7-phenanthrenylene group, a 2,7-phenanthrenylene group, a 3,6-phenanthrenylene group, a 9,10-phenanthrenylene group, a 2,7-triphenylenylene group, a 3,6-triphenylenylene group, a 2,8-benzo[a]phenanthrenylene group, a 2,9-benzo[a]phenanthrenylene group, and a 5,8-benzo[c]phenanthrenylene group.

The alkyl group having 1 to 6 carbon atoms, the cycloalkyl group having 5 to 7 carbon atoms, the aryl group having 6 to 13 carbon atoms, and the arylene group having 6 to 25 carbon atoms may each include a substituent. The substituent is preferably an alkyl group having 1 to 6 carbon atoms such as a methyl group, an ethyl group, a propyl group, an isopropyl group, a butyl group, an isobutyl group, a sec-butyl group, a tert-butyl group, a pentyl group, an isopentyl group, or a hexyl group; a cycloalkyl group having 5 to 7 carbon atoms such as a cyclopentyl group, a cyclohexyl group, or a cycloheptyl group; or an aryl group having 6 to 13 carbon atoms in a ring such as a phenyl group, a tolyl group, a xylyl group, a biphenyl group, an indenyl group, a naphthyl group, a fluorenyl group, or a 9,9-dimethylfluorenyl group.

Note that as the organic compound represented by any of General Formulae (G300) to (G303), it is possible to suitably use any of the following represented by Structural Formulae (300) to (312): 2-{3-[3-(N-phenyl-9H-carbazol-3-yl)-9H-carbazol-9-yl]phenyl}dibenzo[f,h]quinoxaline (abbreviation: 2mPCCzPDBq) (300), 2-{3-[2-(N-phenyl-9H-carbazol-3-yl)-9H-carbazol-9-yl]phenyl}dibenzo[f,h]quinoxaline (abbreviation: 2mPCCzPDBq-02) (301), 2-{3-[3-(N-phenyl-9H-carbazol-2-yl)-9H-carbazol-9-yl]phenyl}dibenzo[f,h]quinoxaline (abbreviation: 2mPCCzPDBq-03) (302), 2-{3-[3-(N-(3,5-di-tert-butylphenyl-9H-carbazol-3-yl)-9H-carbazol-9-yl]phenyl}dibenzo[f,h]quinoxaline (303), 9-[3-(4,6-diphenyl-1,3,5-triazin-2-yl)phenyl]-9'-phenyl-3,3'-bi-9H-carbazole (abbreviation: mPCCzPTzn) (304), 9-[3-(4,6-diphenyl-1,3,5-triazin-2-yl)phenyl]-9'-phenyl-2,3'-bi-9H-carbazole (abbreviation: mPCCzPTzn-02) (305), 9-[4-(4,6-diphenyl-1,3,5-triazin-2-yl)phenyl]-9'-phenyl-3,3'-bi-9H-carbazole (abbreviation: PCCzPTzn) (306), 9-(4,6-diphenyl-1,3,5-triazin-2-yl)-9'-phenyl-3,3'-bi-9H-carbazole (abbreviation: PCCzTzn(CzT)) (307), 9-[3-(4,6-diphenyl-pyrimidin-2-yl)phenyl]-9'-phenyl-3,3'-bi-9H-carbazole (abbreviation: 2PCCzPPm) (308), 9-(4,6-diphenyl-pyrimidin-2-yl)-9'-phenyl-3,3'-bi-9H-carbazole (abbreviation: 2PCCzPm) (309), 4-[2-(N-phenyl-9H-carbazol-3-yl)-9H-carbazol-9-yl]benzofuro[3,2-d]pyrimidine (abbreviation: 4PCCzBfpm-02) (310), and 4-{3-[3-(N-phenyl-9H-carbazol-3-yl)-9H-carbazol-9-yl]phenyl}benzo[h]quinazoline (311), 9-[3-(2,6-diphenyl-pyridin-4-yl)phenyl]-9'-phenyl-3,3'-bi-9H-carbazole (312).

[Chemical Formula 33]

(300)

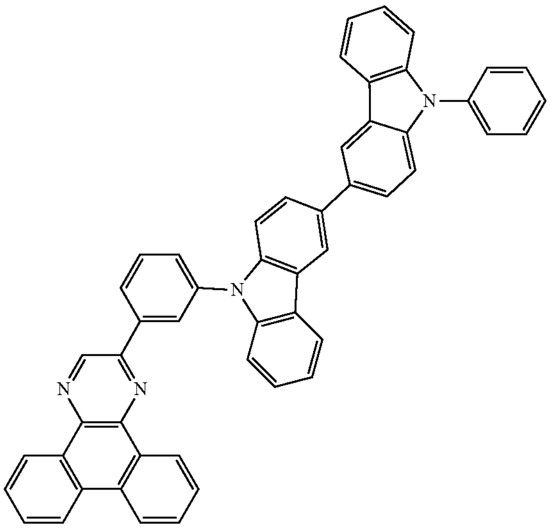

(301)

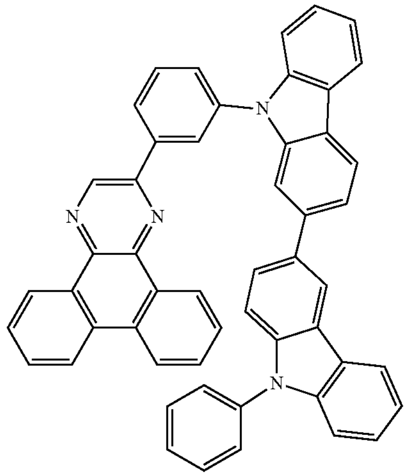

(302)

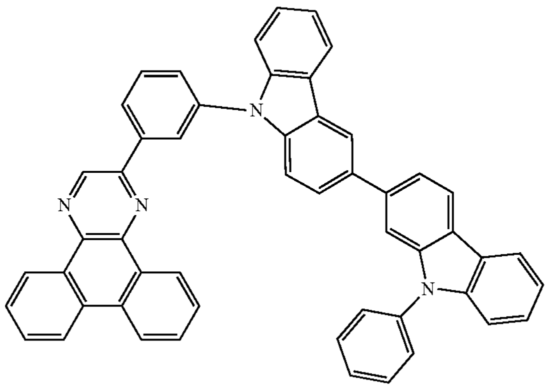

-continued
(303)
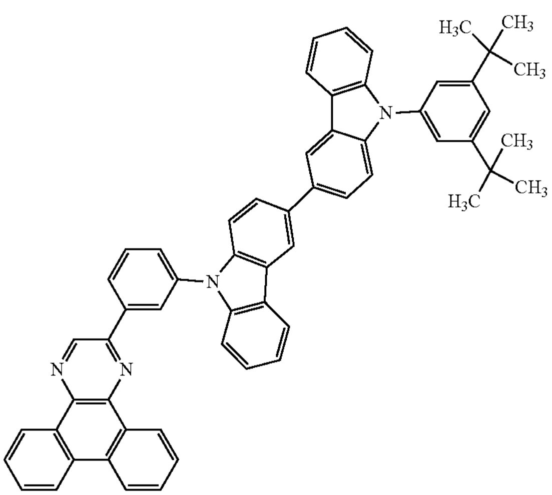
(304)
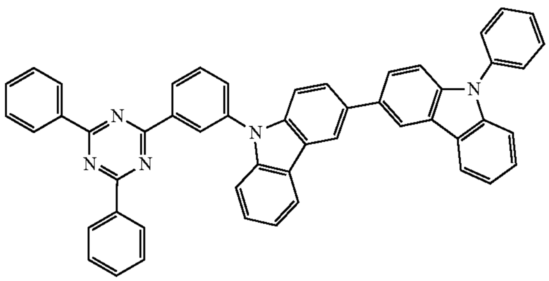
(305)
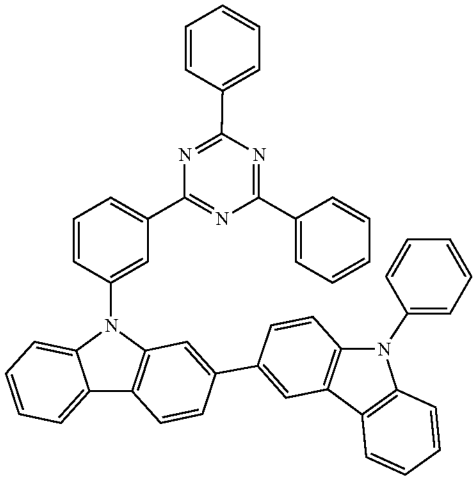
(306)
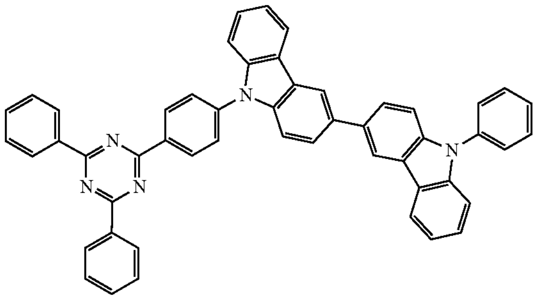
-continued
(307)
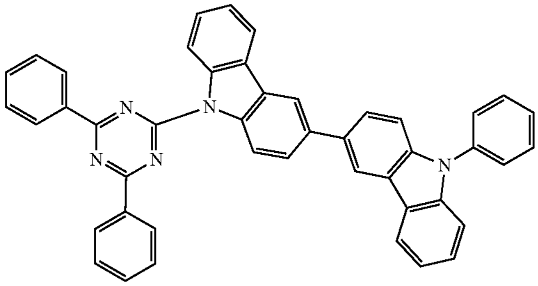
[Chemical Formula 34]
(308)
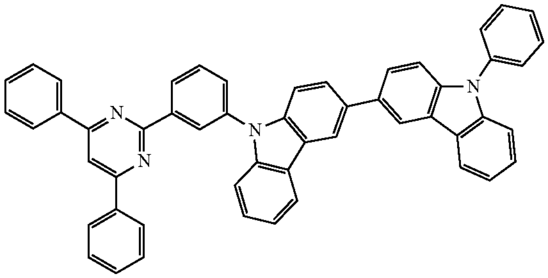
(309)
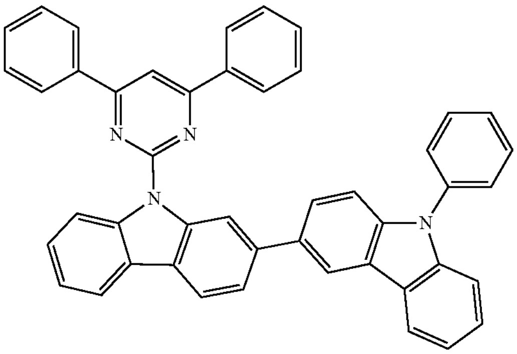
(310)
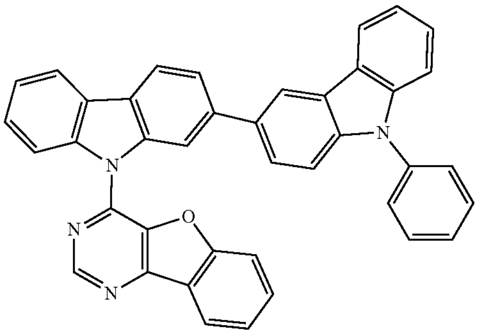

-continued (311)

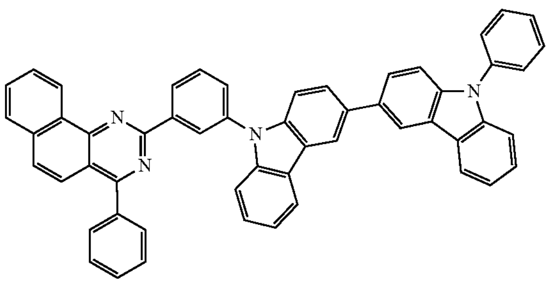

(312)

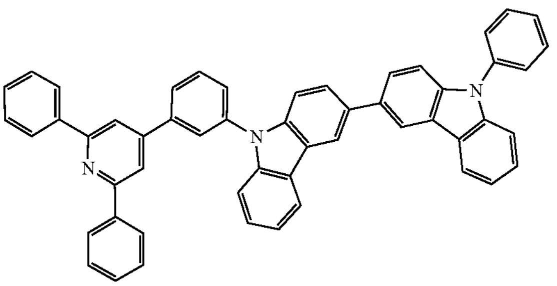

When at least one of the first to third organic compounds is an organic compound represented by any of the above general formulae, heat resistance of the light-emitting device is improved. It is preferable that two, preferably all of the first to third organic compounds be each an organic compound represented by any of the above general formulae for higher heat resistance. In the case where two of the first to third organic compounds are each an organic compound represented by any of the above general formulae, a combination of the first and third organic compounds or a combination of the second and third organic compounds can be employed, and especially the combination of the first and third organic compounds is preferable for higher effect of improving heat resistance.

One of the first to third organic compounds preferably has a glass transition temperature (Tg) higher than or equal to 120° C. and lower than or equal to 180° C., in which case the light-emitting device can have more favorable heat resistance. Furthermore, two, preferably all of the first to third organic compounds each preferably have a glass transition temperature (Tg) higher than or equal to 120° C. and lower than or equal to 180° C. for higher heat resistance.

Next, examples of other structures and materials of the light-emitting device of one embodiment of the present invention will be described. As described above, the light-emitting device of one embodiment of the present invention includes, between the pair of electrodes of the anode 101 and the cathode 102, the EL layer 103 including a plurality of layers. The EL layer 103 includes the light-emitting layer 113 containing at least the light-emitting substance and the first organic compound (and the second organic compound), and preferably includes the hole-blocking layer 125 containing the third organic compound.

The anode 101 is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, a film of indium oxide-zinc oxide is formed by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used for the anode 101. Graphene can also be used for the anode 101. Note that when a composite material described later is used for a layer that is in contact with the anode 101 in the EL layer 103, an electrode material can be selected regardless of its work function.

Although the EL layer 103 preferably has a stacked-layer structure, there is no particular limitation on the stacked-layer structure, and various layers such as a hole-injection layer, a hole-transport layer, a light-emitting layer, an electron-transport layer, an electron-injection layer, a carrier-blocking layer (a hole-blocking layer and an electron-blocking layer), an exciton-blocking layer, and a charge-generation layer can be employed. Note that one or more of the above layers are not necessarily provided. This embodiment specifically describes below a structure including the hole-injection layer 111, the hole-transport layer 112, the light-emitting layer 113, the hole-blocking layer 125, the electron-transport layer 114, and the electron-injection layer 115, as illustrated in FIG. 1.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) and copper phthalocyanine (CuPc), an aromatic amine compound such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The substance having an acceptor property can extract electrons from an adjacent hole-transport layer (or hole-transport material) by application of an electric field.

Among substances having an acceptor property, the organic compound having an acceptor property is easy to use because it is easily deposited by vapor deposition.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the anode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ $cm^2/Vs$ or higher. Organic compounds that can be used as the material having a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenylanthracen-9-yl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may include a vinyl skeleton. Examples of the aromatic hydrocarbon including a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

The material having a hole-transport property used for the composite material further preferably includes any of a carbazole skeleton, a dibenzofuran skeleton, a dibenzothiophene skeleton, and an anthracene skeleton. In particular, an aromatic amine including a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the organic compound including an N,N'-bis(4-biphenyl)amino group is preferable because a light-emitting device having a favorable lifetime can be manufactured. Specific examples of the organic compound include N-(4-biphenyl)-6,N-diphenylbenzo[b]naphtho[1,2-d]furan-8-amine (abbreviation: BnfABP), N,N'-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N'-bis(4-biphenyl)benzo[b]naphtho[1,2-d]furan-6-amine (abbreviation: BBABnf(6)), N,N'-bis(4-biphenyl)benzo[b]naphtho[1,2-d]furan-8-amine (abbreviation: BBABnf(8)), N,N'-bis(4-biphenyl)benzo[b]naphtho[2,3-d]furan-4-amine (abbreviation: BBABnf(II)(4)), N,N'-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7; 1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6; 2'-binaphthyl-2-yl)triphenylamine (abbreviation: BBA(βN2)B), 4,4'-diphenyl-4"-(7; 2'-binaphthyl-2-yl)triphenylamine (abbreviation: BBA(βN2)B-03), 4,4'-diphenyl-4"-(4; 2'-binaphthyl-1-yl)triphenylamine (abbreviation: BBAβNαNB), 4,4'-diphenyl-4"-(5; 2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N'-bis(4-biphenylyl)-9,9'-spirobi[9H-fluoren]-2-amine (abbreviation: BBASF), N,N'-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl] triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N'-bis(9,9-dimethyl-9H-fluoren-2-yl)-9,9'-spirobi-9H-fluoren-4-amine, N,N'-bis(9,9-dimethyl-9H-fluoren-2-yl)-9,9'-spirobi-9H-fluoren-3-amine, N,N'-bis(9,9-dimethyl-9H-fluoren-2-yl)-9,9'-spirobi-9H-fluoren-2-amine, and N,N'-bis (9,9-dimethyl-9H-fluoren-2-yl)-9,9'-spirobi-9H-fluoren-1-amine.

Note that it is further preferable that the material having a hole-transport property used for the composite material have a relatively deep HOMO level higher than or equal to −5.7 eV and lower than or equal to −5.4 eV. Using the material with a hole-transport property which has a relatively deep HOMO level for the composite material makes it easy to inject holes into the hole-transport layer 112 and to obtain alight-emitting device having a favorable lifetime. In addition, when the material having a hole-transport property that is used in the composite material has a relatively deep HOMO level, induction of holes can be inhibited properly so that the light-emitting device can have more favorable lifetime.

Note that mixing the above composite material with a fluoride of an alkali metal or an alkaline earth metal (the proportion of fluorine atoms in a layer using the mixed material is preferably higher than or equal to 20%) can lower the refractive index of the layer. This also enables a layer with a low refractive index to be formed in the EL layer 103, leading to higher external quantum efficiency of the light-emitting device.

The formation of the hole-injection layer 111 can improve the hole-injection property, which allows the light-emitting device to be driven at a low voltage.

The hole-transport layer 112 is formed using a material having a hole-transport property. The material having a hole-transport property preferably has a hole mobility higher than or equal to $1\times10^{-6}$ $cm^2/Vs$.

Examples of the material having a hole-transport property include compounds having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 9,9'-bis(1,1'-biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), and 9-(1,1'-biphenyl-3-yl)-9'-(1,1'-biphenyl-4-yl)-9H,9'H-3,3'-bicarbazole (abbreviation: mBPCCBP); compounds having a thiophene skeleton, such as 4,4',4"-(benzene-1,3,5-triyl)tri (dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the material having a hole-transport property used for the composite material for the hole-injection layer 111 can also be suitably used as the material contained in the hole-transport layer 112.

As described above, the light-emitting layer 113 contains the light-emitting substance and the first organic compound as the host material. The second organic compound may be further contained. The light-emitting layer 113 may additionally contain other materials. Alternatively, the light-emitting layer 113 may be a stack of two layers with different compositions. The first organic compound preferably has an electron-transport property, and the second organic preferably has a hole-transport property.

In one embodiment of the present invention, the light-emitting substance is preferably a substance emitting red light. In addition, the light-emitting substance is preferably a substance emitting phosphorescent light, particularly preferably an organometallic complex. Examples of the light-emitting substances include organometallic iridium complexes including a pyrimidine skeleton, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), and bis[4,6-di(naphthalen-1-yl)pyrimidinato] (dipivaloylmethanato)iridium(III) (abbreviation: $[Ir(d1npm)_2(dpm)]$); organometallic iridium complexes including a pyrazine skeleton, such as (acetylacetonato)bis(2,3,5-triphenylpyrazinato)

iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), and (acetylacetonato)bis[2,3-bis(4-fluorophenyl)quinoxalinato]iridium(III) (abbreviation: $[Ir(Fdpq)_2(acac)]$); organometallic iridium complexes including a pyridine skeleton, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), (3,7-diethyl-4,6-nonanedionato-κ$O^4$,κ$O^6$)bis[2,4-dimethyl-6-[7-(1-methylethyl)-1-isoquinolinyl-κN]phenyl-κC]iridium(III), and (3,7-diethyl-4,6-nonanedionato-κ$O^4$,κ$O^6$)bis[2,4-dimethyl-6-[5-(1-methylethyl)-2-quinolinyl-κN]phenyl-κC]iridium(III); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato) (monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$). These compounds have an emission peak in the wavelength range from 600 nm to 700 nm. Furthermore, the organometallic iridium complexes including a pyrazine skeleton can provide red light emission with favorable chromaticity. Note that other known red phosphorescent substances can also be used.

In the case where a light-emitting apparatus does not use a red-light-emitting substance as the light-emitting substance or includes light-emitting devices with different structures, the light-emitting substance may be a fluorescent substance, a phosphorescent substance, a substance exhibiting thermally activated delayed fluorescence (TADF), or any other light-emitting substance.

Examples of the material that can be used as a fluorescent substance in the light-emitting layer 113 are as follows. Any other fluorescent substance can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N,N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02), and 3,10-bis[N-(dibenzofuran-3-yl)-N-phenylamino]naphtho[2,3-b; 6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the material that can be used when a phosphorescent substance is used as the light-emitting substance in the light-emitting layer 113 are as follows.

The examples include an organometallic iridium complex including a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: $[Ir(mpptz\text{-}dmp)_3]$) and tris(5-methyl-3,4-diphenyl-4H-1,2,4-triazolato)iridium(III) (abbreviation: $[Ir(Mptz)_3]$); an organometallic iridium complex including a 1H-triazole skeleton, such as tris[3-methyl-1-(2-methylphenyl)-5-phenyl-TH-1,2,4-triazolato]iridium(III) (abbreviation: $[Ir(Mptz1\text{-}mp)_3]$) and tris(1-methyl-5-phenyl-3-propyl-TH-1,2,4-triazolato)iridium(III) (abbreviation: $[Ir(Prptz1\text{-}Me)_3]$); an organometallic iridium complex including an imidazole skeleton, such as fac-tris[1-(2,6-diisopropylphenyl)-2-phenyl-TH-imidazole]iridium(III) (abbreviation: $[Ir(iPrpmi)_3]$), tris[3-(2,6-dimethylphenyl)-7-methylimidazo[1,2-f]phenanthridinato]iridium(III) (abbreviation: $[Ir(dmpimpt\text{-}Me)_3]$), and tris(2-[1-{2,6-bis(1-methylethyl)phenyl}-1H-imidazol-2-yl-κ$N^3$]-4-cyanophenyl-κC) (abbreviation: CNImIr); an organometallic complex including a banzimizazolidene skeleton, such as tris[6-tert-butyl-3-phenyl-2H-imidazo[4,5-b]pyrazin-1-yl-κ$C^2$)phenyl-κC]iridium(III) (abbreviation: $[Ir(cb)_3]$); and an organometallic iridium complex in which a phenylpyridine derivative including an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato- N,$C^{2'}$]iridium(III) picolinate (abbreviation: FIrpic), bis{2-[3',5'-bis(trifluoromethyl)phenyl]pyridinato-N,$C^{2'}$}iridium (III) picolinate (abbreviation: [Ir($CF_3$ppy)$_2$(pic)]), and bis [2-(4',6'-difluorophenyl)pyridinato-N,$C^{2'}$]iridium(III) acetylacetonate (abbreviation: FIr(acac)). These compounds exhibit blue phosphorescence and have an emission peak in the wavelength range from 440 nm to 520 nm.

Other examples include an organometallic iridium complex including a pyrimidine skeleton, such as tris(4-methyl-6-phenylpyrimidinato)iridium(III) (abbreviation: [Ir (mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir(tBuppm)$_2$ (acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato) bis(4,6-diphenylpyrimidinato)iridium(III) (abbreviation: [Ir (dppm)$_2$(acac)]); an organometallic iridium complex having a pyrazine skeleton, such as (acetylacetonato)bis(3,5-dimethyl-2-phenylpyrazinato)iridium(III) (abbreviation: [Ir (mppr-Me)$_2$(acac)]) or (acetylacetonato)bis(5-isopropyl-3-methyl-2-phenylpyrazinato)iridium(III) (abbreviation: [Ir (mppr-iPr)$_2$(acac)]); an organometallic iridium complex including a pyridine skeleton, such as tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo [h]quinolinato)iridium(III) (abbreviation: [Ir(bzq)$_3$]), tris(2-phenylquinolinato-N,$C^{2'}$)iridium(III) (abbreviation: [Ir (pq)$_3$]), bis(2-phenylquinolinato-N,$C^{2'}$)iridium(III) acetylacetonate (abbreviation: [Ir(pq)$_2$(acac)]), [2-d3-methyl-8-(2-pyridinyl-κN)benzofuro[2,3-b]pyridine-κC]bis[2-(5-d3-methyl-2-pyridinyl-κN2)phenyl-κC]iridium(III) (abbreviation: [Ir(5mppy-d3)$_2$(mbfpypy-d3)]), [2-(methyl-d3)-8-[4-(1-methylethyl-1-d)-2-pyridinyl-κN]benzofuro[2, 3-b]pyridin-7-yl-κC]bis[5-(methyl-d3)-2-[5-(methyl-d3)-2-pyridinyl-κN]phenyl-κC]iridium(III) (abbreviation: Ir(5mtpy-d6)$_2$(mbfpypy-iPr-d4)), [2-d3-methyl-(2-pyridinyl-κN)benzofuro[2,3-b]pyridine-κC]bis[2-(2-pyridinyl-N) phenyl-κC]iridium(III) (abbreviation: [Ir(ppy)$_2$(mbfpypy-d3)]), [2-(4-d3-methyl-5-phenyl-2-pyridinyl-κ$N^2$)phenyl-κC]bis[2-(5-d3-methyl-2-pyridinyl-κ$N^2$)phenyl-κC]iridium (III) (abbreviation: [Ir5m(ppy-d3)$_2$(mdppy-d3)]), [2-d3-methyl-(2-pyridinyl-κN)benzofuro[2,3-b]pyridine-κC]bis [2-(2-pyridinyl-κN)phenyl-κC]iridium(III) (abbreviation: [Ir(ppy)$_2$(mbfpypy)]), and [2-(4-methyl-5-phenyl-2-pyridinyl-KM)phenyl-κC]bis[2-(2-pyridinyl-κN)phenyl-κC] iridium(III) (abbreviation: Ir(ppy)$_2$(mdppy)); and a rare earth metal complex such as tris(acetylacetonato) (monophenanthroline)terbium(III) (abbreviation: [Tb(acac)$_3$ (Phen)]). These are mainly compounds that exhibit green phosphorescence and have an emission peak in the wavelength range from 500 nm to 600 nm. Note that organometallic iridium complexes including a pyrimidine skeleton have distinctively high reliability or emission efficiency and thus are particularly preferable.

Note that any of the aforementioned red phosphorescent materials can also be used. Besides the above phosphorescent compounds, known phosphorescent compounds may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP), which are represented by the following structural formulae.

[Chemical Formula 35]

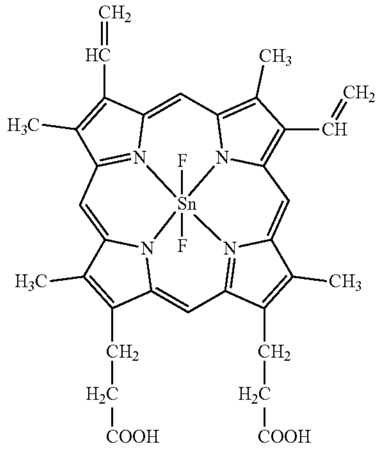

$SnF_2$(Proto IX)

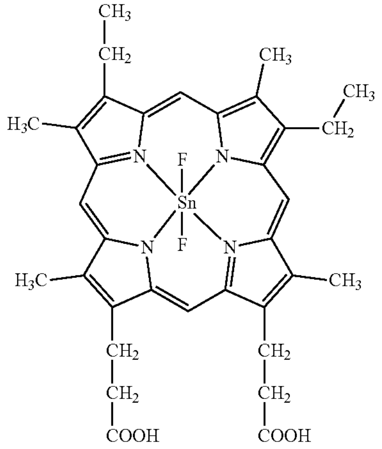

$SnF_2$(Meso IX)

-continued

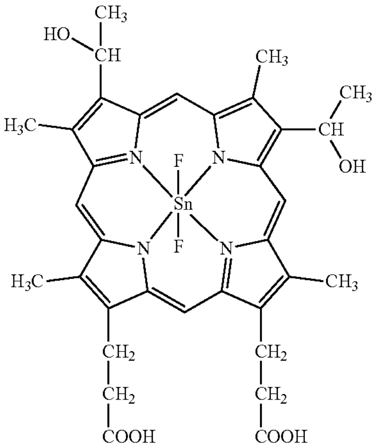

SnF2(Hemato IX)

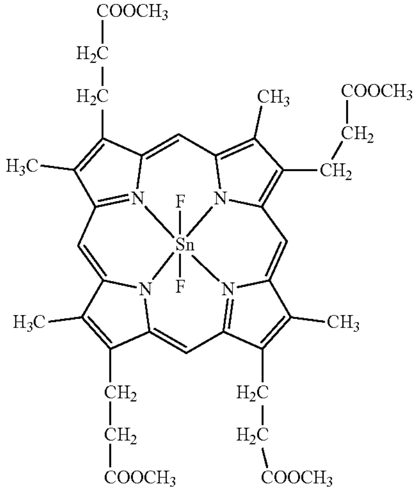

SnF2(Copro III-4Me)

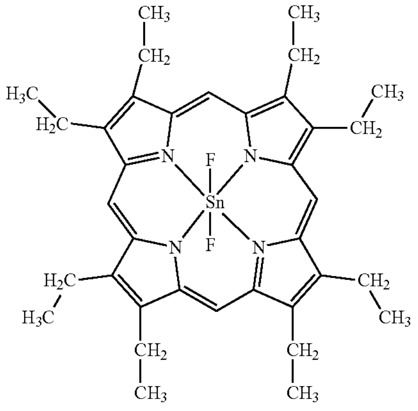

SnF2(OEP)

-continued

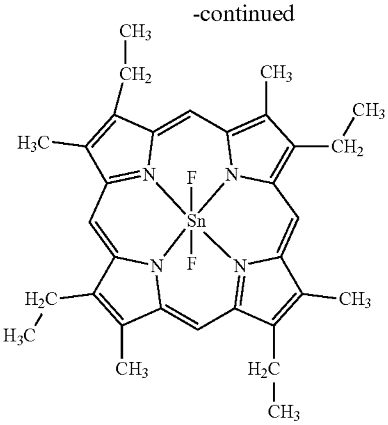

SnF2(Etio I)

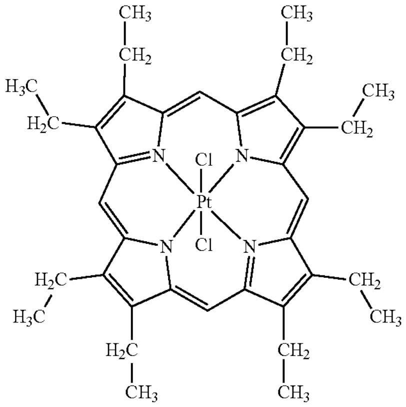

PtCl2OEP

It is also possible to use a heterocyclic compound including one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazole (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Such a heterocyclic compound is preferable because of its excellent electron-transport and hole-transport properties owing to a π-electron rich heteroaromatic ring and a π-electron deficient heteroaromatic ring. Among skeletons including the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons including the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a t-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring including a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 36]

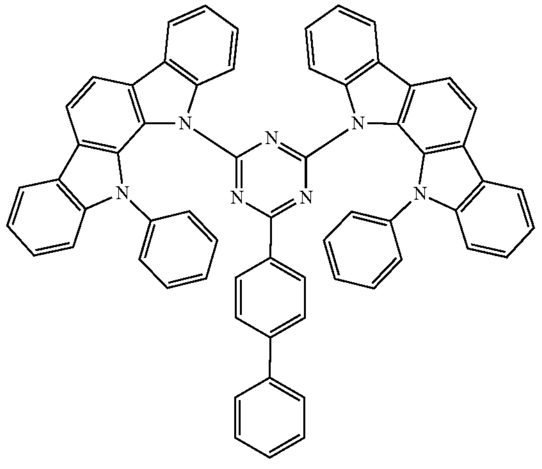

PIC-TRZ

-continued

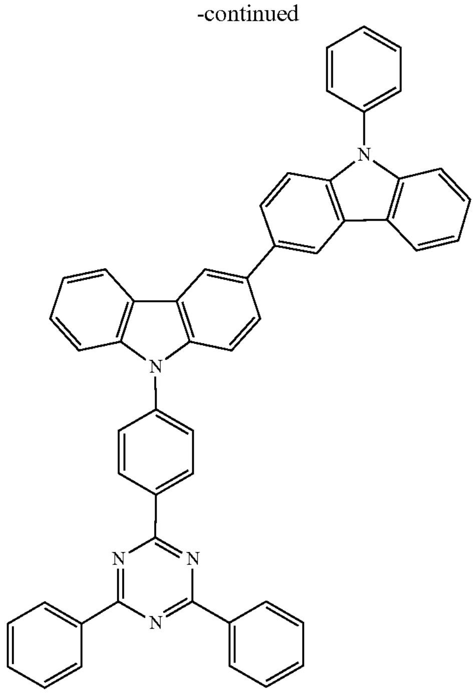

PCCzPTzn

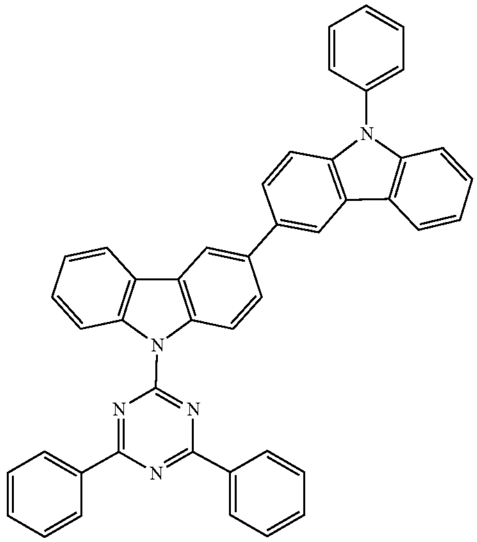

PCCzTzn

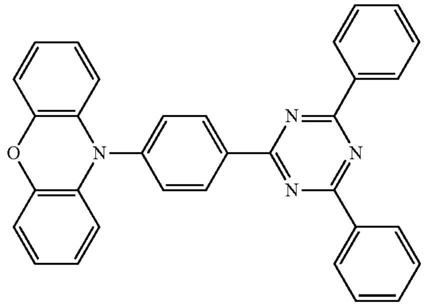

PXZ-TRZ

-continued

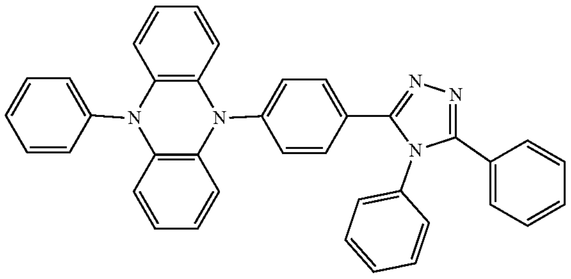

PPZ-3TPT

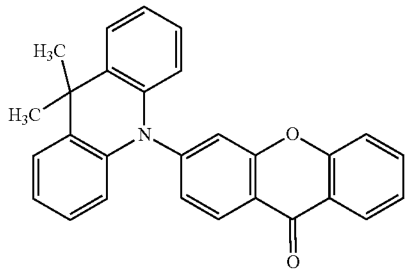

ACRXTN

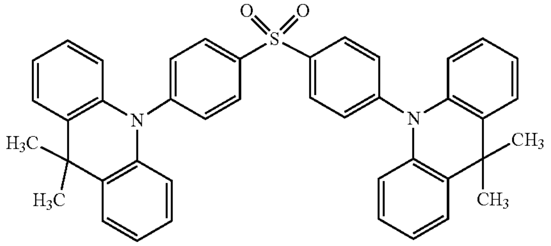

DMAC-DPS

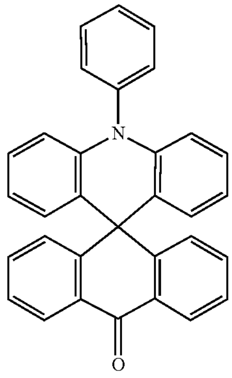

ACRSA

It is also possible to use a TADF material that enables reversible intersystem crossing at extremely high speed and emits light in accordance with a thermal equilibrium model between a singlet-excited state and a triplet-excited state. Since such a TADF material has an extremely short emission lifetime (excitation lifetime), an efficiency decrease of a light-emitting element in a high-luminance region can be inhibited. Specifically, a material having the following molecular structure can be used.

[Chemical Formula 37]

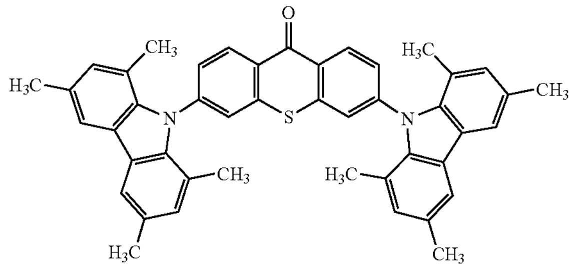

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

The electron-transport material used as the host material (corresponding to the first organic compound in one embodiment of the present invention) is preferably an organic compound represented by General Formula (G100); for example, metal complexes such as bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); or an organic compound including a π-electron deficient heteroaromatic ring can be used. Examples of the organic compound including a π-electron deficient heteroaromatic ring include organic compounds including a heteroaromatic ring having a polyazole skeleton, such as 2-(4-biphenylyl)-5-(4-tert-butyl-phenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(4-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); organic compounds including a heteroaromatic ring having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 2,4-bis[4-(1-naphthyl)phenyl]-6-[4-(3-pyridyl)phenyl]pyrimidine (abbreviation: 2,4NP-6PyPPm), 6-(1,1'-biphenyl-3-yl)-4-[3,5-bis(9H-carbazol-9-yl)phenyl)-2-phenylpyrimidine (abbreviation: 6mBP-4Cz2PPm), 4-[3,5-bis(9H-carbazol-9-yl)phenyl]-2-phenyl-6-(1,1'-biphenyl-4-yl)pyrimidine (abbreviation: 6BP-4Cz2PPm), and 7-[4-(9-phenyl-9H-carbazol-2-yl)quinazolin-2-yl]-7H-dibenzo[c,g]carbazole (abbreviation: PC-cgDBCzQz); organic compounds including a heteroaromatic ring having a pyridine skeleton, such as 3,5-bis[3-(9H-carbazol-9-yl)phenyl]pyridine (abbreviation: 35DCzPPy) and 1,3,5-tri[(3-pyridyl)-phenyl-3-yl]benzene (abbreviation: TmPyPB); and organic compounds including a heteroaromatic ring having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 3-[9-(4,6-diphenyl-1,3,5-triazin-2-yl)-2-dibenzofuranyl]-9-phenyl-9H-carbazole (abbreviation: PCDBfTzn), and 2-[1,1'-biphenyl]-3-yl-4-phenyl-6-(8-[1,1':4',1"-terphenyl]-4-yl-1-dibenzofuranyl)-1,3,5-triazine (abbreviation: mBP-TPDBfTzn). Among the above materials, the organic compound including a heteroaromatic ring having a diazine skeleton, the organic compound including a heteroaromatic ring having a pyridine skeleton, and the organic compound including a heteroaromatic ring having a triazine skeleton have high reliability and thus are preferable. In particular, the organic compound including a heteroaromatic ring having a diazine (pyrimidine or pyrazine) skeleton and the organic compound including a heteroaromatic ring having a triazine skeleton have a high electron-transport property to contribute to a reduction in driving voltage.

The hole-transport material used as the host material (corresponding to the second organic compound in one embodiment of the present invention) is preferably the organic compound represented by any of General Formulae (G200) to (G203), and an organic compound including an amine skeleton or a π-electron rich heteroaromatic ring can also be used. Examples of the organic compound including an amine skeleton or a π-electron rich heteroaromatic ring are a compound including an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound including a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound including a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound including a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, the compound including an aromatic amine skeleton or the compound including a carbazole skeleton is preferable because these compounds are highly reliable and have high hole-transport properties to contribute to a reduction in driving voltage. In addition, the organic compounds given as examples of the material having a hole-transport property that can be used for the hole-transport layer 112 can also be used as the hole-transport material that is the host material.

By mixing the electron-transport material with the hole-transport material, the transport property of the light-emitting layer 113 can be easily adjusted and a recombination region can be easily controlled. The TADF material can be used as the electron-transport material or the hole-transport material.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably include a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance including any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material including an anthracene skeleton is suitably used as the host material. The use of a substance including an anthracene skeleton as the host material for the fluorescent substance makes it possible to obtain a light-emitting layer with high emission efficiency and high durability. Among the substances including an anthracene skeleton, a substance including a diphenylanthracene skeleton, in particular, a substance including a 9,10-diphenylanthracene skeleton, is chemically stable and thus is preferably used as the host material. The host material preferably includes a carbazole skeleton because the hole-injection and hole-transport properties are improved; further preferably, the host material includes a benzocarbazole skeleton in which a benzene ring is further condensed to carbazole because the HOMO level thereof is shallower than that of carbazole by approximately 0.1 eV and thus holes enter the host material easily. In particular, the host material preferably includes a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that includes both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: αN-PNPAnth), 9-(1-naphthyl)-10-(2-naphthyl)anthracene (abbreviation: α,β-ADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: βN-mβNPAnth), and 1-[4-(10-[1,1'-biphenyl]-4-yl-9-anthracenyl)phenyl]-2-ethyl-1H-benzimidazole (abbreviation: EtBImPBPhA). In particular, CzPA, cgDBCzPA, 2mBnfPPA, and PCzPA have excellent characteristics and thus are preferably selected.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of the mixed materials. These mixed materials are preferably selected so as to form an exciplex that exhibits light emission whose wavelength overlaps with the wavelength on a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed by comparison of transient photoluminescence (PL) of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The hole-blocking layer 125 is in contact with the light-emitting layer 113, and is formed to contain the third organic compound having an electron-transport property and capable of blocking holes. As the third organic compound, a material having a high electron-transport property, a low hole-transport property, and a deep HOMO level is suitably used. Specifically, it is preferable to use a substance having a deeper HOMO level than the material contained in the light-emitting layer 113 by 0.5 eV or more and an electron-mobility higher than or equal to $1\times10^{-6}$ $cm^2/Vs$ when the square root of the electric field strength [V/cm] is 600. It is particularly preferable to use the organic compound represented by any of General Formulae (G300) to (G303) for higher heat resistance of the light-emitting device. In the case of using other materials, an organic compound having a deeper HOMO level than the material contained in the light-emitting layer 113 can be selected from materials that can be used for a hole-transport layer, which will be described later.

For the electron-transport layer 114, it is preferable to use a substance with an electron mobility higher than or equal to $1\times10^{-6}$ $cm^2/Vs$ when the square root of the electric field strength [V/cm] is 600. Note that any other substance can also be used as long as the substance has an electron-transport property higher than a hole-transport property. An organic compound including a π-electron deficient heteroaromatic ring is preferable as the above organic compound. The organic compound including a π-electron deficient heteroaromatic ring is preferably one or more of an organic compound including a heteroaromatic ring having a polyazole skeleton, an organic compound including a heteroaromatic ring having a pyridine skeleton, an organic compound including a heteroaromatic ring having a diazine skeleton, and an organic compound including a heteroaromatic ring having a triazine skeleton.

Specific examples of the organic compound including a π-electron deficient heteroaromatic ring that can be used for the above electron-transport layer include an organic compound including an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs); an organic compound including a heteroaromatic ring having a pyridine skeleton, such as 3,5-bis[3-(9H-carbazol-9-yl)phenyl]pyridine (abbreviation: 35DCzPPy) 1,3,5-tri[3-(3-pyridyl)phenyl]benzene (abbreviation: TmPyPB), 3,5-bis[3-(9H-carbazol-9-yl)phenyl]pyridine (abbreviation: 35DCzPPy), bathophenanthroline (abbreviation: BPhen), bathocuproine (abbreviation: BCP), or 2,9-di(naphthalen-2-yl)-4,7-diphenyl-1,10-phenanthroline (abbreviation: NBPhen); an organic compound including a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[(3'-dibenzothiophen-4-yl)biphenyl-3-yl]naphtho[1',2':4,5]furo[2,3-b]pyrazine (abbreviation: 9mDBtBPNfpr), 9-[3'-dibenzothiophen-4-yl)bipheny-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2':4,5]furo[3,2-d]pyrimidine (abbreviation: 8mDBtBPNfpm), 8-[(2,2'-binaphthalen)-6-yl)]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,4-bis[4-(1-naphthyl)phenyl]-6-[4-(3-pyridyl)phenyl]pyrimidine (abbreviation: 2,4NP-6PyPPm), 6-(1,1'-biphenyl-3-yl)-4-[3,5-bis(9H-carbazol-9-yl)phenyl)-2-phenylpyrimidine (abbreviation: 6mBP-4Cz2PPm), 4-[3,5-bis(9H-carbazol-9-yl)phenyl]-2-phenyl-6-(1,1'-biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazol (abbreviation: PC-cgDBCzQz); and an organic compound including atriazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation:

TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 5-[3-(4,6-diphenyl-1,3,5-triazine-2yl)pheny;]-7,7-dimethyl-5H,7H-indeno[2,1-b] carbazole (abbreviation: mINc(II)PTzn), 11-[4-(biphenyl-4-yl)-6-phenyl-1,3,5-triazin-2-yl]-11,12-dihydro-12-phenylindolo[2,3-a]carbazole (abbreviation: BP-Icz(II) Tzn), 5-[3-(4,6-diphenyl-1,3,5-triazine-2-yl)phenyl-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 3-[9-(4,6-diphenyl-1,3,5-triazin-2-yl)-2-dibenzofuranyl]-9-phenyl-9H-carbazole (abbreviation: PCDBfTzn), or 2-[1,1'-biphenyl]-3-yl-4-phenyl-6-(8-[1,1':4',1''-terphenyl]-4-yl-1-dibenzofuranyl)-1,3,5-triazine (abbreviation: mBP-TPDBfTzn). Among the above materials, the organic compound including a heteroaromatic ring having a diazine skeleton, the organic compound including a heteroaromatic ring having a pyridine skeleton, and the organic compound including a heteroaromatic ring having a triazine skeleton have high reliability and thus are preferable. In particular, the organic compound including a heteroaromatic ring having a diazine (pyrimidine and pyrazine) skeleton and the organic compound including a heteroaromatic ring having a triazine skeleton have a high electron-transport property to contribute to a reduction in driving voltage.

Note that the electron-transport layer 114 having this structure also serves as the electron-injection layer 115 in some cases.

A layer including an alkali metal, an alkaline earth metal, a compound thereof, or a complex thereof such as lithium fluoride (LiF), cesium fluoride (CsF), calcium fluoride ($CaF_2$), or 8-hydroxyquinolinato-lithium (Liq) is preferably provided as the electron-injection layer 115 between the electron-transport layer 114 and the cathode 102. Alternatively, a film formed by co-evaporation of ytterbium (Yb) and lithium is preferably provided. As the electron-injection layer 115, an electride or a layer that is formed using a substance having an electron-transport property and that includes an alkali metal, an alkaline earth metal, or a compound thereof may be used. Examples of the electride include a substance in which electrons are added at high concentration to calcium oxide-aluminum oxide.

Note that as the electron-injection layer 115, it is possible to use a layer containing a substance that has an electron-transport property (preferably an organic compound including a bipyridine skeleton) and contains a fluoride of the alkali metal or the alkaline earth metal at a concentration higher than that at which the electron-injection layer 115 becomes in a microcrystalline state (50 wt % or higher). Since the layer has a low refractive index, a light-emitting device including the layer can have high external quantum efficiency.

For the cathode 102, a metal, an alloy, an electrically conductive compound, or a mixture thereof each having a low work function (specifically, lower than or equal to 3.8 eV) or the like can be used. Specific examples of such a cathode material include elements belonging to Group 1 or 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, a variety of conductive materials such as Al, Ag, ITO, or indium oxide-tin oxide containing silicon or silicon oxide can be used for the cathode 102 regardless of the work function.

Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the anode 101 and the cathode 102 is not limited to the above-described structure. Preferably, alight-emitting region where holes and electrons recombine is positioned away from the anode 101 and the cathode 102 so as to inhibit quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting substance of the light-emitting layer or the light-emitting substance contained in the light-emitting layer.

Note that the structure described in this embodiment can be used in combination with any of the structures described in other embodiments as appropriate.

Embodiment 2

Figure 2A:
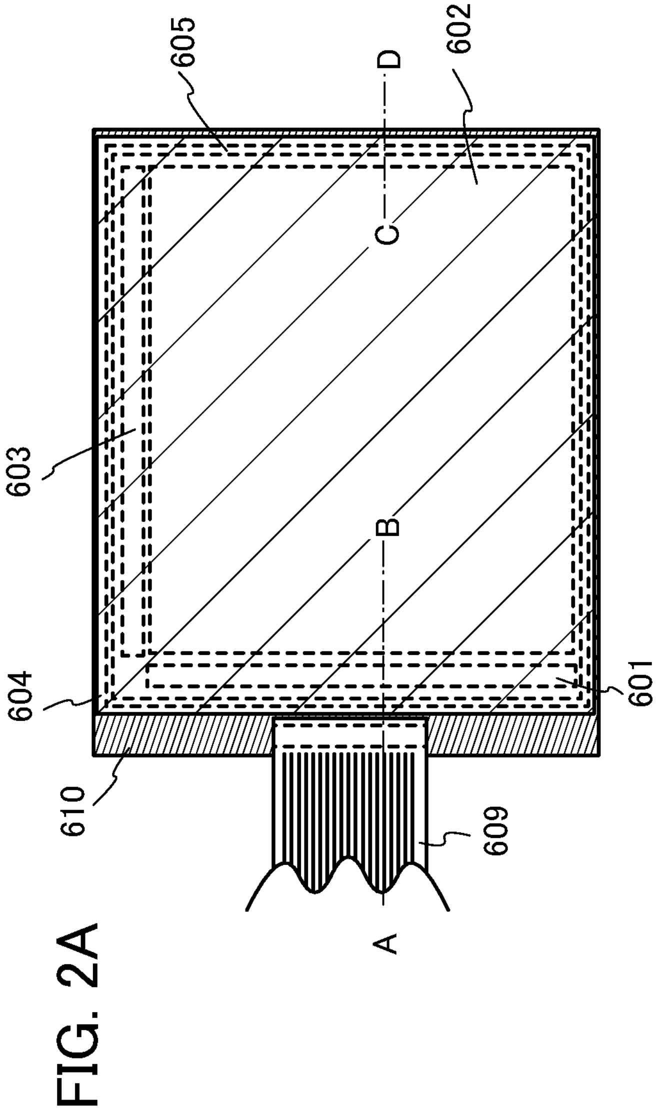
FIGS. 2A and 2B illustrate an active matrix light-emitting apparatus.
Figure 2B:
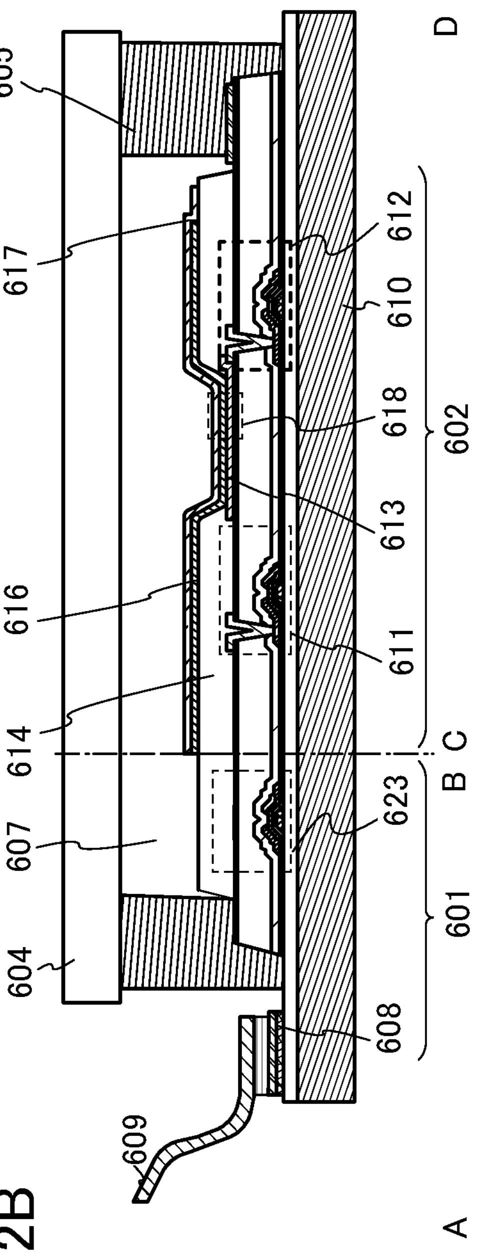

In this embodiment, a light-emitting apparatus manufactured using the light-emitting device described in Embodiment 1 is described with reference to FIGS. 2A and 2B. Note that FIG. 2A is a top view of the light-emitting apparatus and FIG. 2B is a cross-sectional view taken along the dashed-dotted lines A-B and C-D in FIG. 2A. This light-emitting apparatus includes a driver circuit portion (source line driver circuit) 601, a pixel portion 602, and a driver circuit portion (gate line driver circuit) 603, which are to control light emission of a light-emitting device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 2B. The driver circuit portions and the pixel portion are formed over an element substrate 610; here, the source line driver circuit 601, which is a driver circuit portion, and one pixel in the pixel portion 602 are illustrated.

The element substrate 610 may be a substrate containing glass, quartz, an organic resin, a metal, an alloy, a semiconductor, or the like or a plastic substrate formed of fiber reinforced plastic (FRP), poly(vinyl fluoride) (PVF), polyester, acrylic resin, or the like.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be inhibited.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is inhibited.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic appliance with extremely low power consumption can be obtained.

For stable characteristics of the transistor, a base film is preferably provided. The base film can be formed with a single layer or stacked layers using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. The driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the anode 613. Here, the insulator 614 can be formed using a positive photosensitive acrylic resin film.

In order to improve the coverage with an EL layer or the like that is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a cathode 617 are formed over the anode 613. A material having a high work function is preferably used as a material of the anode. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of any of these films and a film containing silver as its main component, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1.

As a material used for the cathode 617, which is formed over the EL layer 616, a material having a low work function (e.g., Al, Mg, Li, and Ca, or an alloy or a compound thereof, such as MgAg, MgIn, and AlLi) is preferably used. In the case where light generated in the EL layer 616 passes through the cathode 617, a stack of a thin metal or alloy film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiment 1. In the light-emitting apparatus of this embodiment, the pixel portion, which includes a plurality of light-emitting devices, may include both the light-emitting device described in Embodiment 1 and a light-emitting device having a different structure. In that case, in the light-emitting apparatus of one embodiment of the present invention, a common hole-transport layer can be used for light-emitting devices that emit light with different wavelengths, allowing the light-emitting apparatus to be manufactured in a simple process at low costs.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be inhibited.

An epoxy-based resin or glass frit is preferably used for the sealing material 605. It is preferable that such a material transmit moisture and oxygen as little as possible. As the sealing substrate 604, a glass substrate, a quartz substrate, or a plastic substrate formed of fiber reinforced plastic (FRP), poly(vinyl fluoride) (PVF), polyester, acrylic resin, or the like can be used.

Although not illustrated in FIGS. 2A and 2B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively inhibited.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks and pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape and upper, side, and lower surfaces of a touch panel.

As described above, the light-emitting apparatus manufactured using the light-emitting device described in Embodiment 1 can be obtained.

The light-emitting apparatus in this embodiment is manufactured using the light-emitting device described in Embodiment 1 and thus can have favorable characteristics. Specifically, since the light-emitting device described in Embodiment 1 has favorable heat resistance, the light-emitting apparatus can have high reliability. In addition, the display apparatus can have favorable display quality.

Figure 3A:
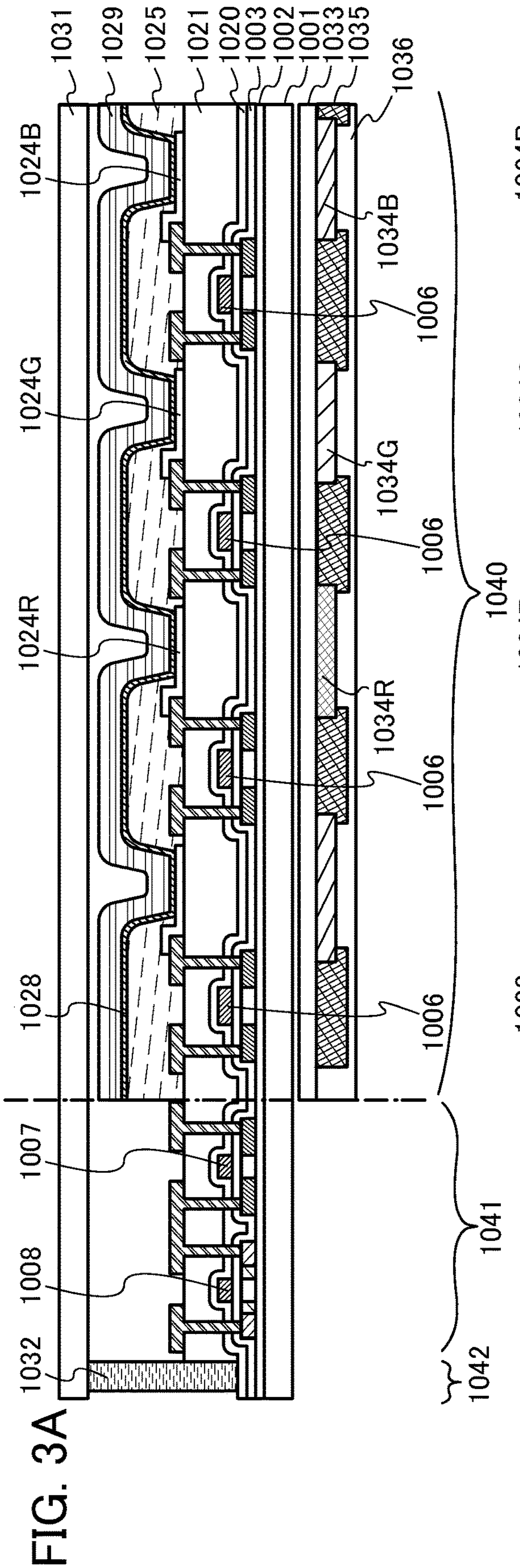
FIGS. 3A and 3B each illustrate an active matrix light-emitting apparatus.
Figure 3B:
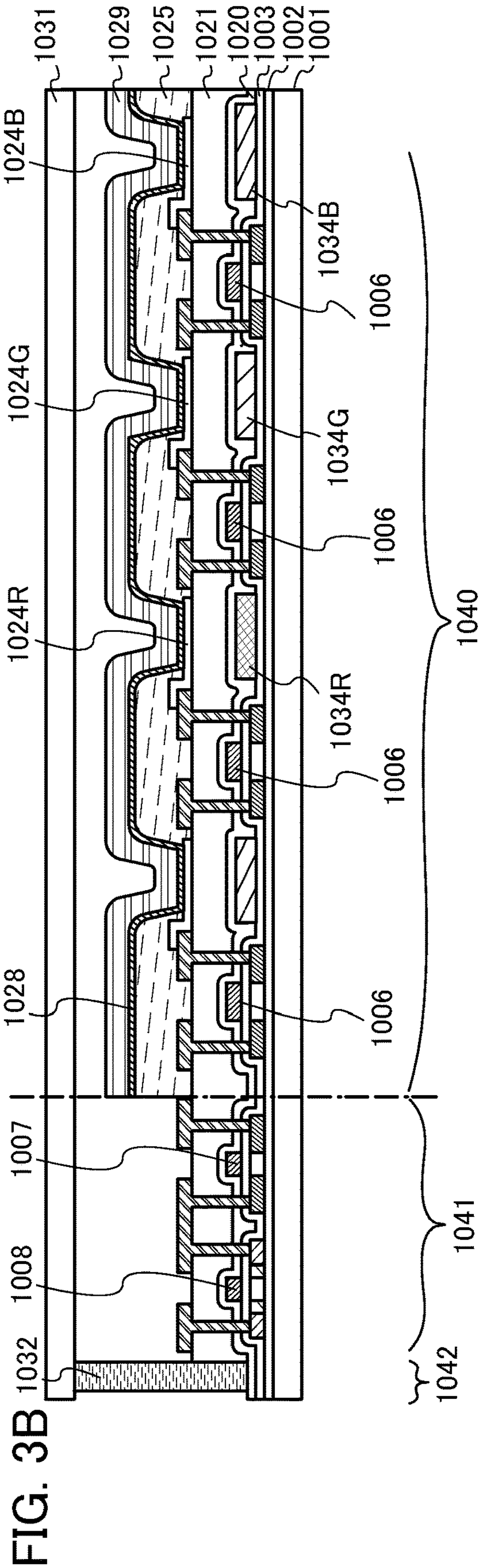

FIGS. 3A and 3B each illustrate an example of a light-emitting apparatus that includes coloring layers (color filters) and the like to improve color purity. FIG. 3A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024R, 1024G, and 1024B of light-emitting devices, a partition 1025, an EL layer 1028, a cathode 1029 of the light-emitting devices, a sealing substrate 1031, a sealing material 1032, and the like.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
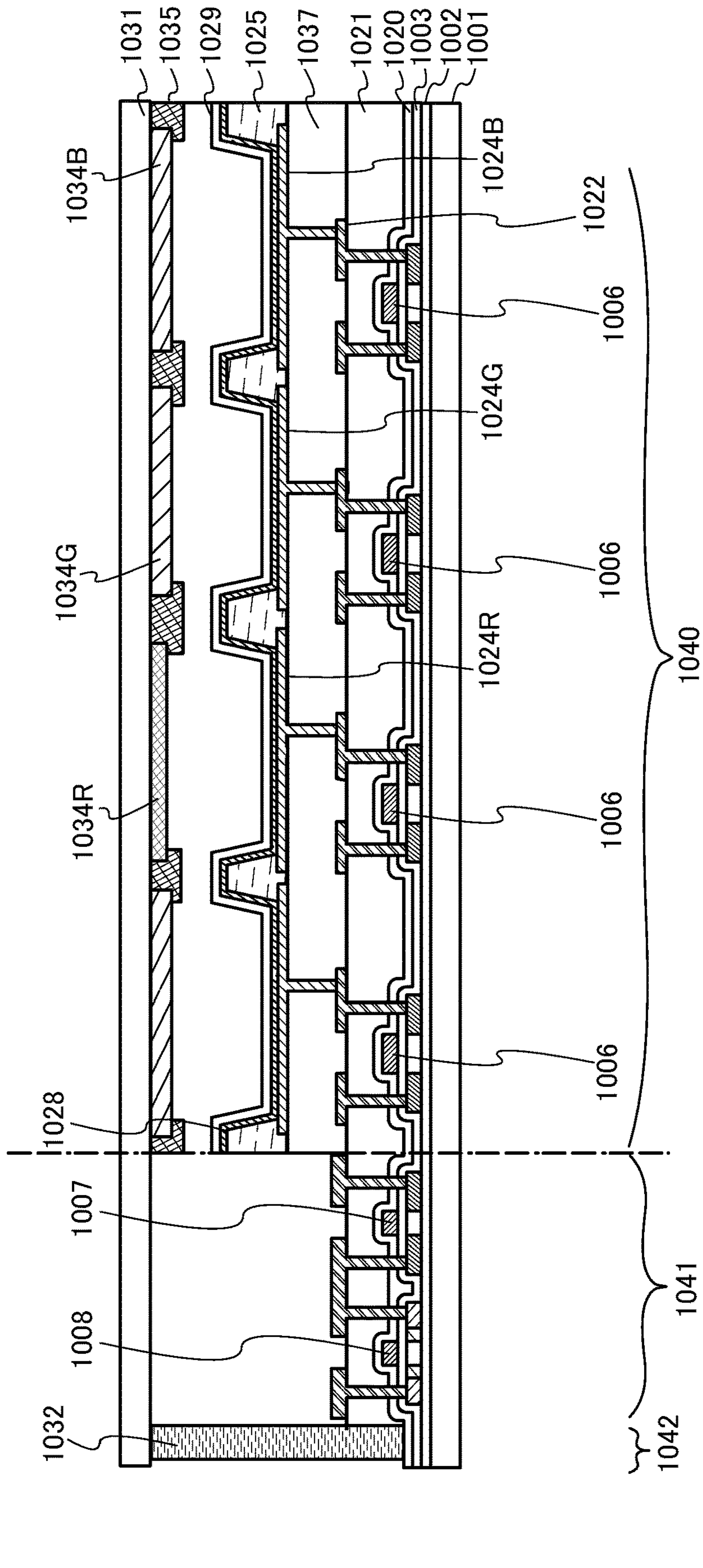
FIG. 4 illustrates an active matrix light-emitting apparatus.

The above-described light-emitting apparatus has a structure in which light is extracted to the substrate 1001 side where FETs are formed (a bottom emission structure), but may have a structure in which light is extracted to the sealing substrate 1031 side (a top emission structure). FIG. 4 is a cross-sectional view of a light-emitting apparatus having atop emission structure. In this case, a substrate that does not transmit light can be used as the substrate 1001. The process up to the step of forming a connection electrode that connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, and can alternatively be formed using any of other known materials.

The anodes 1024R, 1024G, and 1024B of the light-emitting devices each serve as an anode here, but may serve as a cathode. Furthermore, in the case of a light-emitting apparatus having a top emission structure as illustrated in FIG. 4, the anodes are preferably reflective electrodes. The EL layer 1028 is formed to have a structure similar to the structure of the EL layer 103 described in Embodiment 1.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is positioned between pixels. The coloring layers (the red coloring layer 1034R, the green coloring layer 1034G, and the blue coloring layer 1034B) and the black matrix 1035 may be covered with the overcoat layer (not illustrated). Note that a light-transmitting substrate is used as the sealing substrate 1031.

In the light-emitting apparatus having a top emission structure, a microcavity structure can be favorably employed. A light-emitting device with a microcavity structure is formed with the use of an electrode including a reflective electrode as one of the electrodes and a transflective electrode as the other electrode. At least an EL layer is positioned between the reflective electrode and the transflective electrode, and the EL layer includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the light-emitting device, by changing thicknesses of the transparent conductive film, the composite material, the carrier-transport material, and the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or more and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided with a charge-generation layer provided therebetween, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the light-emitting device described in Embodiment 1 and thus can have favorable characteristics. Specifically, since the light-emitting device described in Embodiment 1 has favorable heat resistance, the light-emitting apparatus can have favorable reliability. In addition, the display apparatus can have favorable display quality.

Figure 5A:
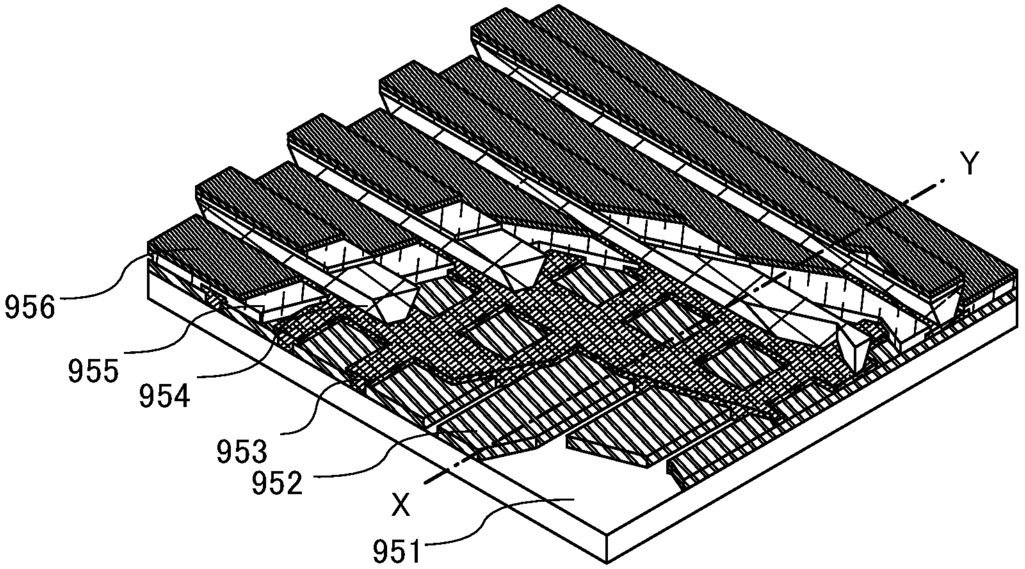
FIGS. 5A and 5B illustrate a passive matrix light-emitting apparatus.
Figure 5B:
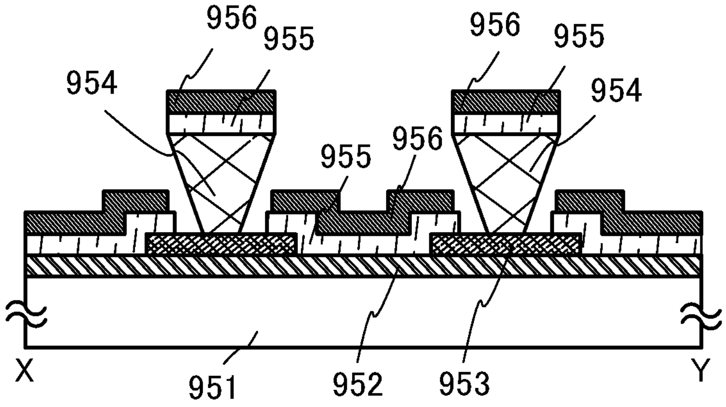

The active matrix light-emitting apparatus is described above, whereas a passive matrix light-emitting apparatus is described below. FIGS. 5A and 5B illustrate a passive matrix light-emitting apparatus manufactured using the present invention. Note that FIG. 5A is a perspective view of the light-emitting apparatus, and FIG. 5B is a cross-sectional view taken along the dashed-dotted line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 thus provided can prevent defects in the light-emitting device due to static electricity or the like. The passive matrix light-emitting apparatus also includes the light-emitting device described in Embodiment 1; thus, the light-emitting apparatus can have favorable reliability or low power consumption.

In the light-emitting apparatus described above, many minute light-emitting devices arranged in a matrix can each be controlled; thus, the light-emitting apparatus can be suitably used as a display apparatus for displaying images.

This embodiment can be freely combined with any of the other embodiments.

Embodiment 3

[Light-Emitting Apparatus]

Another example of the light-emitting apparatus of one embodiment of the present invention using the light-emitting device described in Embodiment 1 and a manufacturing method thereof are described below.

Figure 6A:
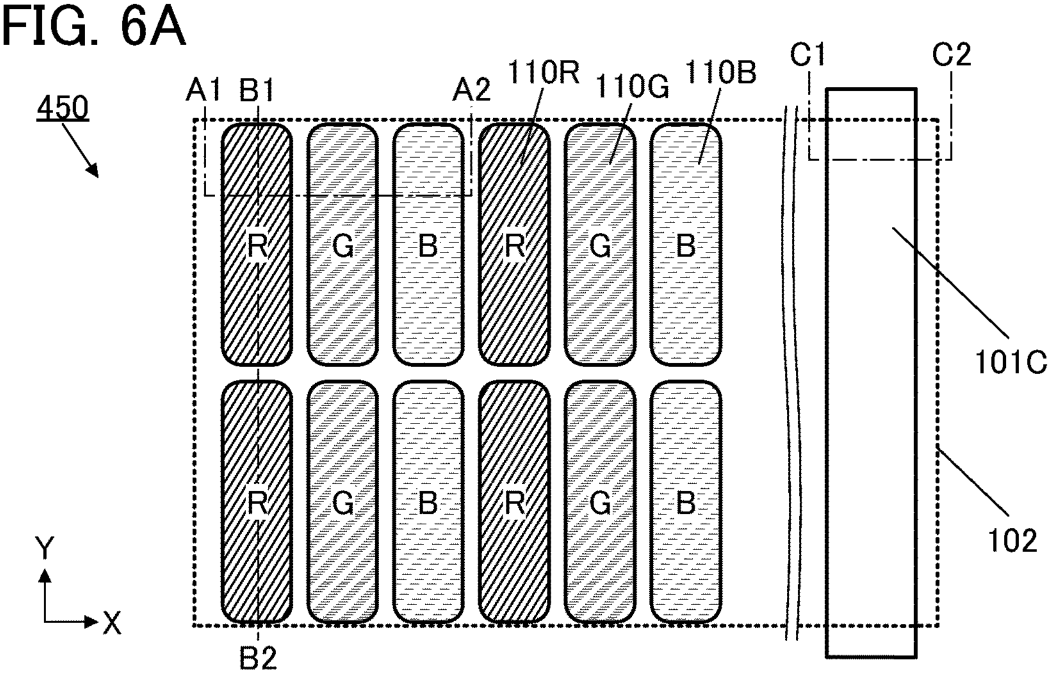
FIGS. 6A to 6D each illustrate a structure example of a display apparatus.

FIG. 6A is a schematic top view of a light-emitting apparatus 450 of one embodiment of the present invention. The light-emitting apparatus 450 includes a plurality of light-emitting devices 110R emitting red light, a plurality of light-emitting devices 110G emitting green light, and a plurality of light-emitting devices 110B emitting blue light. In FIG. 6A, light-emitting regions of the light-emitting devices are denoted by R, G, and B to easily differentiate the light-emitting devices.

The light-emitting devices 110R, the light-emitting devices 110G, and the light-emitting devices 110B are arranged in a matrix. FIG. 6A illustrates what is called a stripe arrangement, in which the light-emitting devices of the same color are arranged in one direction. Note that the arrangement of the light-emitting devices is not limited thereto; another arrangement such as a delta, zigzag, or PenTile pattern may also be used.

The light-emitting device 110R, the light-emitting device 110G, and the light-emitting device 110B are arranged in the X direction. The light-emitting devices of the same color are arranged in the Y direction intersecting with the X direction.

The light-emitting device 110R, the light-emitting device 110G, and the light-emitting device 110B have the above structure.

Figure 6B:
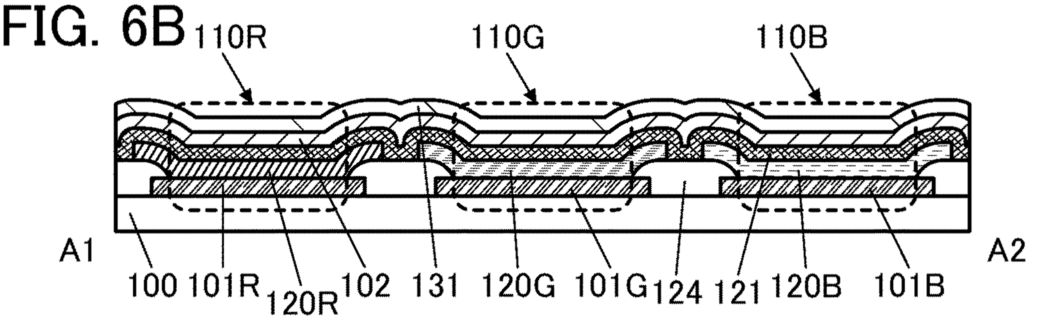
Figure 6C:
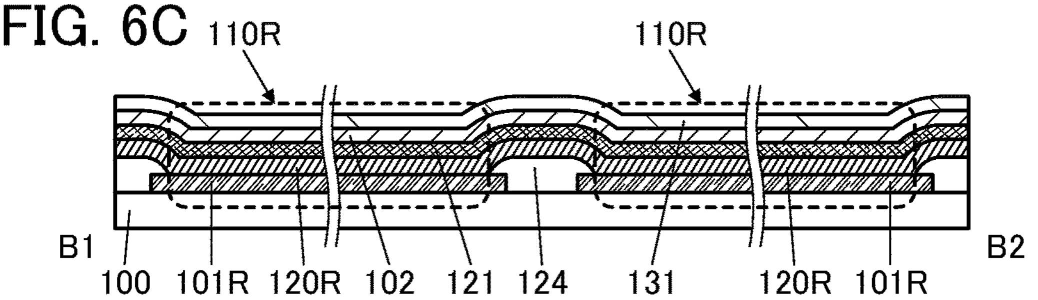

FIG. 6B is a cross-sectional schematic view taken along the dashed-dotted line A1-A2 in FIG. 6A, and FIG. 6C is a cross-sectional schematic view taken along the dashed-dotted line B1-B2 in FIG. 6A.

FIG. 6B illustrates cross sections of the light-emitting device 110R, the light-emitting device 110G, and the light-emitting device 110B. The light-emitting device 110R includes an anode 101R, an EL layer 120R, an EL layer 121, and the cathode 102. The light-emitting device 110G includes an anode 101G, an EL layer 120G, the EL layer (electron-injection layer) 121, and the cathode 102. The light-emitting device 110B includes an anode 101B, an EL layer 120B, the EL layer 121, and the cathode 102. The EL layer 121 and the cathode 102 are provided in common to the light-emitting device 110R, the light-emitting device 110G, and the light-emitting device 110B. The EL layer 121 can also be referred to as a common layer.

The EL layer 120R included in the light-emitting device 110R contains a light-emitting organic compound that emits light with intensity at least in a red wavelength range. The EL layer 120G included in the light-emitting device 110G contains a light-emitting organic compound that emits light with intensity at least in a green wavelength range. The EL layer 120B included in the light-emitting device 110B contains a light-emitting organic compound that emits light with intensity at least in a blue wavelength range. Among the light-emitting device 110R, the light-emitting device 110G, and the light-emitting device 110B, at least the light-emitting device 110R is the light-emitting device of one embodiment of the present invention.

Each of the EL layer 120R, the EL layer 120G, and the EL layer 120B includes at least a light-emitting layer, and may further include one or more of a hole-blocking layer, an electron-injection layer, an electron-transport layer, a hole-transport layer, a hole-injection layer, an electron-blocking layer, an exciton-blocking layer, and the like. Note that the hole-blocking layer is preferably included. The EL layer 121 does not include the light-emitting layer. The EL layer 121 is preferably the electron-injection layer. In the case where the cathode-side surfaces of the EL layer 120R, the EL layer 120G, and the EL layer 120B also function as electron-injection layers, the EL layer 121 is not necessarily provided.

The anode 101R, the anode 101G, and the anode 101B are provided for the respective light-emitting devices. The cathode 102 and the EL layer 121 are each preferably provided as a layer common to the light-emitting devices. The hole-transport layers in the EL layers 120, which are separated between the light-emitting devices with different emission colors, preferably have the same structure.

A conductive film that transmits visible light is used for either the anode 101 or the cathode 102, and a reflective conductive film is used for the other. When the anodes 101 are light-transmitting electrodes and the cathode 102 is a reflective electrode, a bottom-emission display apparatus can be obtained. When the anodes 101 are reflective electrodes and the cathode 102 is a light-transmitting electrode, a top-emission display apparatus can be obtained. Note that when both the anodes 101 and the cathode 102 transmit light, a dual-emission display apparatus can be obtained. The light-emitting device of one embodiment of the present invention is suitable for a top-emission light-emitting device.

Insulating layers 124 are provided to cover end portions of the anode 101R, the anode 101G, and the anode 101B. The end portions of the insulating layer 124 are preferably tapered. Note that the insulating layer 124 is not necessarily provided.

The EL layer 120R, the EL layer 120G, and the EL layer 120B each include a region in contact with a top surface of the pixel electrode (the corresponding one of the anode 101R, the anode 101G, and the anode 101B) and a region in contact with a surface of the insulating layer 124. End portions of the EL layer 120R, the EL layer 120G, and the EL layer 120B are positioned over the insulating layer 124.

Figure 17:
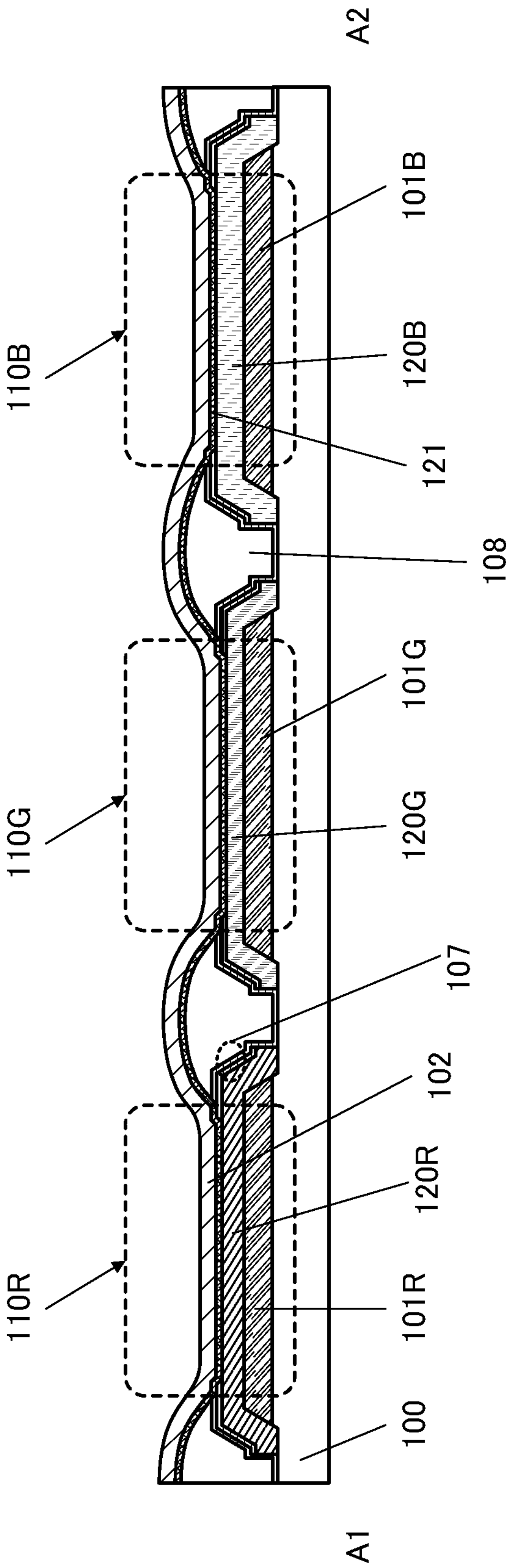
FIG. 17 illustrates a structure example of a display apparatus.

FIG. 17 is a variation example of FIG. 6B. In FIG. 17, end portions of the anode 101R, the anode 101G, and the anode 101B each have a tapered shape that gradually becomes wider towards the substrate, which improves the coverage with a film to be formed thereover. In addition, the end portions of the anode 101R, the anode 101G, and the anode 101B are covered with the EL layer 120R, the EL layer 120G, and the EL layer 120B, respectively. Mask layers 107 are formed to cover the EL layers. This inhibits the EL layers from being damaged at the time of etching by a photolithography method. Insulating layers 108 are provided between the light-emitting device 110R, the light-emitting device 110G, and the light-emitting device 110B. The end portion of the insulating layer 108 has a gentle tapered shape, which can inhibit disconnection of the EL layer 121 and the cathode 102 that are to be formed later.

As illustrated in FIGS. 6B and 17, there is a gap between the EL layers of two light-emitting devices with different colors. The EL layer 120R, the EL layer 120G, and the EL layer 120B are thus preferably provided so as not to be in contact with each other. This effectively prevents unintentional light emission from being caused by current flowing through two adjacent EL layers. As a result, the contrast can be increased to achieve a display apparatus with high display quality. A distance between facing end portions of EL layers of adjacent light-emitting devices (e.g., the light-emitting device 110R and the light-emitting device 110G) can be set greater than or equal to 2 μm and less than or equal to 5 μm by manufacturing the light-emitting devices by a photolithography method. Note that the distance can also be referred to as a distance between the light-emitting layers included in the EL layers. It is difficult to set the distance less than 10 m by a manufacturing method using a metal mask.

As described above, manufacturing the light-emitting apparatus by a photolithography method can greatly reduce a non-light-emitting area between two adjacent light-emitting devices, thereby significantly increasing the aperture ratio. For example, the display apparatus of one embodiment of the present invention can achieve an aperture ratio higher than or equal to 40%, higher than or equal to 50%, higher than or equal to 60%, higher than or equal to 70%, higher than or equal to 80%, or higher than or equal to 90%; that is, an aperture ratio lower than 100%.

Increasing the aperture ratio of the display apparatus can improve the reliability of the display apparatus. Specifically, with reference to the lifetime of a display apparatus including an organic EL device and having an aperture ratio of 10%, a display apparatus having an aperture ratio of 20% (that is, having an aperture ratio two times higher than the reference) has a lifetime 3.25 times longer than the reference, and a display apparatus having an aperture ratio of 40% (that is, having an aperture ratio four times higher than the reference) has a lifetime 10.6 times longer than the reference. Thus, the density of current flowing to the organic EL device can be reduced with increasing aperture ratio, and accordingly the lifetime of the display apparatus can be increased. The display apparatus of one embodiment of the present invention can have a higher aperture ratio and thus can have higher display quality. Furthermore, the display apparatus of one embodiment of the present invention has excellent effect that the reliability (especially the lifetime) can be significantly improved with increasing aperture ratio.

FIG. 6C illustrates an example in which the EL layer 120R is formed in a band shape so as to be continuous in the Y direction. When the EL layer 120R and the like are formed in a band shape, no space for dividing the layer is needed and thus a non-light-emitting area between the light-emitting devices is reduced, resulting in a higher aperture ratio. FIG. 6C illustrates the cross section of the light-emitting device 110R as an example; the light-emitting device 110G and the light-emitting device 110B can have a similar shape. Note that the EL layer may be divided for the light-emitting devices in the Y direction.

A protective layer 131 is provided over the cathode 102 so as to cover the light-emitting device 110R, the light-emitting device 110G, and the light-emitting device 110B. The protective layer 131 has a function of preventing diffusion of impurities such as water into the light-emitting devices from the above.

The protective layer 131 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 131.

As the protective layer 131, a stacked film of an inorganic insulating film and an organic insulating film can be used. For example, a structure in which an organic insulating film is interposed between a pair of inorganic insulating films is preferable. Furthermore, it is preferable that the organic insulating film function as a planarization film. With this structure, the top surface of the organic insulating film can be flat, and accordingly, coverage with the inorganic insulating film over the organic insulating film is improved, leading to an improvement in barrier properties. Moreover, since the top surface of the protective layer 131 is flat, a preferable effect can be obtained; when a component (e.g., a color filter, an electrode of a touch sensor, a lens array, or the like) is provided above the protective layer 131, the component is less affected by an uneven shape caused by the lower structure.

In FIG. 6A, a connection electrode 101C electrically connected to the cathode 102 is illustrated. The connection electrode 101C is supplied with a potential (e.g., an anode potential or a cathode potential) that is to be supplied to the cathode 102. The connection electrode 101C is provided outside a display region where the light-emitting devices 110R and the like are arranged. In FIG. 6A, the cathode 102 is denoted by a dashed line.

The connection electrode 101C can be provided along the outer periphery of the display region. For example, the connection electrode 101C may be provided along one side of the outer periphery of the display region or two or more sides of the outer periphery of the display region. That is, in the case where the display region has a rectangular top surface, the top surface of the connection electrode 101C can have a band shape, an L shape, a square bracket shape, a quadrangular shape, or the like.

Figure 6D:
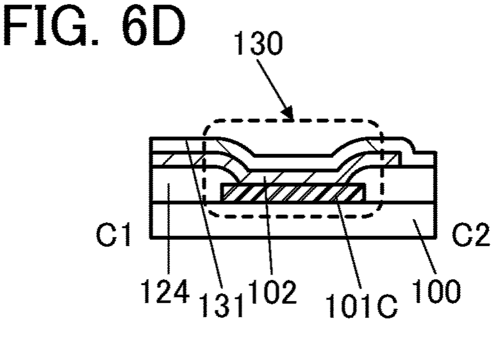

FIG. 6D is a cross-sectional schematic view taken along the dashed-dotted line C1-C2 in FIG. 6A. FIG. 6D illustrates a connection portion 130 at which the connection electrode 101C is electrically connected to the cathode 102. In the connection portion 130, the cathode 102 is provided on and in contact with the connection electrode 101C and the protective layer 131 is provided to cover the cathode 102. In addition, the insulating layer 124 is provided to cover end portions of the connection electrode 101C.

Manufacturing Method Example 1

Figure 7A:
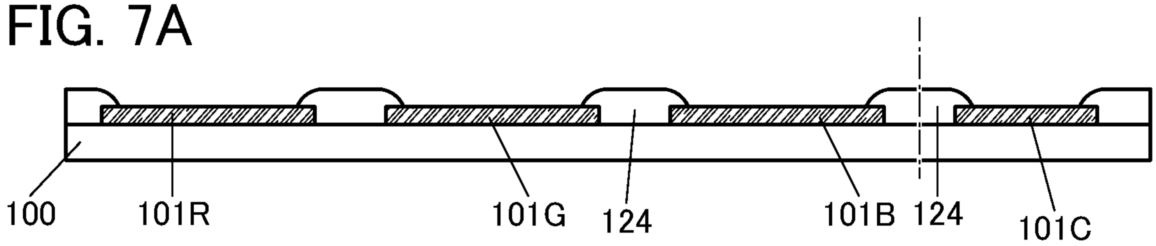
FIGS. 7A to 7F illustrate a manufacturing method example of a display apparatus.

An example of a method for manufacturing the display apparatus of one embodiment of the present invention will be described below with reference to drawings. Here, description is made with use of the light-emitting apparatus 450 shown in the above structure example. FIGS. 7A to 7F and FIGS. 8A to 8F are cross-sectional schematic views of steps in a manufacturing method of a display apparatus described below. In FIG. 7A and the like, the cross-sectional schematic views of the connection portion 130 and the periphery thereof are also illustrated on the right side.

Note that thin films included in the display apparatus (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

Alternatively, thin films included in the display apparatus (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Thin films included in the display apparatus can be processed by a photolithography method or the like. Besides, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

[Preparation for Substrate 100]

A substrate that has heat resistance high enough to withstand at least heat treatment performed later can be used as the substrate 100. When an insulating substrate is used as the substrate 100, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 100, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Anodes 101R, 101G, and 101B, and Connection Electrode 101C]

Next, the anodes 101R, 101G, and 101B, and the connection electrode 101C are formed over the substrate 100. First, a conductive film to be an anode (a pixel electrode) is formed, a resist mask is formed by a photolithography method, and an unnecessary portion of the conductive film is removed by etching. After that, the resist mask is removed to form the anodes 101R, 101G, and 101B.

In the case where a conductive film that reflects visible light is used as each pixel electrode, it is preferable to use a material (e.g., silver or aluminum) having as high reflectance as possible in the whole wavelength range of visible light. This can increase both light extraction efficiency of the light-emitting devices and color reproducibility. In the case where a conductive film that reflects visible light is used as each pixel electrode, what is called a top-emission light-emitting apparatus in which light is extracted in the direction opposite to the substrate can be obtained. In the case where a conductive film that transmits light is used as each pixel electrode, what is called a bottom-emission light-emitting apparatus in which light is extracted in the direction of the substrate can be obtained.

[Formation of Insulating Layer 124]

Then, the insulating layer 124 is provided to cover end portions of the anode 101R, the anode 101G, and the anode 101B (FIG. 7A). An organic insulating film or an inorganic insulating film can be used as the insulating layer 124. The end portions of the insulating layer 124 are preferably tapered to improve step coverage with an EL film to be formed later. In particular, when an organic insulating film is used, a photosensitive material is preferably used so that the shape of the end portions can be easily controlled by the conditions of light exposure and development. In the case where the insulating layer 124 is not provided, the distance between the light-emitting devices can be further reduced to offer a light-emitting apparatus with a higher resolution.

[Formation of EL Film 120Rb]

Subsequently, an EL film 120Rb, which is to be the EL layer 120R, is formed over the anode 101R, the anode 101G, the anode 101B, and the insulating layer 124.

The EL film 120Rb includes at least a light-emitting layer containing a light-emitting substance and a hole-transport layer. The EL layer 120Rb may have a structure in which one or more films functioning as an electron-injection layer, an electron-transport layer, a charge-generation layer, and a hole-injection layer are further stacked. The EL film 120Rb can be formed by, for example, an evaporation method, a sputtering method, an inkjet method, or the like. Without limitation to this, the above-described film formation method can be used as appropriate.

For example, the EL film 120Rb is preferably a stacked film in which a hole-injection layer, a hole-transport layer, a light-emitting layer, and an electron-transport layer are stacked in this order. In that case, a film including the electron-injection layer can be used as the EL layer 121 formed later. In the light-emitting apparatus of one embodiment of the present invention, the electron-transport layer is provided to cover the light-emitting layer, which can inhibit the light-emitting layer from being damaged by a subsequent photolithography step or the like, so that a highly reliable light-emitting device can be manufactured.

The EL film 120Rb is preferably formed so as not to overlap with the connection electrode 101C. For example, in the case where the EL film 120Rb is formed by an evaporation method (or a sputtering method), it is preferable that the EL film 120Rb be formed using a shielding mask so as not to be formed over the connection electrode 101C, or the EL film 120Rb be removed in a later etching step.

[Formation of Mask Film 144*a*]

Then, a mask film 144*a* is formed to cover the EL film 120Rb. The mask film 144*a* is provided in contact with a top surface of the connection electrode 101C.

As the mask film 144*a*, it is possible to use a film highly resistant to etching treatment performed on various EL films such as the EL film 120Rb, i.e., a film having high etching selectivity with respect to the EL film. Furthermore, as the mask film 144*a*, it is possible to use a film having high etching selectivity with respect to a protective film such as a protective film 146*a* described later. Moreover, as the mask film 144*a*, it is possible to use a film that can be removed by a wet etching method, which is less likely to cause damage to the EL film.

The mask film 144*a* can be formed using an inorganic film such as a metal film, an alloy film, a metal oxide film, a semiconductor film, or an inorganic insulating film, for example. The mask film 144*a* can be formed by any of a variety of film formation methods such as a sputtering method, an evaporation method, a CVD method, and an ALD method.

The mask film 144*a* can be formed using a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material. It is particularly preferable to use a low-melting-point material such as aluminum or silver.

Alternatively, the mask film 144*a* can be formed using a metal oxide such as an indium-gallium-zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

Alternatively, the mask film 144*a* can be formed using an inorganic insulating material such as aluminum oxide, hafnium oxide, or silicon oxide. In particular, aluminum oxide is preferably used.

The mask film 144*a* is preferably formed using a material that can be dissolved in a solvent chemically stable with respect to at least the uppermost film of the EL film 120Rb. Specifically, a material that will be dissolved in water or alcohol can be suitably used for the mask film 144*a*. In formation of the mask film 144*a*, it is preferable that application of such a material dissolved in a solvent such as water or alcohol be performed by a wet process and followed by heat treatment for evaporating the solvent. At this time, the heat treatment is preferably performed under a reduced-pressure atmosphere, in which case the solvent can be removed at a low temperature in a short time and thermal damage to the EL film 120Rb can be accordingly minimized.

The mask film 144*a* can be formed by spin coating, dipping, spray coating, ink-jetting, dispensing, screen printing, or offset printing, or with a doctor knife, a slit coater, a roll coater, a curtain coater, or a knife coater, for example.

The mask film 144*a* can be formed using an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin.

Here, a film formed by an ALD method is a dense film and has high capability of protecting the EL layers, and thus can be used as a mask film suitably. In particular, an aluminum oxide film is preferably used. However, when a metal oxide film is formed by an ALD method, sometimes heating is needed to form a favorable mask film. Since the mask film 144*a* is formed directly over the EL layer 120, significant heating stress is applied on the EL layer 120. However, the light-emitting apparatus of one embodiment of the present invention can have favorable characteristics by using the light-emitting device having the structure described in Embodiment 1, which can withstand such heating stress.

[Formation of Protective Film 146*a*]

Figure 7B:
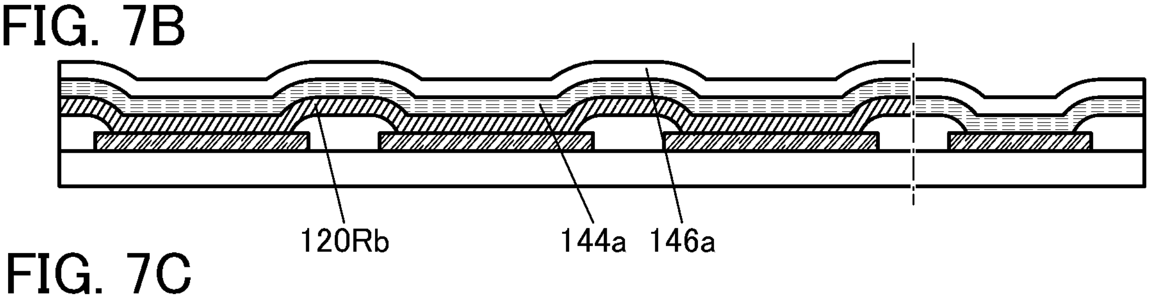

Next, a protective film 146*a* is formed over the mask film 144*a* (FIG. 7B).

The protective film 146*a* is a film used as a hard mask when the mask film 144*a* is etched later. In a later step of processing the protective film 146*a*, the mask film 144*a* is exposed. Thus, the combination of films having high etching selectivity therebetween is selected for the mask film 144*a* and the protective film 146*a*. It is thus possible to select a film that can be used as the protective film 146*a* depending on an etching condition of the mask film 144*a* and an etching condition of the protective film 146*a*.

For example, in the case where dry etching using a gas containing fluorine (also referred to as a fluorine-based gas) is performed for the etching of the protective film 146*a*, the protective film 146*a* can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film using IGZO, ITO, or the like is given as a film having high etching selectivity (that is, enabling low etching rate) in dry etching using the fluorine-based gas, and such a film can be used as the mask film 144*a*.

Without being limited to the above, a material of the protective film 146*a* can be selected from a variety of materials depending on etching conditions of the mask film 144*a* and the protective film 146*a*. For example, any of the films that can be used as the mask film 144*a* can be used.

As the protective film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the protective film 146*a*, an oxide film can also be used. Typically, it is possible to use a film of an oxide or an oxynitride such as silicon oxide, silicon oxynitride, aluminum oxide, aluminum oxynitride, hafnium oxide, or hafnium oxynitride.

Alternatively, as the protective film 146*a*, an organic film that can be used as the EL film 120Rb or the like can be used. For example, the protective film 146*a* can be formed using the organic film that is used as the EL film 120Rb, an EL film 120Gb, or an EL film 120Bb. Use of such an organic film is preferable because the same film-formation apparatus can be used for formation of the EL film 120Rb or the like.

[Formation of Resist Mask 143*a*]

Figure 7C:
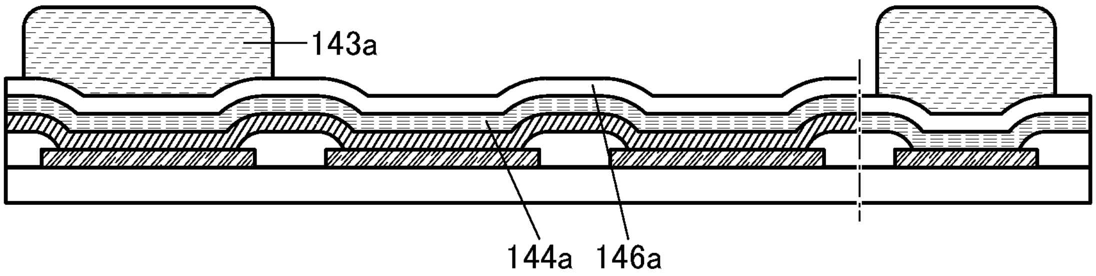

Then, a resist mask 143*a* is formed in positions over the protective film 146*a* which overlap with the anode 101R and the connection electrode 101C (FIG. 7C). Such a method involves heat treatment steps such as pre-applied bake (PAB) after the resist application and post-exposure bake (PEB) after light exposure. The temperature reaches approximately 100° C. during the PAB, and approximately 120° C. during the PEB, for example. Therefore, the light-emitting device should be resistant to such high treatment temperatures. The light-emitting apparatus of one embodiment of the present invention can have favorable characteristics by using the light-emitting device having the structure described in Embodiment 1, which can withstand such heating stress.

For the resist mask 143*a*, a resist material containing a photosensitive resin such as a positive type resist material or a negative type resist material can be used.

On the assumption that the resist mask 143*a* is formed over the mask film 144*a* without the protective film 146*a* therebetween, there is a risk of dissolving the EL film 120Rb due to a solvent of the resist material if a defect such as a pinhole exists in the mask film 144*a*. Such a problem can be prevented by using the protective film 146*a*.

In the case where a film that is less likely to cause a defect such as a pinhole is used as the mask film 144*a*, the resist mask 143*a* may be formed directly on the mask film 144*a* without the protective film 146*a* therebetween.

[Etching of Protective Film 146*a*]

Next, part of the protective film 146*a* that is not covered with the resist mask 143*a* is removed by etching, so that a band-shaped protective layer 147*a* is formed. At this time, the protective layer 147*a* is formed also over the connection electrode 101C.

In the etching of the protective film 146*a*, an etching condition with high selectively is preferably employed so that the mask film 144*a* is not removed by the etching. Either wet etching or dry etching can be performed for the etching of the protective film 146*a*. With use of dry etching, a reduction in a processing pattern of the protective film 146*a* can be inhibited.

[Removal of Resist Mask 143*a*]

Figure 7D:
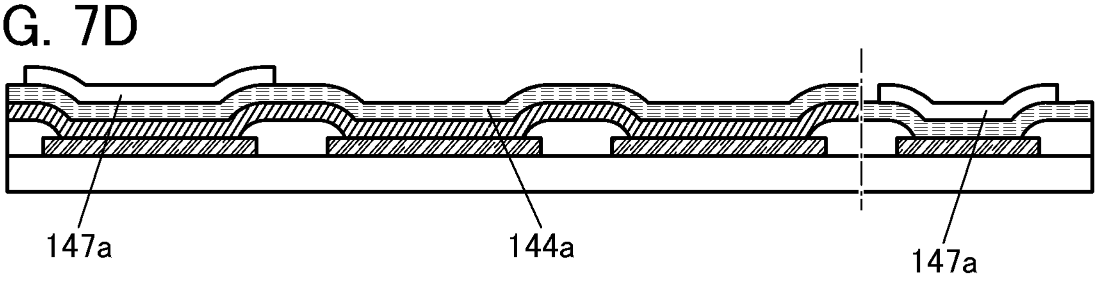

Then, the resist mask 143*a* is removed (FIG. 7D).

The removal of the resist mask 143*a* can be performed by wet etching or dry etching. It is particularly preferable to perform dry etching (also referred to as plasma ashing) using an oxygen gas as an etching gas to remove the resist mask 143*a*.

At this time, the removal of the resist mask 143*a* is performed in a state where the EL film 120Rb is covered with the mask film 144*a*; thus, the EL film 120Rb is less likely to be affected by the removal. In particular, when the EL film 120Rb is exposed to oxygen, the electrical characteristics of the light-emitting device are adversely affected in some cases. Therefore, it is preferable that the EL film 120Rb be covered by the mask film 144*a* when etching using an oxygen gas, such as plasma ashing, is performed.

[Etching of Mask Film 144*a*]

Figure 7E:
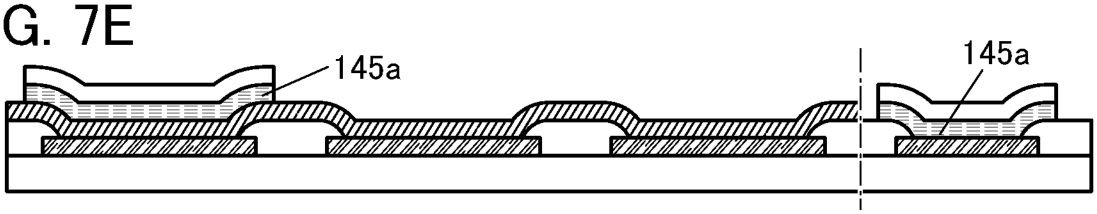

Next, part of the mask film 144*a* that is not covered with the protective layer 147*a* is removed by etching with use of the protective layer 147*a* as a mask, so that a band-shaped mask layer 145*a* is formed (FIG. 7E). At this time, the mask layer 145*a* is formed also over the connection electrode 101C.

Either wet etching or dry etching can be performed for the etching of the mask film 144*a*. With use of dry etching, a reduction in a processing pattern of the mask film 144*a* can be inhibited.

[Etching of EL Film 120Rb and Protective Layer 147*a*]

Figure 7F:
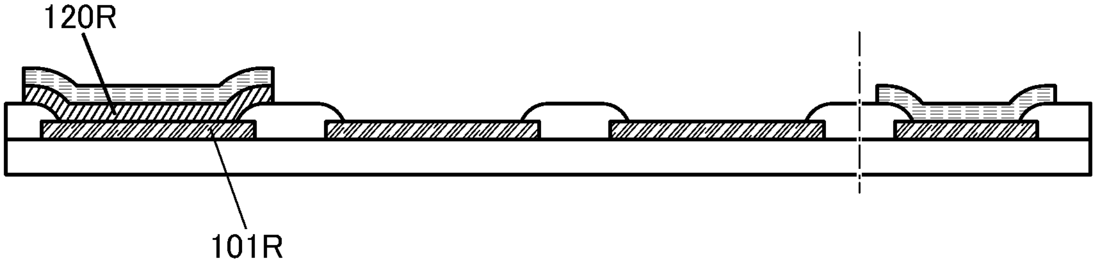

Next, the protective layer 147*a* and part of the EL film 120Rb that is not covered with the mask layer 145*a* are removed by etching at the same time, so that the band-shaped EL layer 120R is formed (FIG. 7F). At this time, the protective layer 147*a* over the connection electrode 101C is also removed.

The EL film 120Rb and the protective layer 147*a* are preferably etched by the same treatment so that the process can be simplified to reduce the manufacturing cost of the display apparatus.

For the etching of the EL film 120Rb, it is particularly preferable to perform dry etching using an etching gas that does not contain oxygen as its main component. This is because the alteration of the EL film 120Rb is inhibited, and a highly reliable display apparatus can be achieved. Examples of the etching gas that does not contain oxygen as its main component include $CF_4$, $C_4F_8$, $SF_6$, $CHF_3$, $Cl_2$, $H_2O$, $BCl_3$, or a rare gas such as $H_2$ or He. Alternatively, a mixed gas of the above gas and a dilute gas that does not contain oxygen can be used as the etching gas.

Note that the etching of the EL film 120Rb and the etching of the protective layer 147*a* may be performed separately. In that case, either the etching of the EL film 120Rb or the etching of the protective layer 147*a* may be performed first.

At this step, the EL layer 120R and the connection electrode 101C are covered with the mask layer 145*a*.

[Formation of EL Film 120Gb]

Subsequently, the EL film 120Gb, which is to be the EL layer 120G, is formed over the mask layer 145*a*, the insulating layer 124, the anode 101G, and the anode 101B. In that case, similarly to the EL film 120Rb, the EL film 120Gb is preferably not provided over the connection electrode 101C.

For the formation method of the EL film 120Gb, the above description of the EL film 120Rb can be referred to.

[Formation of Mask Film 144*b*]

Then, a mask film 144*b* is formed over the EL film 120Gb. The mask film 144*b* can be formed in a manner similar to that of the mask film 144*a*. In particular, the mask film 144*b* and the mask film 144*a* are preferably formed using the same material.

At this time, the mask film 144*b* is formed also over the connection electrode 101C so as to cover the mask layer 145*a*.

[Formation of Protective Film 146*b*]

Next, the protective film 146*b* is formed over the mask film 144*b*. The protective film 146*b* can be formed in a manner similar to that of the protective film 146*a*. In particular, the protective film 146*b* and the protective film 146*a* are preferably formed using the same material.

[Formation of Resist Mask 143*b*]

Figure 8A:
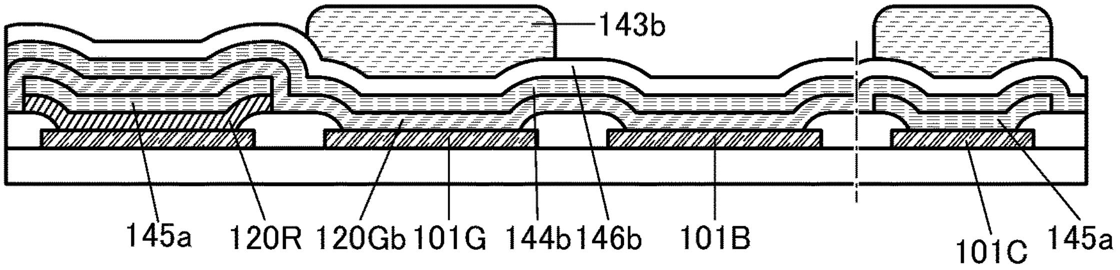
FIGS. 8A to 8F illustrate the manufacturing method example of the display apparatus.

Then, the resist mask 143*b* is formed in positions over the protective film 146*b* which overlap with the anode 101G and the connection electrode 101C (FIG. 8A).

The resist mask 143*b* can be formed in a manner similar to that of the resist mask 143*a*.

[Etching of Protective Film 146*b*]

Figure 8B:
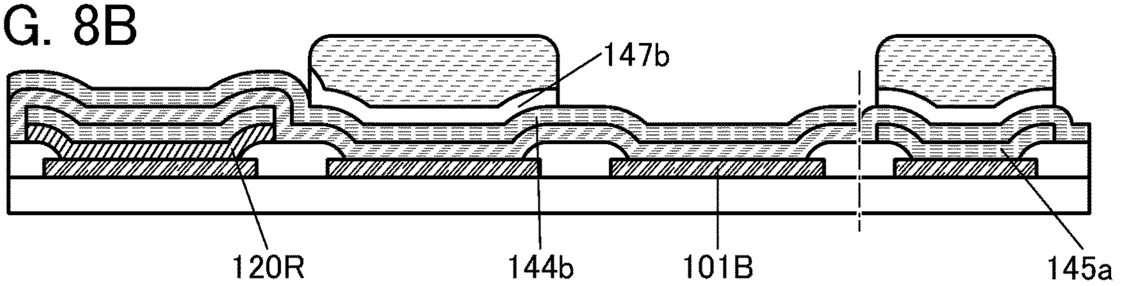

Next, part of the protective film 146*b* that is not covered with the resist mask 143*b* is removed by etching, so that a band-shaped protective layer 147*b* is formed (FIG. 8B). At this time, the protective layer 147*b* is formed also over the connection electrode 101C.

For the etching of the protective film 146*b*, the above description of the protective film 146*a* can be referred to.

[Removal of Resist Mask 143*b*]

Then, the resist mask 143*b* is removed. For the removal of resist mask 143*b*, the above description of the resist mask 143*a* can be referred to.

[Etching of Mask Film 144*b*]

Next, part of the mask film 144*b* that is not covered with the protective layer 147*b* is removed by etching with use of the protective layer 147*b* as a mask, so that a band-shaped mask layer 145*b* is formed. At this time, the mask layer 145*b* is formed also over the connection electrode 101C. The mask layer 145*a* and the mask layer 145*b* are stacked over the connection electrode 101C.

For the etching of the mask film 144*b*, the above description of the mask film 144*a* can be referred to.

[Etching of EL Film 120Gb and Protective Layer 147*b*]

Figure 8C:
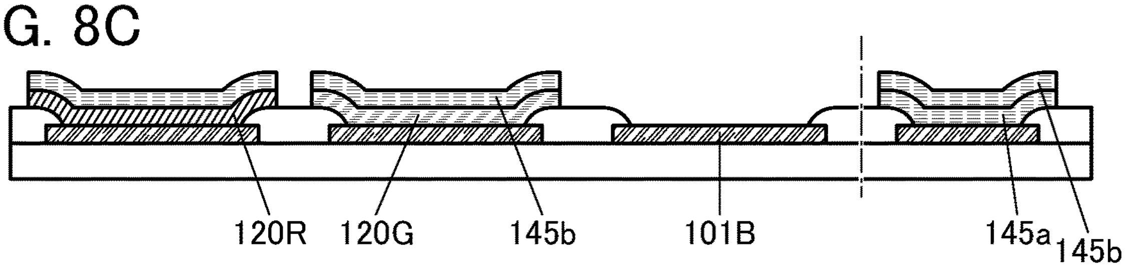

Next, the protective layer 147*b* and part of the EL film 120Gb that is not covered with the mask layer 145*b* are removed by etching at the same time, so that the band-shaped EL layer 120G is formed (FIG. 8C). At this time, the protective layer 147*b* over the connection electrode 101C is also removed.

For the etching of the EL film 120Gb and the protective layer 147*b*, the above description of the EL film 120Rb and the protective layer 147*a* can be referred to.

At this time, the EL layer 120R is protected by the mask layer 145*a*, and thus can be prevented from being damaged in the etching step of the EL film 120Gb.

In the above manner, the band-shaped EL layer 120R and the band-shaped EL layer 120G can be separately formed with high alignment accuracy.

[Formation of EL Layer 120B]

Figure 8D:
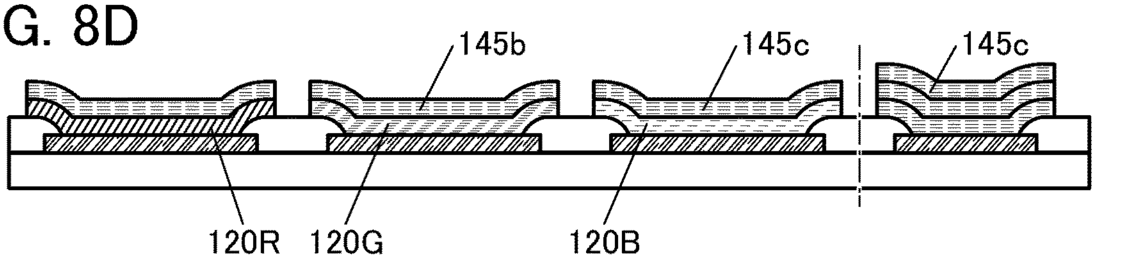

The above steps are performed on the EL film 120Bb (not illustrated), whereby the island-shaped EL layer 120B and an island-shaped mask layer 145*c* can be formed (FIG. 8D).

That is, after the formation of the EL layer 120G, the EL film 120Bb, a mask film 144*c*, a protective film 146*c*, and a resist mask 143*c* (each of which is not illustrated) are sequentially formed. After that, the protective film 146*c* is etched to form a protective layer 147*c* (not illustrated); then, the resist mask 143*c* is removed. Subsequently, the mask film 144*c* is etched to form the mask layer 145*c*. Then, the protective layer 147c and the EL film 120Bb are etched to form the band-shaped EL layer 120B.

At the same time that the EL layer 120B is formed, the mask layer 145c is also formed over the connection electrode 101C. The mask layer 145a, the mask layer 145b, and the mask layer 145c are stacked over the connection electrode 101C.

[Removal of Mask Layer]

Figure 8E:
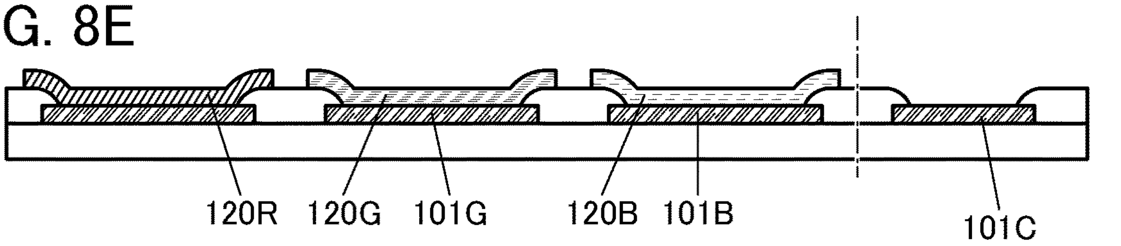

Next, the mask layer 145a, the mask layer 145b, and the mask layer 145c are removed, whereby top surfaces of the EL layer 120R, the EL layer 120G, and the EL layer 120B are exposed (FIG. 8E). At this time, the top surface of the connection electrode 101C is also exposed.

The mask layer 145a, the mask layer 145b, and the mask layer 145c can be removed by wet etching or dry etching. At this time, a method that causes as little damage as possible to the EL layer 120R, the EL layer 120G, and the EL layer 120B is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

Alternatively, the mask layer 145a, the mask layer 145b, and the mask layer 145c are preferably removed by being dissolved in a solvent such as water or alcohol. Examples of the alcohol in which the mask layer 145a, the mask layer 145b, and the mask layer 145c can be dissolved include ethyl alcohol, methyl alcohol, isopropyl alcohol (IPA), and glycerin.

After the mask layer 145a, the mask layer 145b, and the mask layer 145c are removed, drying treatment is preferably performed in order to remove water contained in the EL layer 120R, the EL layer 120G, and the EL layer 120B and water adsorbed on the surfaces of the EL layer 120R, the EL layer 120G, and the EL layer 120B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., and further preferably higher than or equal to 70° C. and lower than or equal to 120° C. The heat treatment is preferably performed in a reduced-pressure atmosphere because drying at a lower temperature is possible.

In the above manner, the EL layer 120R, the EL layer 120G, and the EL layer 120B can be separately formed.

[Formation of EL Layer 121]

Then, the EL layer 121 is formed to cover the EL layer 120R, the EL layer 120G, and the EL layer 120B.

The EL layer 121 can be formed in a manner similar to that of the EL film 120Rb or the like. In the case where the EL layer 121 is formed by an evaporation method, the EL layer 121 is preferably formed using a shielding mask so as not to be formed over the connection electrode 101C.

[Formation of Cathode 102]

Figure 8F:
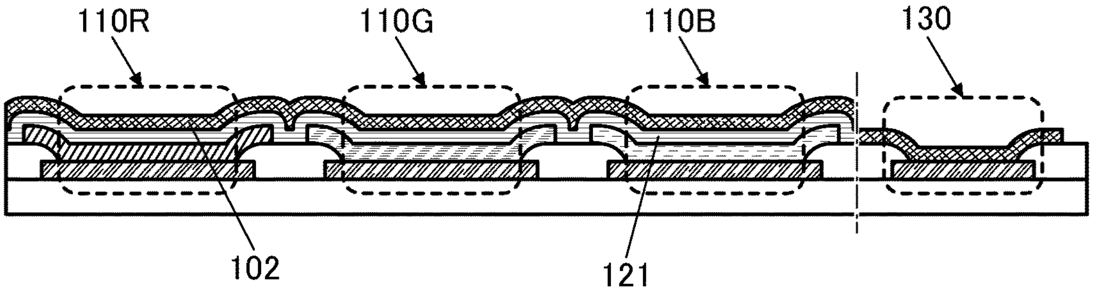

Then, the cathode 102 is formed to cover the EL layer 121 and the connection electrode 101C (FIG. 8F).

The cathode 102 can be formed by a method such as an evaporation method or a sputtering method. Alternatively, a film formed by an evaporation method and a film formed by a sputtering method may be stacked. In that case, the cathode 102 is preferably formed so as to cover a region where the electron-injection layer 115 is formed. That is, a structure in which end portions of the electron-injection layer 115 overlap with the cathode 102 can be obtained. The cathode 102 is preferably formed using a shielding mask.

The cathode 102 is electrically connected to the connection electrode 101C outside a display region.

[Formation of Protective Layer]

Then, a protective layer is formed over the cathode 102. An inorganic insulating film used for the protective layer is preferably formed by a sputtering method, a PECVD method, or an ALD method. In particular, an ALD method is preferable because a film deposited by ALD has good step coverage and is less likely to cause a defect such as pinhole. An organic insulating film is preferably formed by an inkjet method because a uniform film can be formed in a desired area.

In the above manner, the light-emitting apparatus of one embodiment of the present invention can be manufactured.

Although the cathode 102 and the electron-injection layer 115 are formed so as to have different top surface shapes, they may be formed in the same region.

Embodiment 4

Figure 9A:
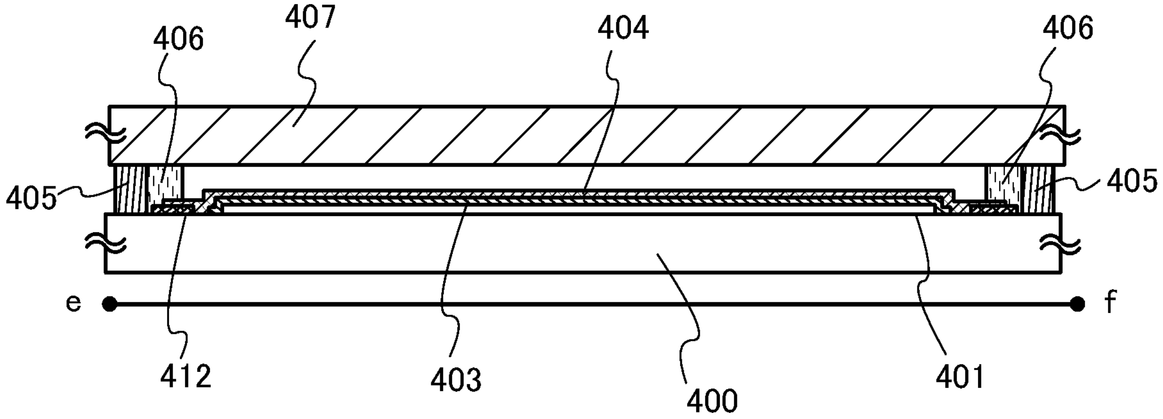
FIGS. 9A and 9B illustrate a lighting device.
Figure 9B:
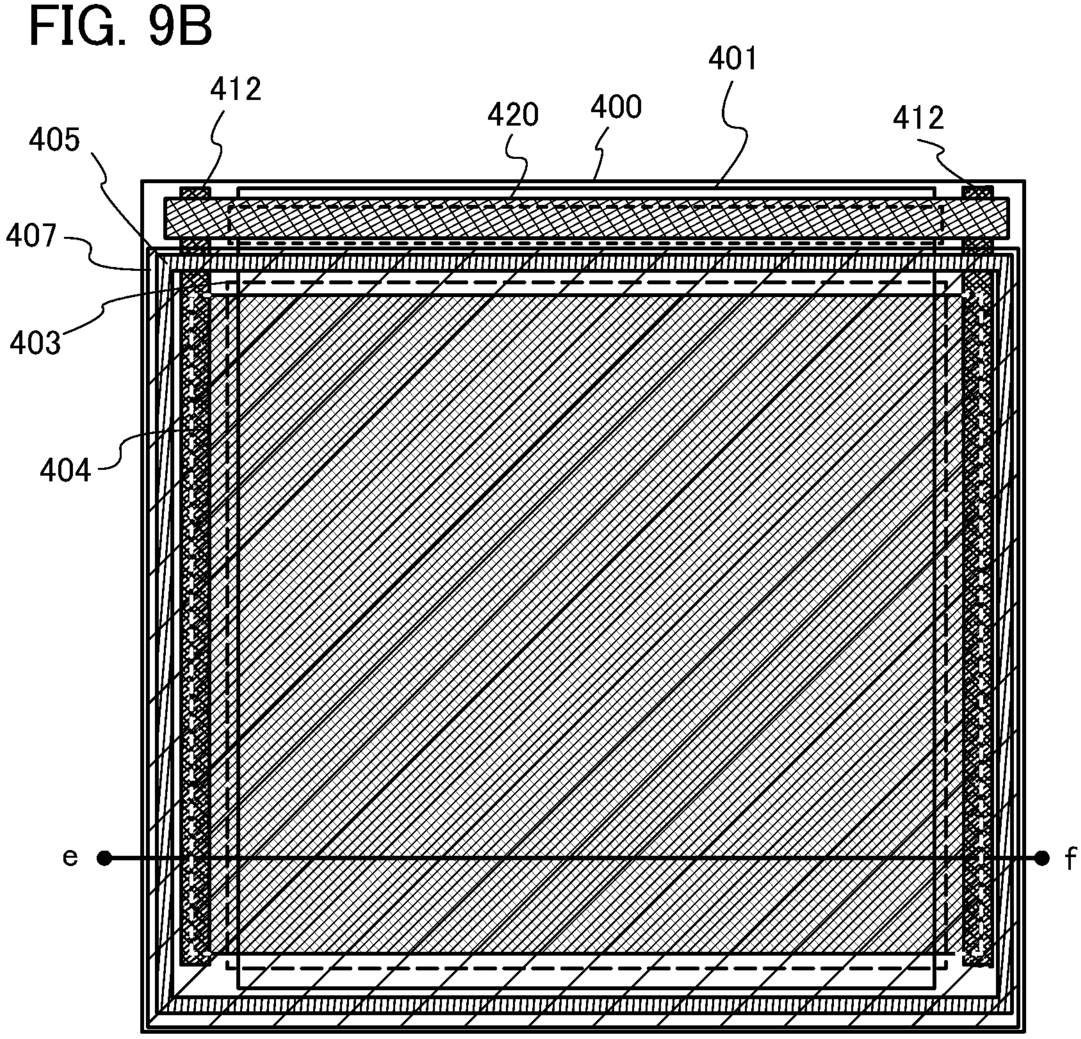

In this embodiment, an example in which the light-emitting device described in Embodiment 1 is used for a lighting device will be described with reference to FIGS. 9A and 9B. FIG. 9B is a top view of the lighting device, and FIG. 9A is a cross-sectional view taken along the line e-f in FIG. 9B.

In the lighting device in this embodiment, an anode 401 is formed over a substrate 400 that is a support with a light-transmitting property. The anode 401 corresponds to the anode 101 in Embodiment 1. When light is extracted to the anode 401 side, the anode 401 is formed using a material having a light-transmitting property.

A pad 412 for applying voltage to a cathode 404 is provided over the substrate 400.

An EL layer 403 is formed over the anode 401. The structure of the EL layer 403 corresponds to, for example, the structure of the EL layer 103 in Embodiment 1. Refer to the corresponding description for these structures.

The cathode 404 is formed to cover the EL layer 403. The cathode 404 corresponds to the cathode 102 in Embodiment 1. The cathode 404 is formed using a material having high reflectance when light is extracted to the anode 401 side. The cathode 404 is connected to the pad 412, thereby receiving voltage.

As described above, the lighting device described in this embodiment includes a light-emitting device including the anode 401, the EL layer 403, and the cathode 404. Since the light-emitting device has high heat resistance, the lighting device in this embodiment can have high heat resistance.

The substrate 400 provided with the light-emitting device having the above structure and a sealing substrate 407 are fixed and sealed with sealing materials 405 and 406, whereby the lighting device is completed. It is possible to use only either the sealing material 405 or the sealing material 406. The inner sealing material 406 (not illustrated in FIG. 9B) can be mixed with a desiccant that enables moisture to be adsorbed, resulting in improved reliability.

When parts of the pad 412 and the anode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting device described in Embodiment 1, and thus can be a light-emitting apparatus having high reliability.

This embodiment can be freely combined with any of the other embodiments.

Embodiment 5

In this embodiment, examples of electronic appliances each including the light-emitting device described in Embodiment 1 will be described. The light-emitting device described in Embodiment 1 has favorable heat resistance. As a result, the electronic appliances described in this embodiment can each include a light-emitting portion having high reliability.

Examples of the electronic appliance including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic appliances are shown below.

Figure 10A:
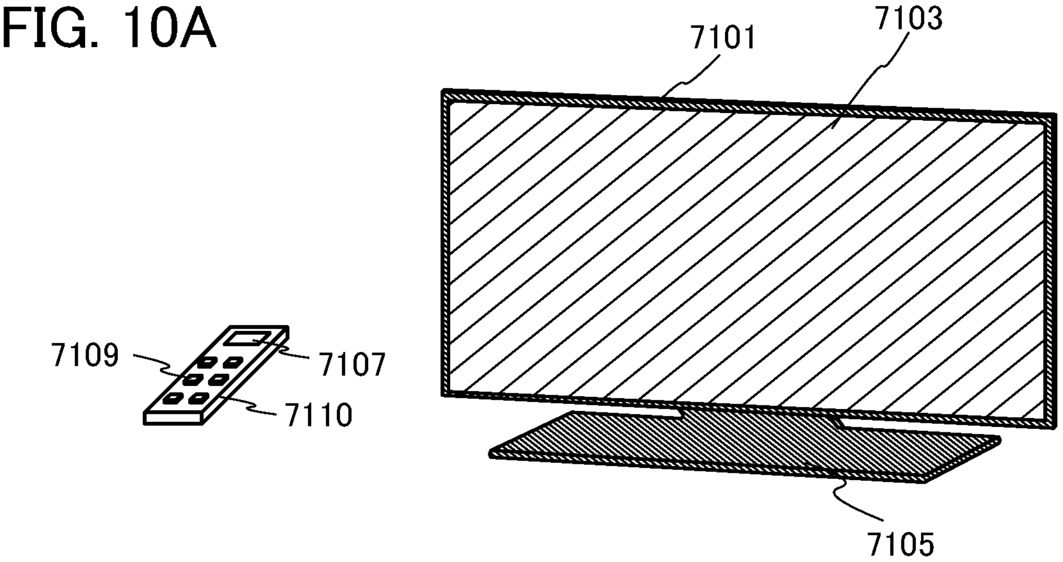
Figure 10A:
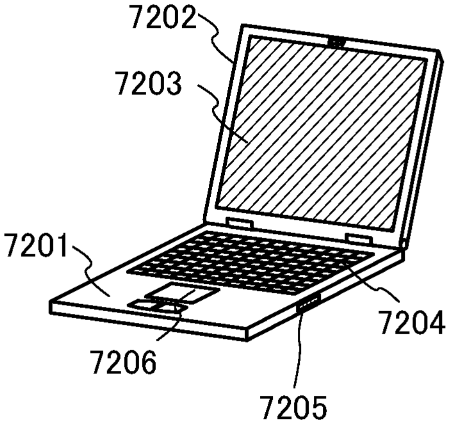
Figure 10A:
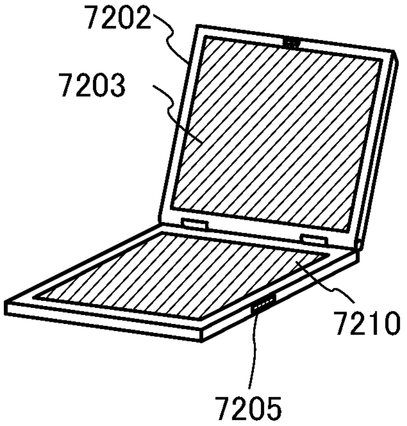

FIG. 10A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiment 1 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110. The light-emitting devices described in Embodiment 1 may also be arranged in a matrix in the display portion 7107.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 10B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiment 1 and arranged in a matrix in the display portion 7203. The computer illustrated in FIG. 10B1 may have a structure illustrated in FIG. 10B2. A computer illustrated in FIG. 10B2 is provided with a display portion 7210 instead of the keyboard 7204 and the pointing device 7206. The display portion 7210 is a touch panel, and input operation can be performed by touching display for input on the display portion 7210 with a finger or a dedicated pen. The display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 10C:
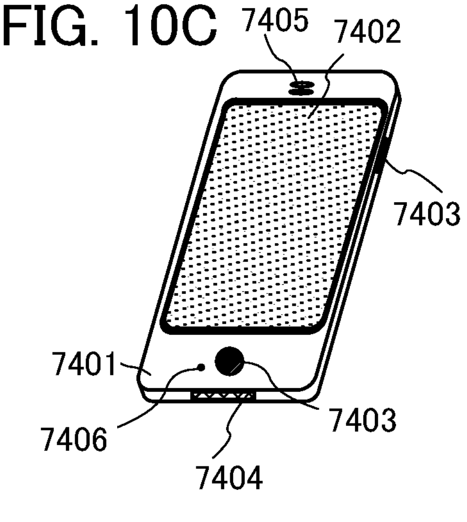

FIG. 10C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone includes the display portion 7402 in which the light-emitting devices described in Embodiment 1 are arranged in a matrix.

When the display portion 7402 of the portable terminal illustrated in FIG. 10C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be captured.

As described above, the application range of the light-emitting apparatus including the light-emitting device described in Embodiment 1 is wide so that this light-emitting apparatus can be applied to electronic appliances in a variety of fields. By using the light-emitting device described in Embodiment 1, an electronic appliance with low power consumption can be obtained.

Figure 11A:
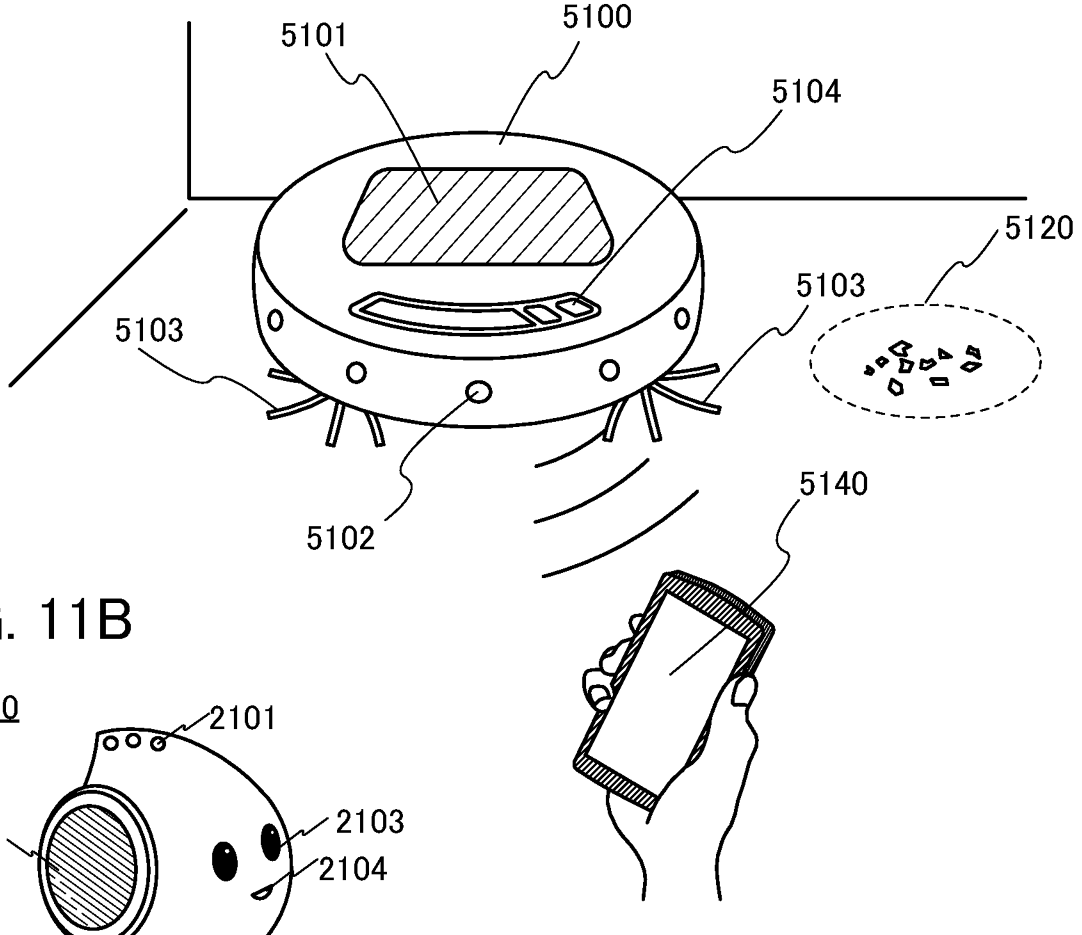
FIGS. 11A to 11C illustrate electronic appliances.

FIG. 11A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic appliance 5140 such as a smartphone. Images taken by the cameras 5102 can be displayed on the portable electronic appliance 5140. Accordingly, an owner of the cleaning robot 5100 can monitor his/her room even when the owner is not at home. The owner can also check the display on the display 5101 by the portable electronic appliance 5140 such as a smartphone.

The light-emitting apparatus of one embodiment of the present invention can be used for the display 5101.

Figure 11B:
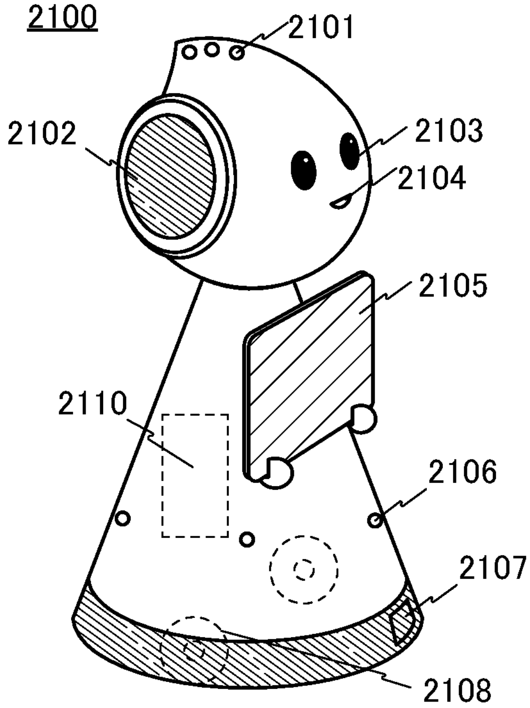

A robot 2100 illustrated in FIG. 11B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 11C:
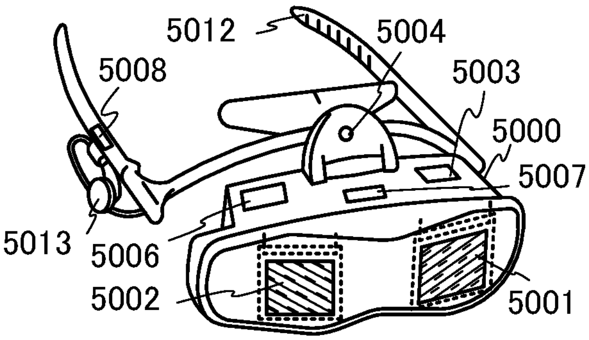

FIG. 11C illustrates an example of a goggles-type display. The goggles-type display includes, for example, a housing 5000, a display portion 5001, a speaker 5003, an LED lamp 5004 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 12:
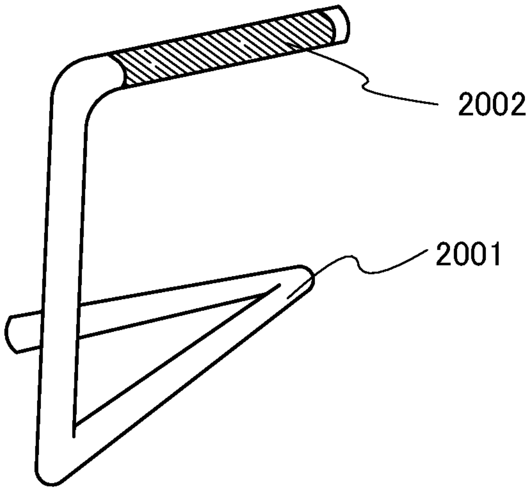
FIG. 12 illustrates a lighting device.

FIG. 12 illustrates an example in which the light-emitting device described in Embodiment 1 is used for a table lamp which is a lighting device. The table lamp illustrated in FIG. 12 includes a housing 2001 and a light source 2002, and the lighting device described in Embodiment 5 may be used for the light source 2002.

Figure 13:
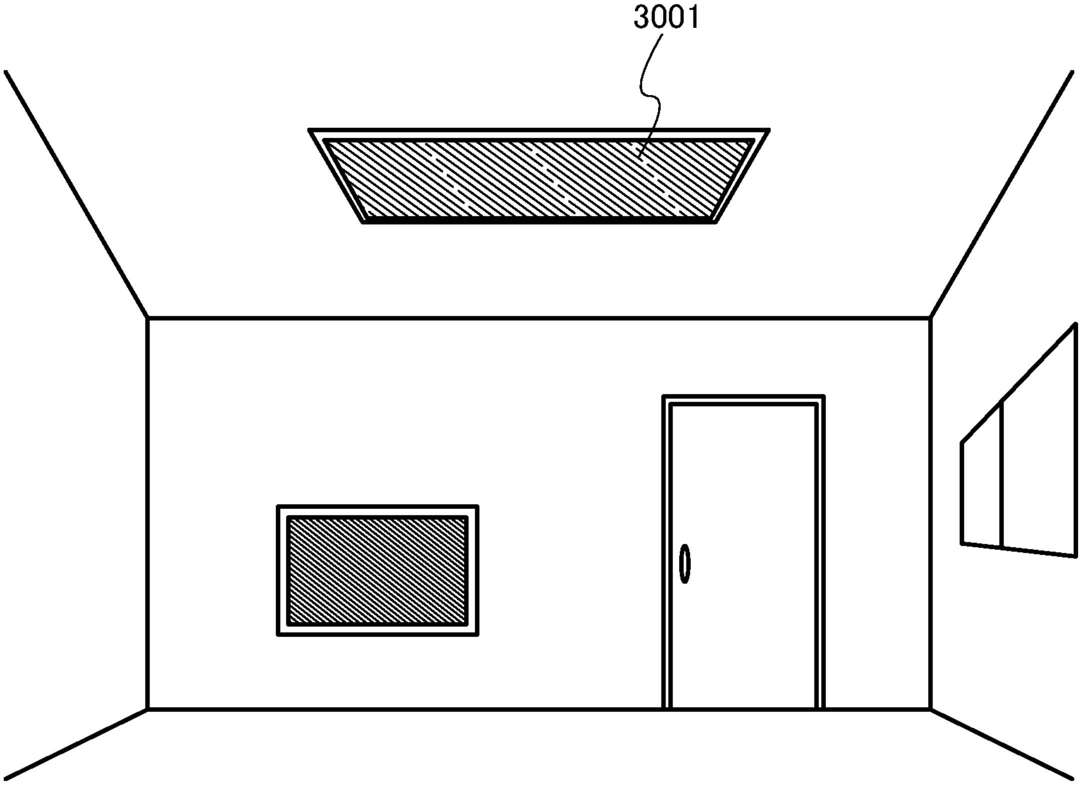
FIG. 13 illustrates a lighting device.

FIG. 13 illustrates an example in which the light-emitting device described in Embodiment 1 is used for an indoor lighting device 3001. Since the light-emitting device described in Embodiment 1 has high emission efficiency, the lighting device can have low power consumption. Furthermore, since the light-emitting device described in Embodiment 1 can have a large area, the light-emitting device can be used for a large-area lighting device. Furthermore, since the light-emitting device described in Embodiment 1 is thin, the light-emitting device can be used for a lighting device having a reduced thickness.

Figure 14:
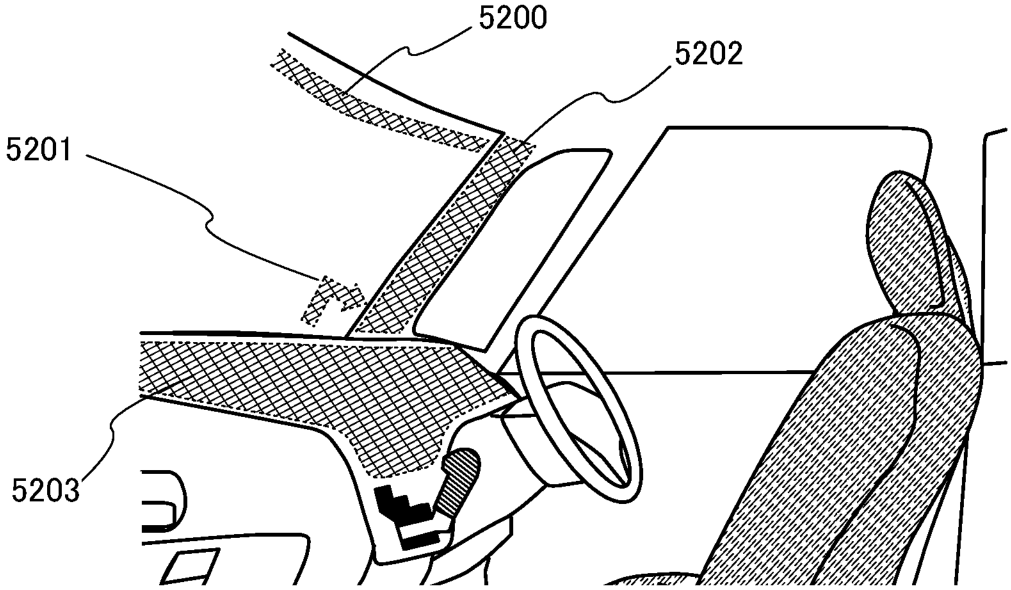
FIG. 14 illustrates in-vehicle display apparatuses and lighting devices.

The light-emitting device described in Embodiment 1 can also be used for an automobile windshield or an automobile dashboard. FIG. 14 illustrates one mode in which the light-emitting devices described in Embodiment 1 are used for an automobile windshield and an automobile dashboard. Display regions 5200 to 5203 each include the light-emitting device described in Embodiment 1.

The display regions 5200 and 5201 are display apparatuses which are provided in the automobile windshield and include the light-emitting device described in Embodiment 1. The light-emitting device described in Embodiment 1 can be formed into what is called a see-through display apparatus, through which the opposite side can be seen, by including an anode and a cathode formed of light-transmitting electrodes. Such see-through display apparatuses can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display apparatus which is provided in a pillar portion and includes the light-emitting device described in Embodiment 1. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile; thus, blind areas can be eliminated to enhance the safety. Images that compensate for the areas which a driver cannot see enable the driver to ensure safety easily and comfortably.

The display region 5203 can provide a variety of kinds of information such as navigation data, the speed, the number of rotations, air-condition setting, and the like. The content or layout of the display can be changed as appropriate according to the user's preference. Note that such information can also be displayed on the display regions 5200 to 5202. The display regions 5200 to 5203 can also be used as lighting devices.

Figure 15A:
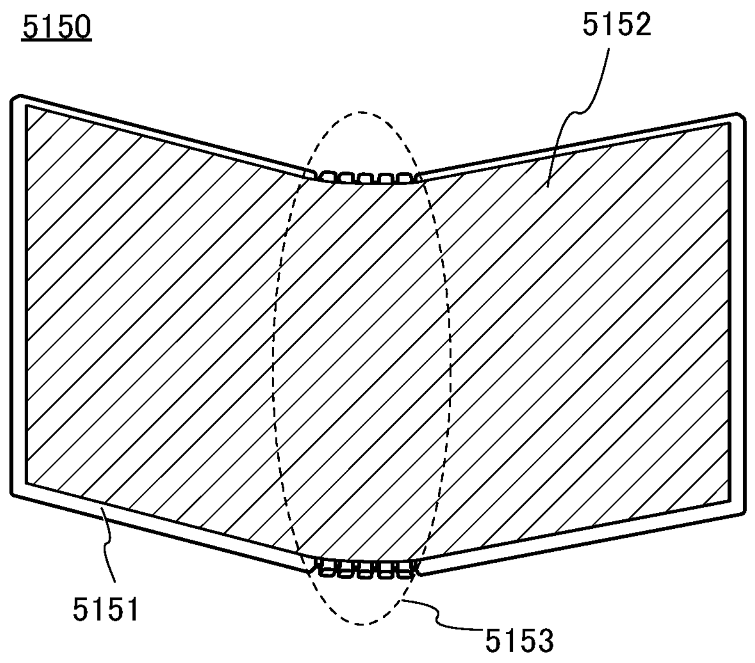
FIGS. 15A and 15B illustrate an electronic appliance.
Figure 15B:
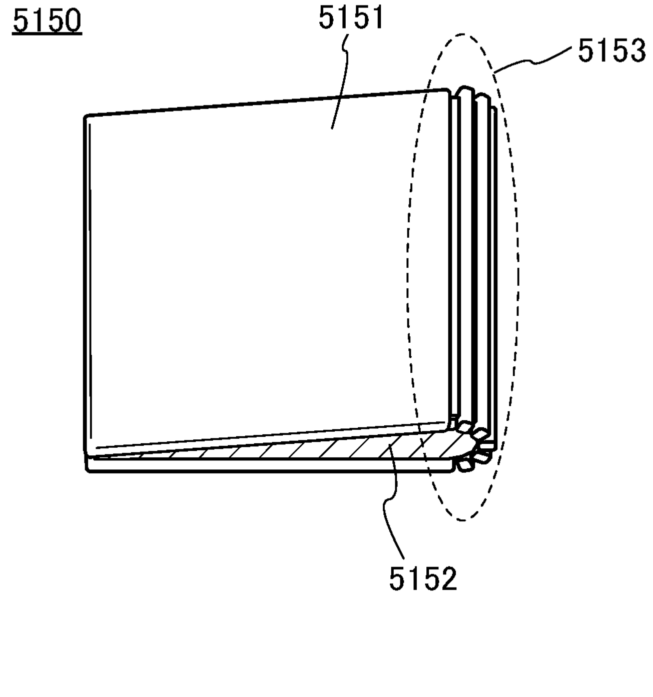

FIGS. 15A and 15B illustrate a foldable portable information terminal 5150. The foldable portable information terminal 5150 includes a housing 5151, a display region 5152, and a bend portion 5153. FIG. 15A illustrates the portable information terminal 5150 that is opened. FIG. 15B illustrates the portable information terminal that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands. The bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 16A:
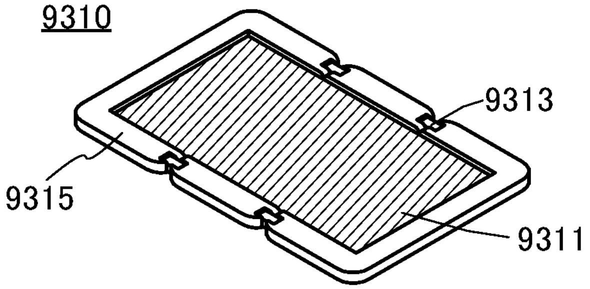
FIGS. 16A to 16C illustrate an electronic appliance.
Figure 16B:
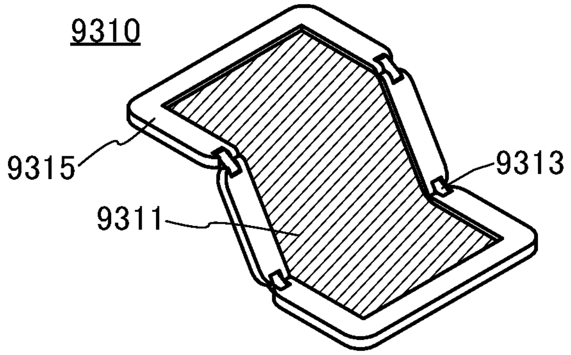
Figure 16C:
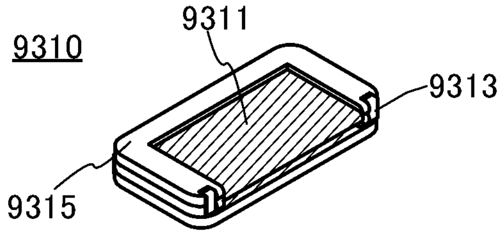

FIGS. 16A to 16C illustrate a foldable portable information terminal 9310. FIG. 16A illustrates the portable information terminal 9310 that is opened. FIG. 16B illustrates the portable information terminal 9310 that is being opened or being folded. FIG. 16C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Example 1

In this example, light-emitting devices 1-1 and 1-2 of one embodiment of the present invention and a comparative light-emitting device 1 are described. Structural formulae of organic compounds used in this example are shown below.

[Chemical Formula 38]

(i)

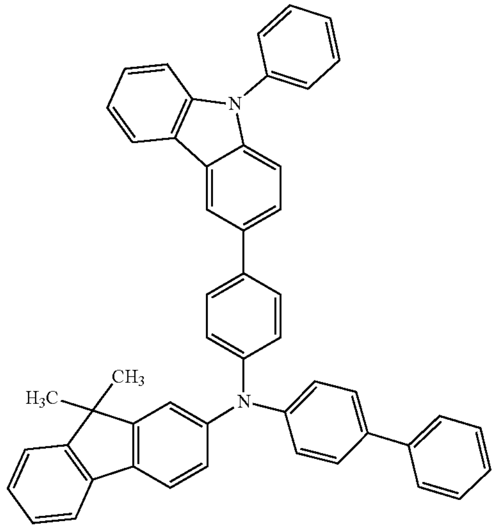

PCBBiF (ii)

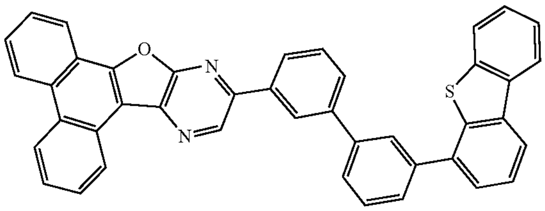

11mDBtBPPnfpr (iv)

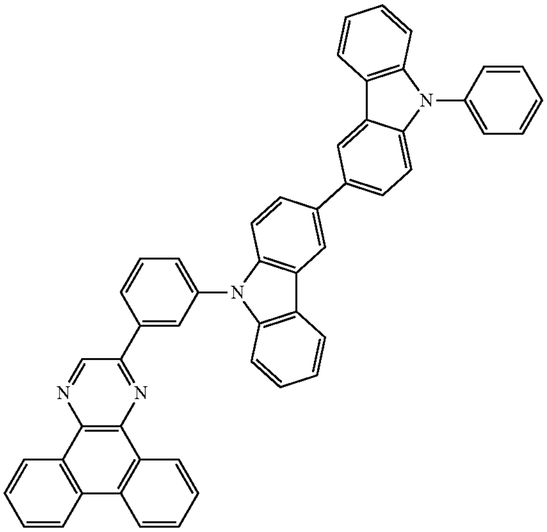

2mPCCzPDBq

-continued (v)

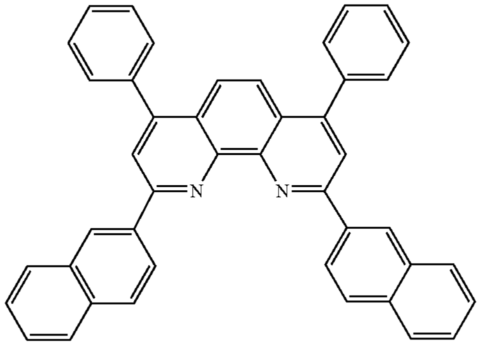

NBPhen (vi)

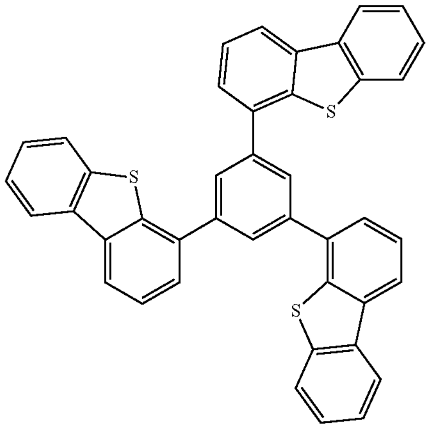

DBT3P-II (vii)

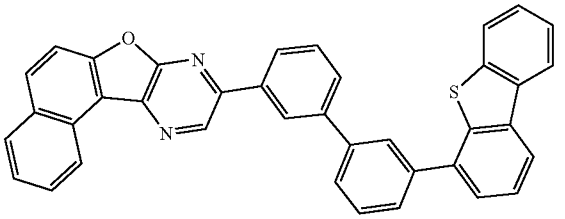

9mDBtBPNfpr (viii)

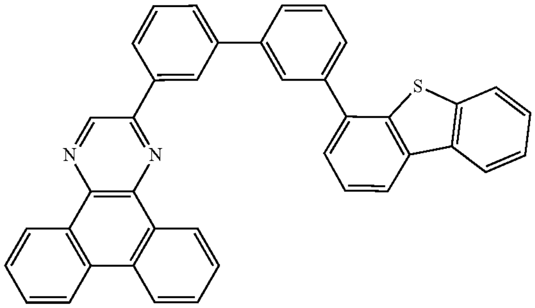

2mDBTBPDBq-II (Method for Fabricating Light-Emitting Device 1-1)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 10 nm by a sputtering method, whereby the anode 101 was formed. The electrode area was set to 4 $mm^2$ (2 mm×2 mm). Note that the transparent electrode functions as the anode, and the transparent electrode and the reflective electrode can be collectively regarded as the anode 101.

Next, in pretreatment for forming the light-emitting device over a substrate, a surface of the substrate was washed with water and baked at 200° C. for one hour, and then UV ozone treatment was performed for 370 seconds.

After that, the substrate was transferred into a vacuum evaporation apparatus where the pressure had been reduced to approximately $1\times10^{-4}$ Pa, and was subjected to vacuum baking at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Over the anode 101, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.03, whereby the hole-injection layer 111 was formed.

Then, PCBBiF was deposited by evaporation to a thickness of 190 nm over the hole-injection layer 111, whereby the hole-transport layer 112 was formed.

Subsequently, over the hole-transport layer 112, 11-[(3'-dibenzothiophen-4-yl)bipheny-3-yl]phenanthro[9',10':4,5]furo[2,3-b]pyrazine (abbreviation: 9mDBtBPNfpr) represented by Structure Formula (ii), PCBBiF, and a phosphorescent dopant OCPG-006 were deposited by co-evaporation to a thickness of 50 nm such that the weight ratio of 9mDBtBPNfpr to PCBBiF and OCPG-006 was 0.7:0.3:0.05, whereby the light-emitting layer 113 was formed.

After that, over the light-emitting layer 113, 2-{3-[3'-(N-phenyl-9H-carbazol-3-yl)-9H-carbazol-9-yl]phenyl}dibenzo[f,h]quinoxaline (abbreviation: 2mPCCzPDBq) represented by Structural Formula (iv) was deposited by evaporation to a thickness of 20 nm to form the hole-blocking layer 125, and then, 2,9-di(2-naphthyl)-4,7-diphenyl-1,10-phenanthroline (abbreviation: NBPhen) represented by Structural Formula (v) was deposited by evaporation to a thickness of 20 nm to form the electron-transport layer 114.

After the electron-transport layer 114 was formed, lithium fluoride (LiF) was deposited by evaporation to a thickness of 1 nm to form the electron-injection layer 115, and lastly silver (Ag) and magnesium (Mg) were deposited by co-evaporation to a thickness of 15 nm such that the volume ratio of Ag to Mg was 1:0.1 to form the cathode 102, whereby the light-emitting device 1-1 was fabricated. The cathode 102 is a transflective electrode having a function of reflecting light and a function of transmitting light; thus, the light-emitting device 1-1 is a top-emission device in which light is extracted through the cathode 102. Over the cathode 102, 4,4',4"-(benzene-1,3,5-triyl)tri(dibenzothiophene) (abbreviation: DBT3P-II) represented by Structure Formula (vi) was deposited by evaporation to a thickness of 80 nm as a cap layer so that outcoupling efficiency can be improved.

(Method for Fabricating Light-Emitting Device 1-2)

A light-emitting device 1-2 was fabricated in a manner similar to that of the light-emitting device 1-1 except that 11mDBtBPPnfpr was replaced with 9-[3'-(dibenzothiophen-4-yl)biphenyl-3-yl]naphtho[1',2':4,5]furo[2,3-b]pyrazine (abbreviation: 9mDBtBPNfpr) represented by Structural Formula (vii).

(Method for Fabricating Comparative Light-Emitting Device 1)

A comparative light-emitting device 1 was fabricated in a manner similar to that of the light-emitting device 1-1 except that the thickness of the hole-transport layer was 195 nm, 11mDBtBPPnfpr in the light-emitting layer was replaced with 9-[3'-(dibenzothiophen-4-yl)biphenyl-3-yl]naphtho[1',2':4,5]furo[2,3-b]pyrazine (abbreviation: 9mDBtBPNfpr) with a thickness of 40 nm represented by Structural Formula (vii), and 2mPCCzPDBq in the hole-blocking layer 125 was replaced with 2-[3'-(dibenzothiophen-4-yl)biphenyl-3-yl]dibenzo[f,h]quinoxaline (abbreviation: 2mDBTBPDBq-II). Note that as the comparative light-emitting device 1, two light-emitting devices having the same structure were fabricated.

The stacked-layer structures of the light-emitting devices 1-1 and 1-2 and the comparative light-emitting device 1 are listed in the following tables.

[Table 1]

TABLE 1

| Light-emitting device 1-1 | | | |
|---|---|---|---|
| Functional layer | Substance | Mixture ratio | Film thickness (nm) |
| Electron-injection layer | LiF | — | 1 |
| Electron-transport layer | NBPhen | — | 20 |
| Hole-blocking layer | 2mPCCzPDBq | — | 20 |
| Light-emitting layer | 11mDBtBPPnfpr:PCBBiF:OCPG-006 | 0.7:0.3:0.05 | 40 |
| Hole-transport layer | PCBBiF | — | 190 |
| Hole-injection layer | PCBBiF:OCHD-003 | 1:0.03 | 10 |

TABLE 2

| Light-emitting device 1-2 | | | |
|---|---|---|---|
| Functional layer | Substance | Mixture ratio | Film thickness (nm) |
| Electron-injection layer | LiF | — | 1 |
| Electron-transport layer | NBPhen | — | 20 |
| Hole-blocking layer | 2mPCCzPDBq | — | 20 |
| Light-emitting layer | 9mDBtBPNfpr:PCBBiF:OCPG-006 | 0.7:0.3:0.05 | 40 |
| Hole-transport layer | PCBBiF | — | 190 |
| Hole-injection layer | PCBBiF:OCHD-003 | 1:0.03 | 10 |

TABLE 3

| Comparative light-eminting device 1 | | | |
|---|---|---|---|
| Functional layer | Substance | Mixture ratio | Film thickness (nm) |
| Electron-injection layer | LiF | — | 1 |
| Electron-transport layer | NBPhen | — | 20 |
| Hole-blocking layer | 2mDBTBPDBq-II | — | 20 |
| Light-emitting layer | 9mDBtBPNfpr:PCBBiF:OCPG-006 | 0.7:0.3:0.05 | 40 |
| Hole-transport layer | PCBBiF | — | 195 |
| Hole-injection layer | PCBBiF:OCHD-003 | 1:0.03 | 10 |

In addition, the glass transition temperatures (Tg) of the main substances used are listed in the following table.

TABLE 4

| Abbreviation of substance | Tg (° C.) |
|---|---|
| PCBBiF | 127 |
| 11mDBtBPPnfpr | 130 |
| 2mPCCzPDBq | 160 |
| 9mDBtBPNfpr | 110 |
| 2mDBTBPDBq-II | 112 |

The light-emitting devices 1-1 and 1-2 and the comparative light-emitting device 1 were sealed with a glass substrate in a glove box containing a nitrogen atmosphere so as not to be exposed to the air (a sealing material was applied to surround the devices and UV treatment and heat treatment at 80° C. for one hour were performed at the time of sealing). After that, the initial characteristics of the light-emitting devices 1-1 and 1-2 and the two comparative light-emitting devices 1 were measured. Then, the light-emitting devices 1-1 and 1-2 and one of the comparative light-emitting devices 1 were put on a hot plate in a thermostatic chamber, kept there at 120° C. for one hour, and then subjected to the initial characteristics measurement again in a similar manner. Sequentially, the light-emitting devices 1-1 and 1-2 after the second measurement and the other of the comparative light-emitting devices 1 were put on the hot plate in the thermostatic chamber, kept there at 130° C. for one hour, and then subjected to the third initial characteristics measurement. Lastly, the light-emitting devices 1-1 and 1-2 after the third measurement were put on the hot plate in the thermostatic chamber, kept there at 140° C. for one hour, and then subjected to the fourth initial characteristics measurement in a similar manner.

Figure 18:
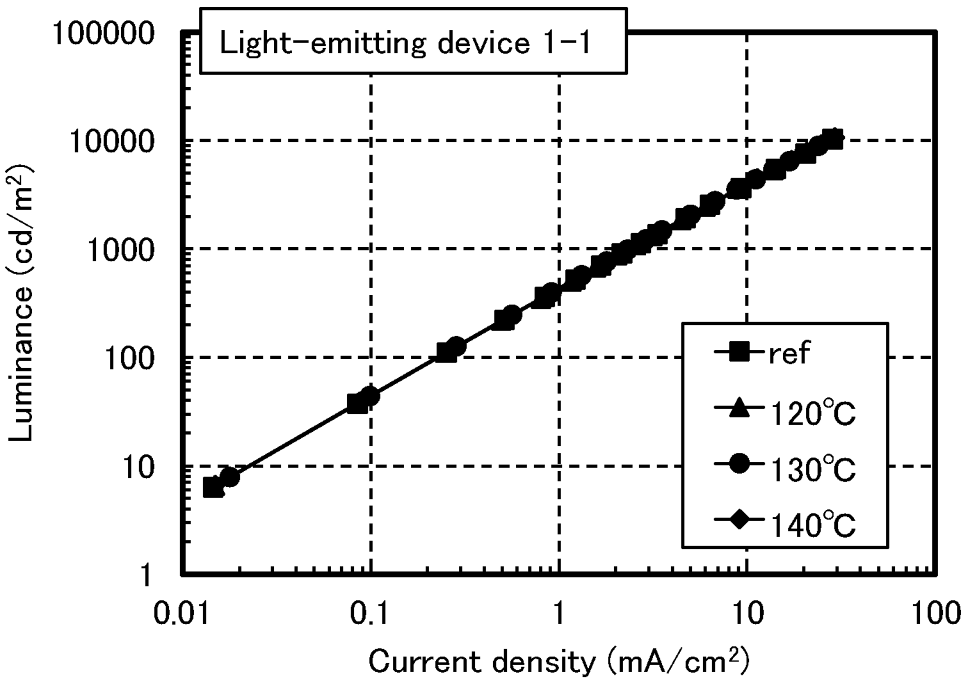
FIG. 18 shows the luminance-current density characteristics of a light-emitting device 1-1.
Figure 19:
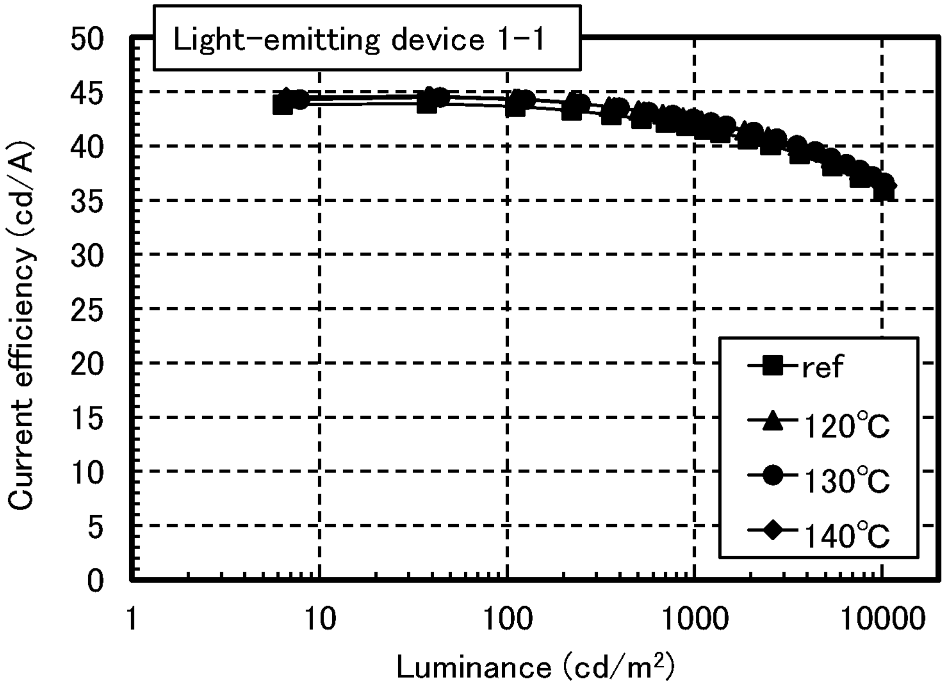
FIG. 19 shows the current efficiency-luminance characteristics of the light-emitting device 1-1.
Figure 20:
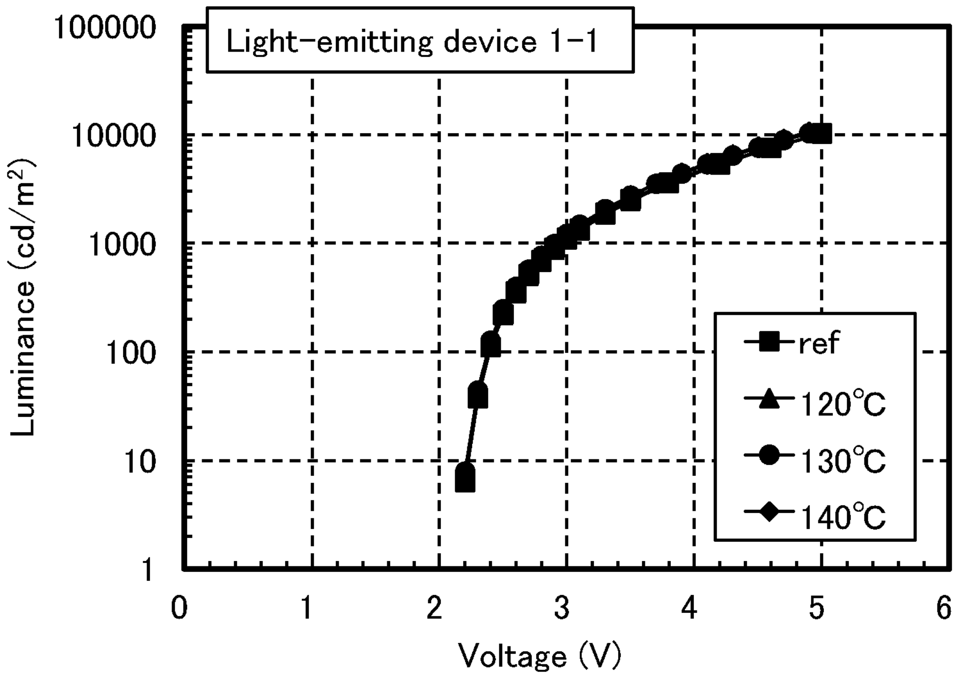
FIG. 20 shows the luminance-voltage characteristics of the light-emitting device 1-1.
Figure 21:
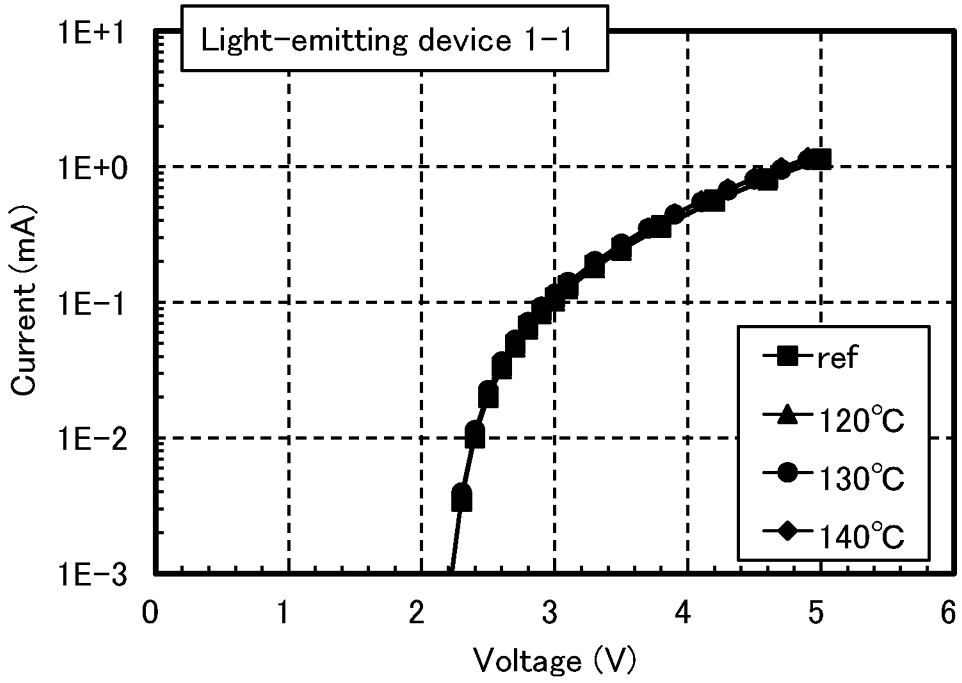
FIG. 21 shows the current-voltage characteristics of the light-emitting device 1-1.
Figure 22:
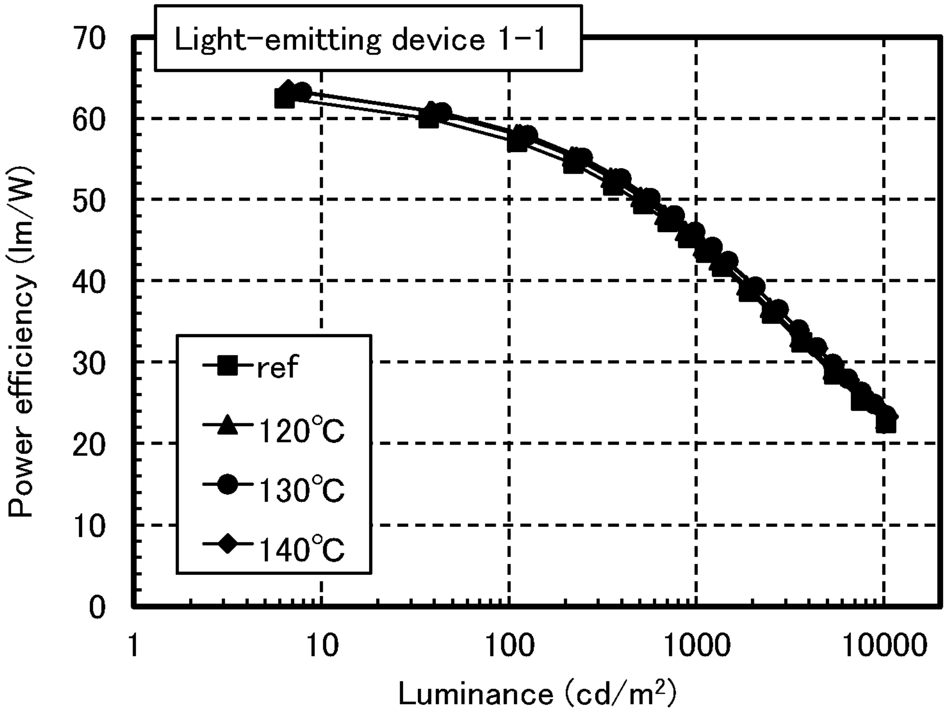
FIG. 22 shows the power efficiency-luminance characteristics of the light-emitting device 1-1.
Figure 23:
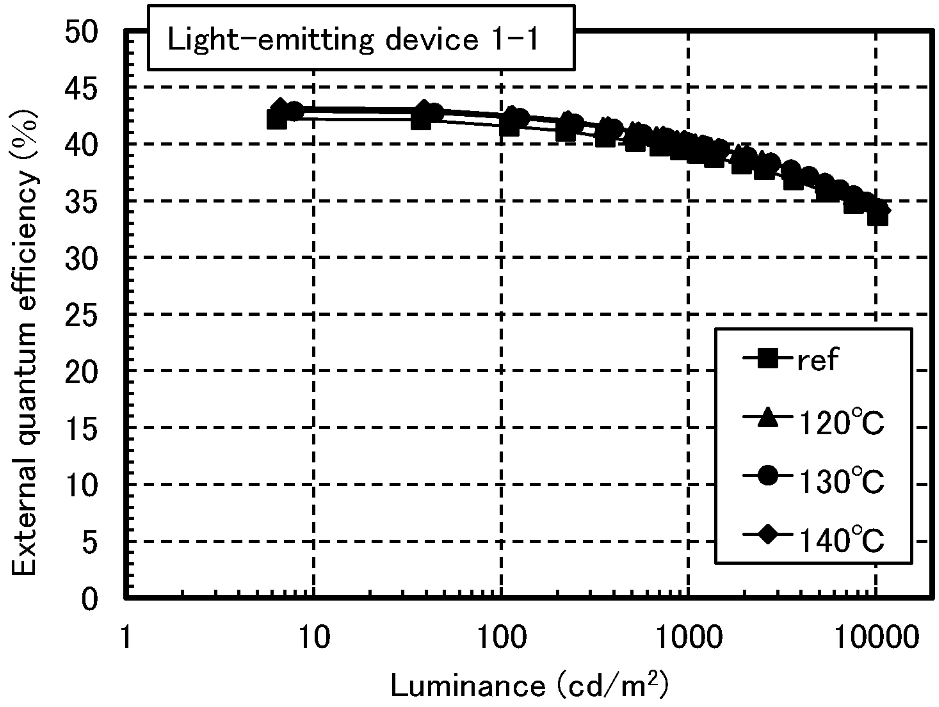
FIG. 23 shows the external quantum efficiency-luminance characteristics of the light-emitting device 1-1.
Figure 24:
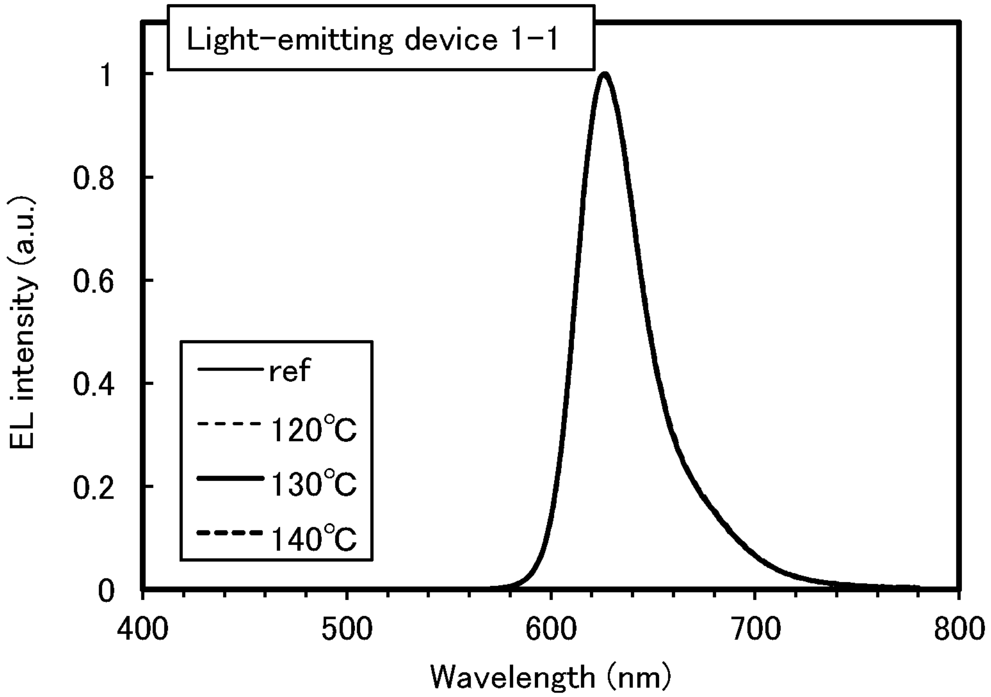
FIG. 24 shows an emission spectrum of the light-emitting device 1-1.
Figure 25:
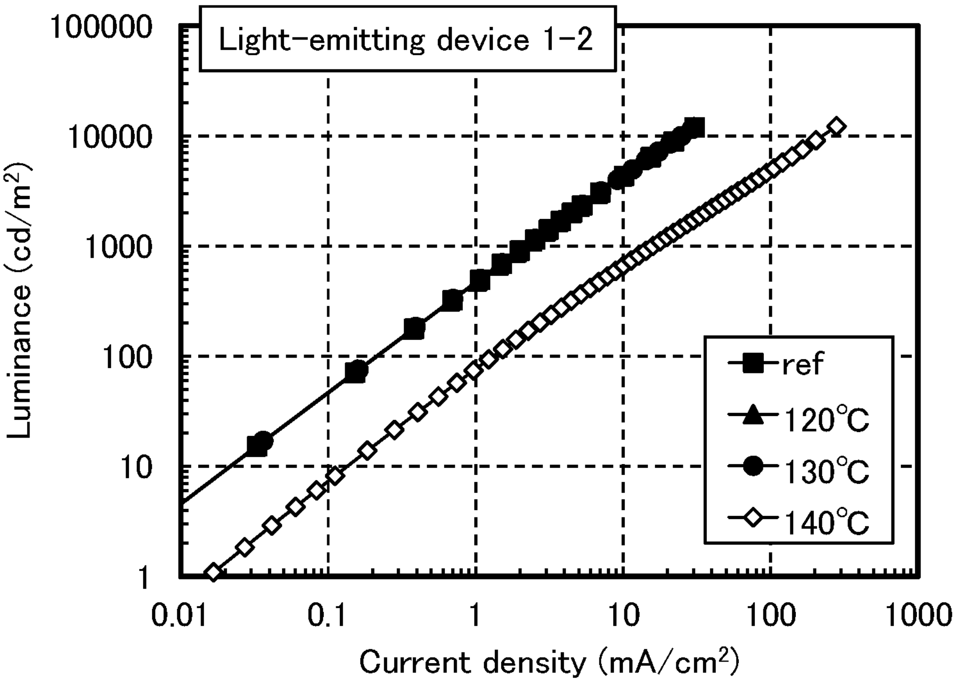
FIG. 25 shows the luminance-current density characteristics of a light-emitting device 1-2.
Figure 26:
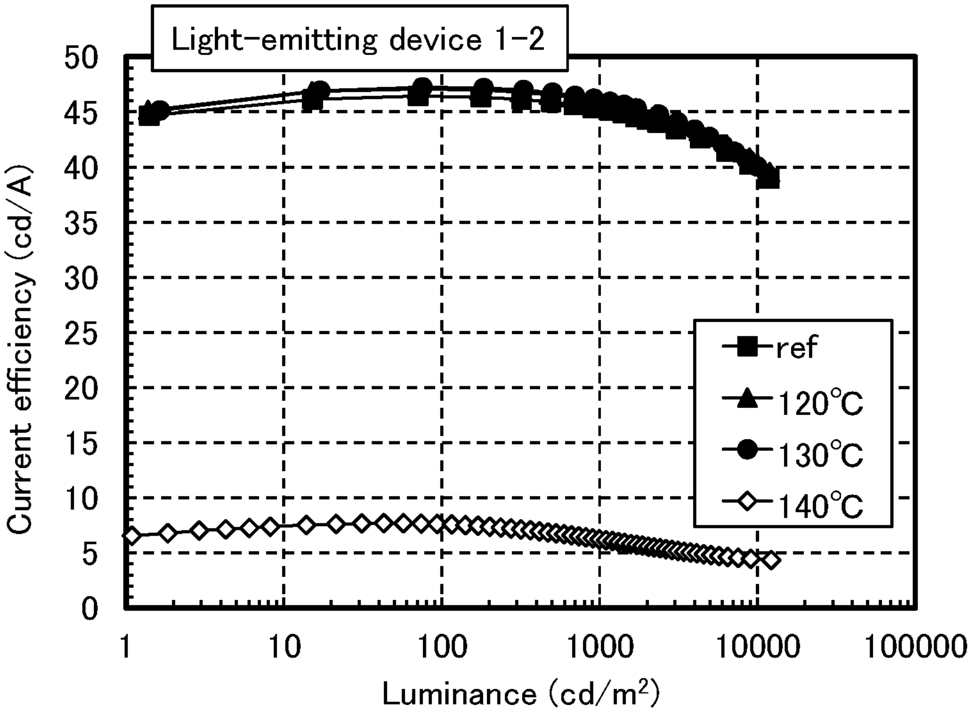
FIG. 26 shows the current efficiency-luminance characteristics of the light-emitting device 1-2.
Figure 27:
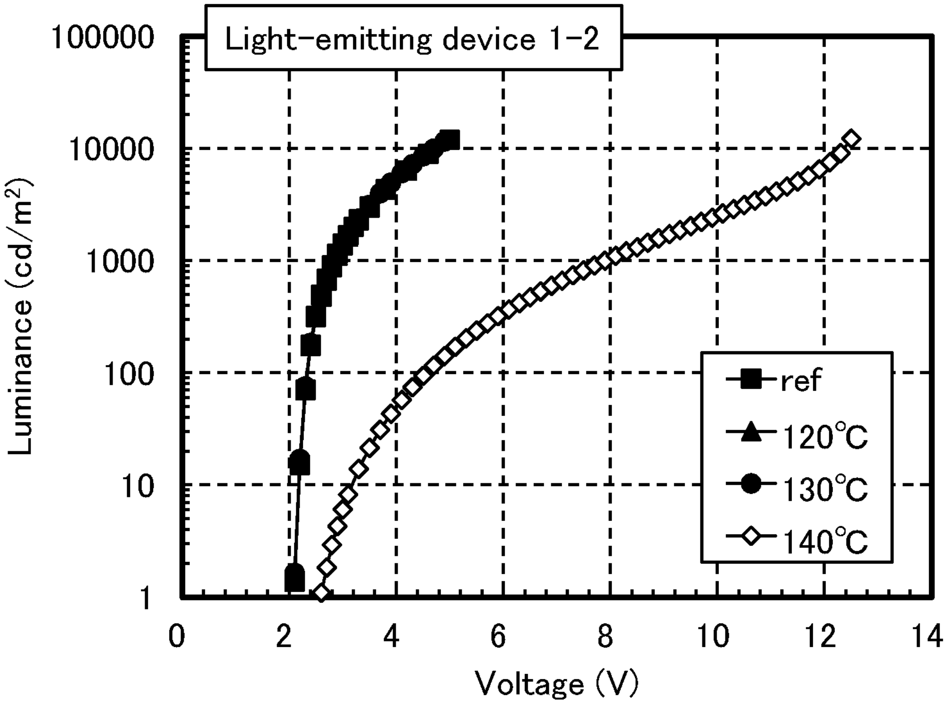
FIG. 27 shows the luminance-voltage characteristics of the light-emitting device 1-2.
Figure 28:
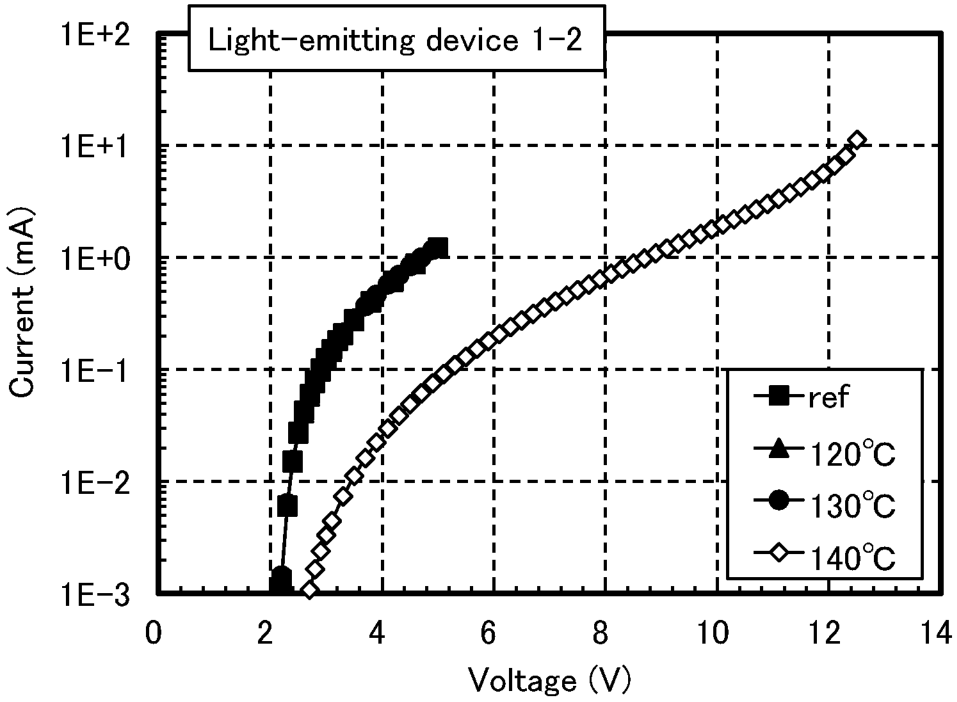
FIG. 28 shows the current-voltage characteristics of the light-emitting device 1-2.
Figure 29:
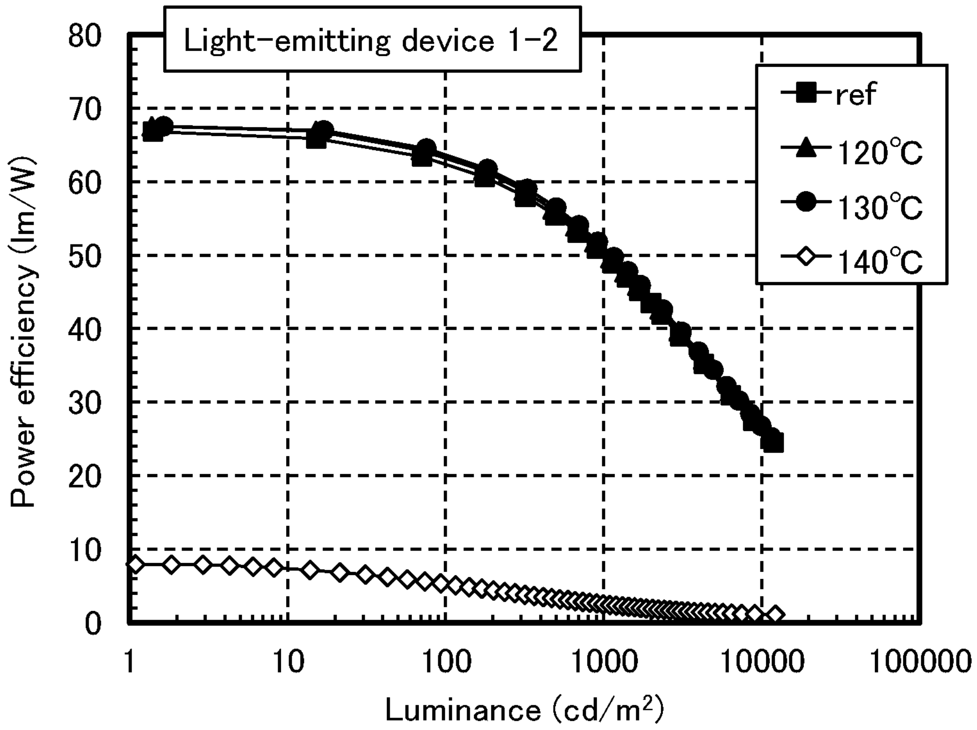
FIG. 29 shows the power efficiency-current density characteristics of the light-emitting device 1-2.
Figure 30:
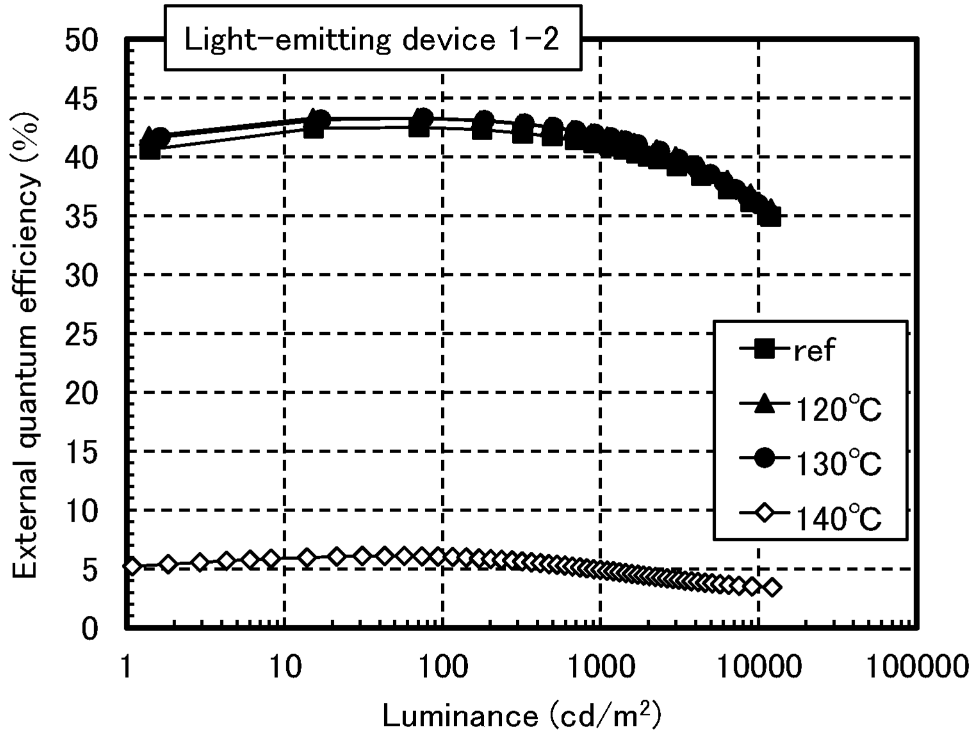
FIG. 30 shows the external quantum efficiency-luminance characteristics of the light-emitting device 1-2.
Figure 31:
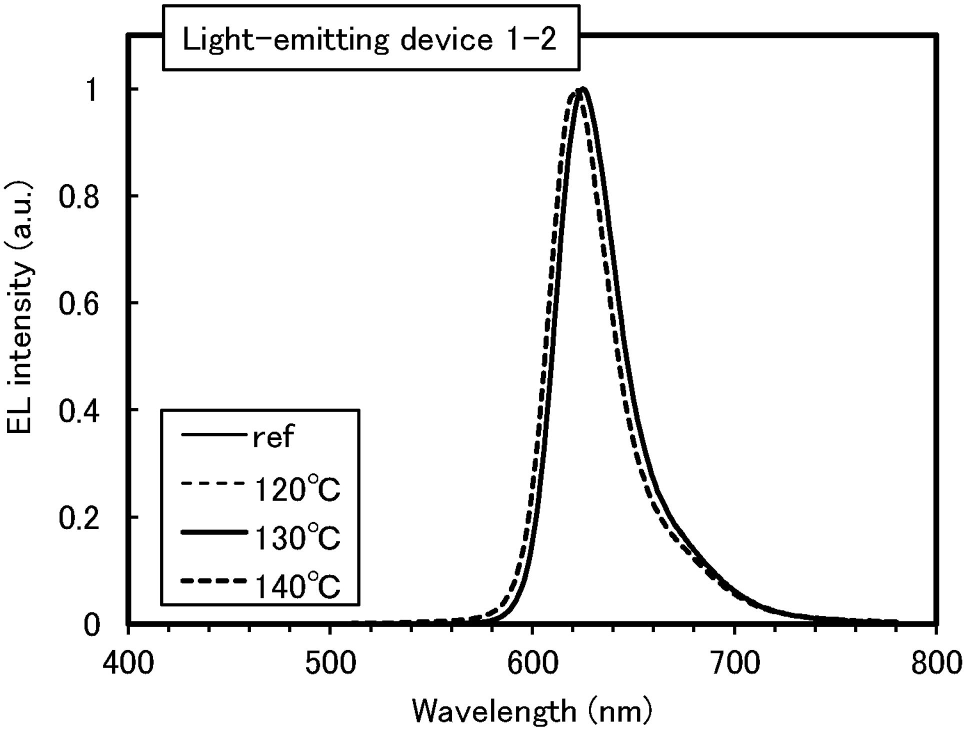
FIG. 31 shows the emission spectra of the light-emitting device 1-2.
Figure 32:
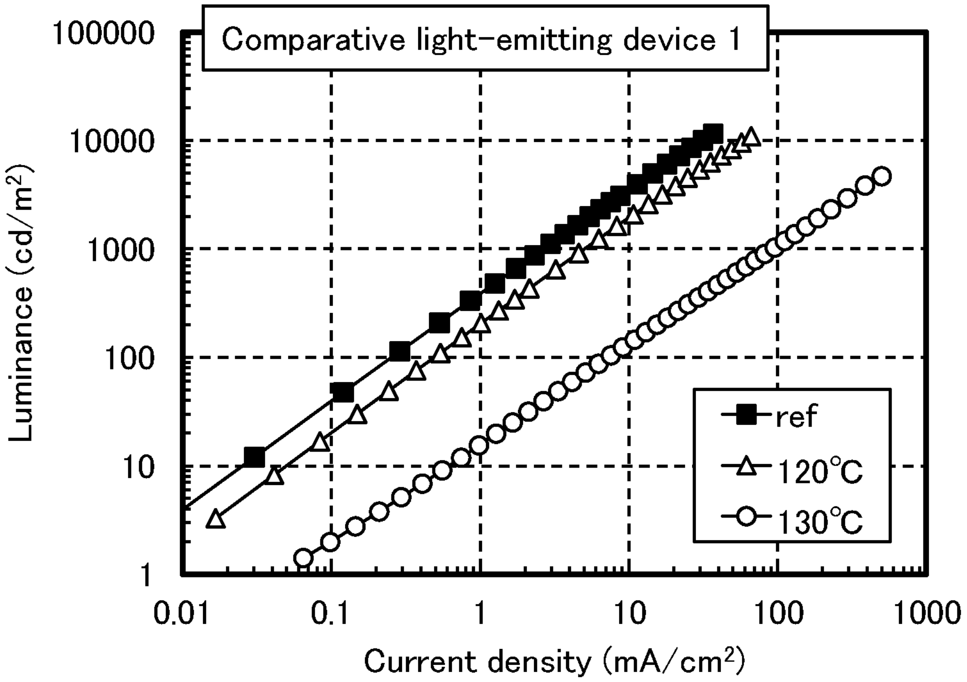
FIG. 32 shows the luminance-current density characteristics of a comparative light-emitting device 1.
Figure 33:
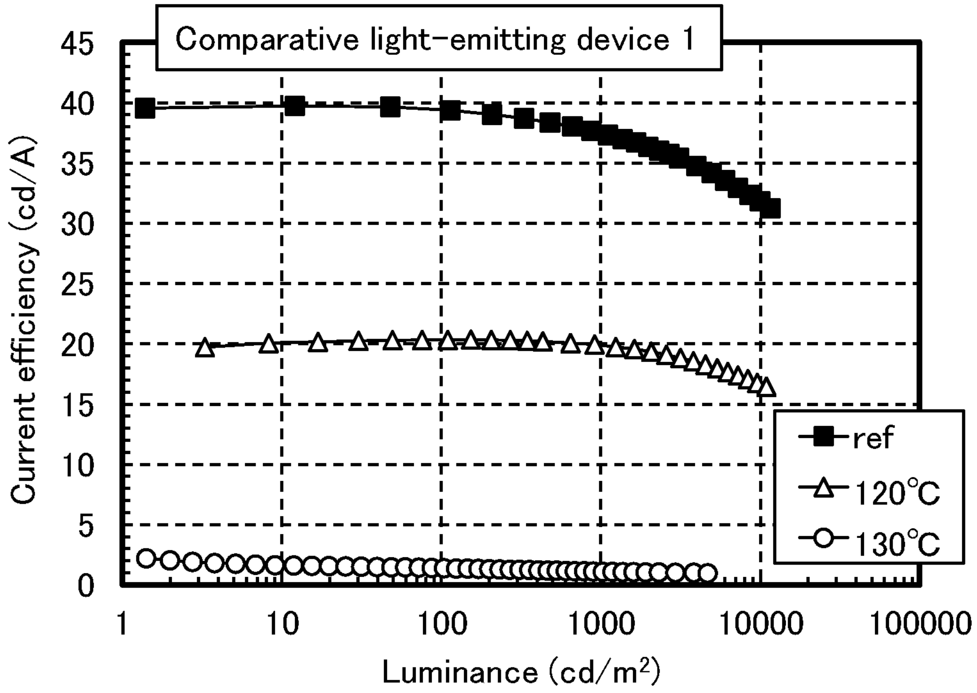
FIG. 33 shows the current efficiency-luminance characteristics of the comparative light-emitting device 1.
Figure 34:
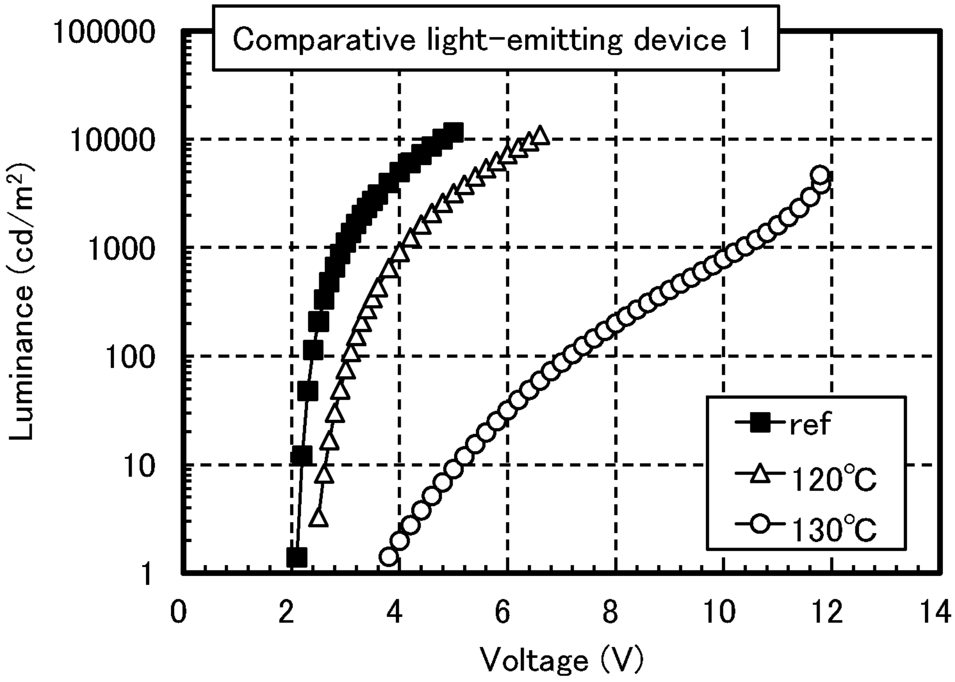
FIG. 34 shows the luminance-voltage characteristics of the comparative light-emitting device 1.
Figure 35:
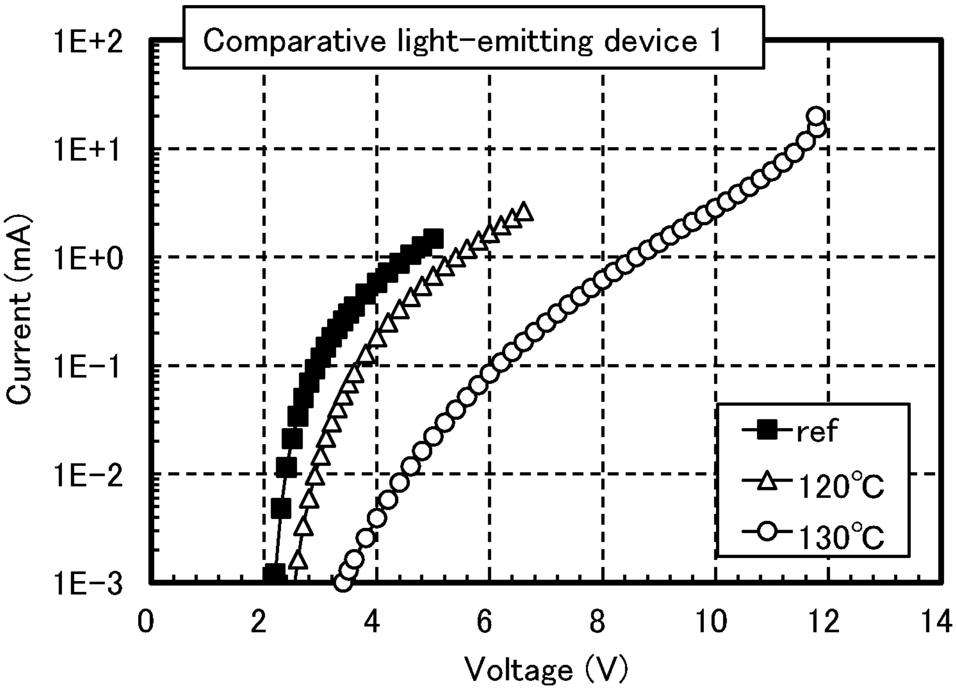
FIG. 35 shows the current-voltage characteristics of the comparative light-emitting device 1.
Figure 36:
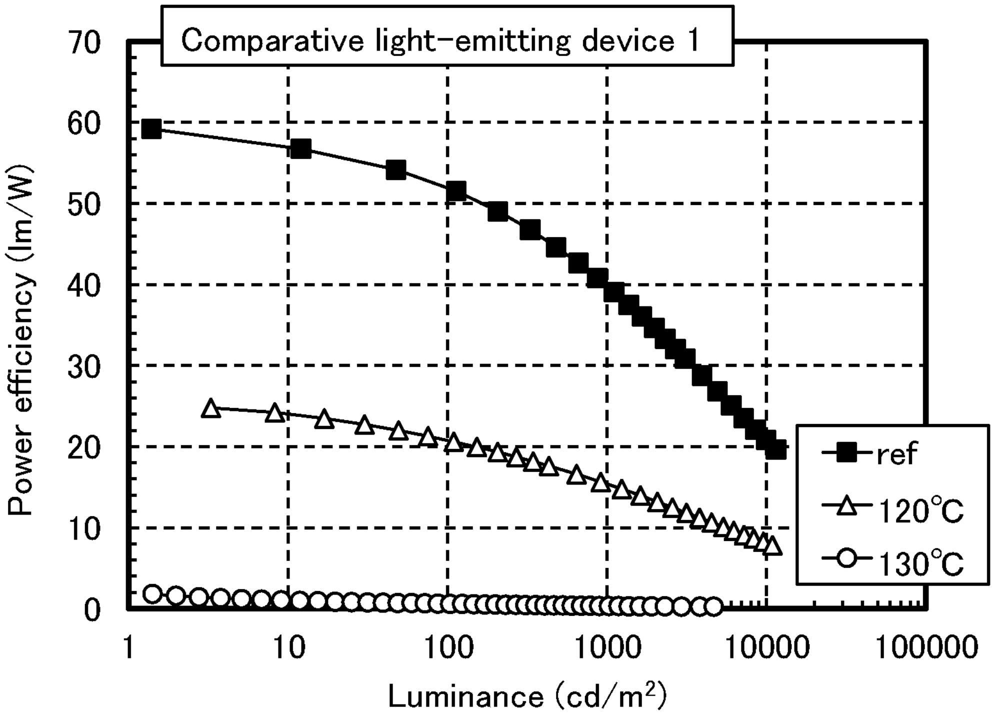
FIG. 36 shows the power efficiency-luminance characteristics of the comparative light-emitting device 1.
Figure 37:
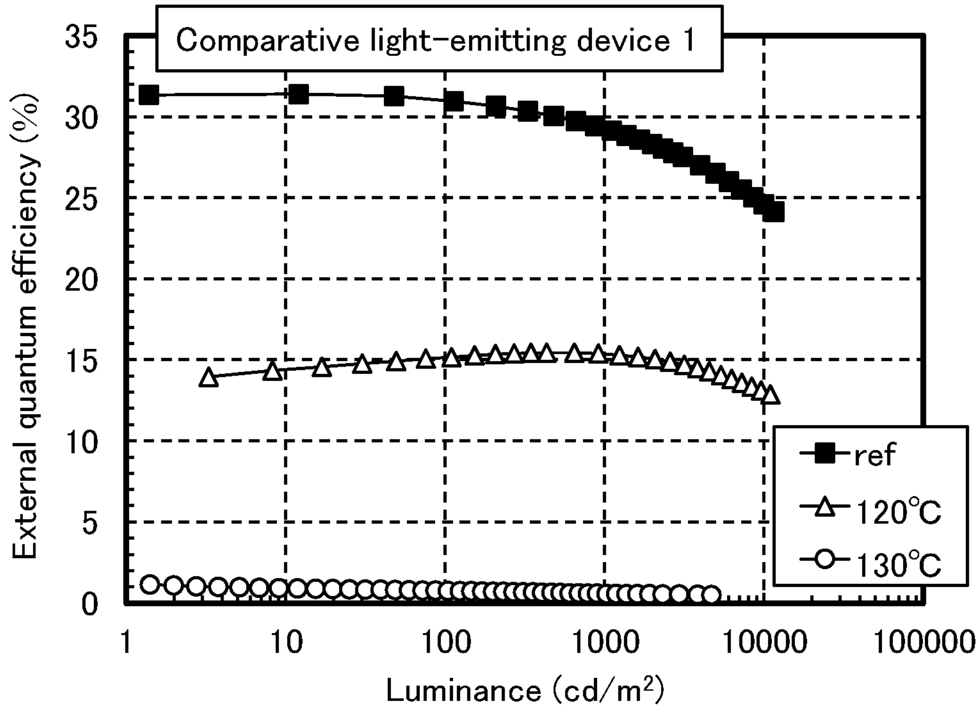
FIG. 37 shows the external quantum efficiency-luminance characteristics of the comparative light-emitting device 1.
Figure 38:
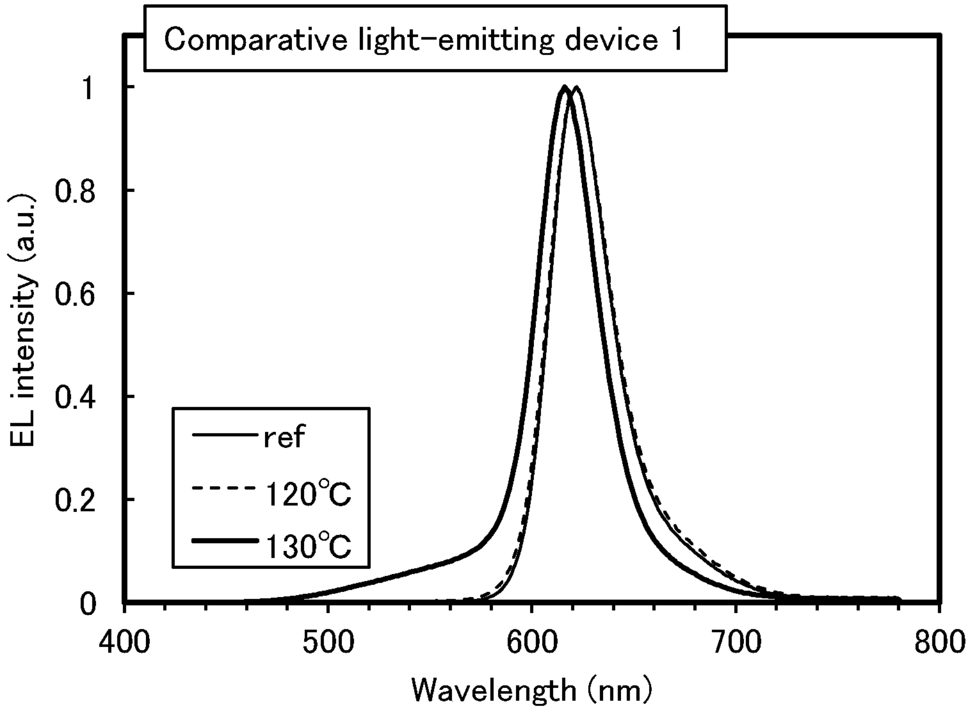
FIG. 38 shows the emission spectra of the comparative light-emitting device 1.

FIG. 18 shows the luminance-current density characteristics, FIG. 19 shows the current efficiency-luminance characteristics, FIG. 20 shows the luminance-voltage characteristics, FIG. 21 shows the current-voltage characteristics, FIG. 22 shows the power efficiency-luminance characteristics, FIG. 23 shows the external quantum efficiency-luminance characteristics, and FIG. 24 shows the emission spectra of the light-emitting device 1-1 before the heating preservation test (ref), after the preservation test at 120° C., after the preservation test at 130° C., and after the preservation test at 140° C. FIG. 25 shows the luminance-current density characteristics, FIG. 26 shows the current efficiency-luminance characteristics, FIG. 27 shows the luminance-voltage characteristics, FIG. 28 shows the current-voltage characteristics, FIG. 29 shows the power efficiency-luminance characteristics, FIG. 30 shows the external quantum efficiency-luminance characteristics, and FIG. 31 shows the emission spectra of the light-emitting device 1-2 before the heating preservation test (ref), after the preservation test at 120° C., after the preservation test at 130° C., and after the preservation test at 140° C. FIG. 32 shows the luminance-current density characteristics, FIG. 33 shows the current efficiency-luminance characteristics, FIG. 34 shows the luminance-voltage characteristics, FIG. 35 shows the current-voltage characteristics, FIG. 36 shows the power efficiency-luminance characteristics, FIG. 37 shows the external quantum efficiency-luminance characteristics, and FIG. 38 shows the emission spectra of the comparative light-emitting device 1 before the heating preservation test (ref), after the preservation test at 120° C., and after the preservation test at 130° C.

The main characteristics at a luminance of around 1000 cd/$m^2$ of the light-emitting device 1-1, the light-emitting device 1-2, and the comparative light-emitting device 1 are shown in Table 5, Table 6, and Table 7, respectively. Note that luminance, CIE chromaticity, and emission spectra were measured with a spectroradiometer (SR-UL1R manufactured by TOPCON TECHNOHOUSE CORPORATION). The measurement of the light-emitting devices was performed at room temperature (in an atmosphere kept at 23° C.).

TABLE 5

| Light-emitting device 1-1 | | | | | | | | |
|---|---|---|---|---|---|---|---|---|
| | Voltage (V) | Current (mA) | Current density (mA/$cm^2$) | Chromaticity x | Chromaticity y | Current efficiency (cd/A) | Power efficiency (lm/W) | External quantum efficiency (%) |
| ref | 2.9 | 0.09 | 2.2 | 0.690 | 0.310 | 41.8 | 45.3 | 39.5 |
| 120° C. | 3.0 | 0.10 | 2.6 | 0.690 | 0.310 | 42.3 | 44.3 | 40.0 |
| 130° C. | 2.9 | 0.09 | 2.3 | 0.690 | 0.310 | 42.5 | 46.0 | 40.2 |
| 140° C. | 2.9 | 0.09 | 2.2 | 0.690 | 0.310 | 42.5 | 46.0 | 40.3 |

TABLE 6

| Light-emitting device 1-2 | | | | | | | | |
|---|---|---|---|---|---|---|---|---|
| | Voltage (V) | Current (mA) | Current density (mA/cm²) | Chromaticity x | Chromaticity y | Current efficiency (cd/A) | Power efficiency (lm/W) | External quantum efficiency (%) |
| ref | 2.8 | 0.08 | 2.0 | 0.688 | 0.311 | 45.4 | 50.9 | 41.1 |
| 120° C. | 2.9 | 0.10 | 2.4 | 0.688 | 0.311 | 45.8 | 49.6 | 41.7 |
| 130° C. | 2.8 | 0.08 | 2.0 | 0.688 | 0.311 | 46.2 | 51.8 | 41.9 |
| 140° C. | 7.9 | 0.64 | 16.0 | 0.677 | 0.322 | 6.2 | 2.5 | 4.9 |

TABLE 7

| Comparative light-emitting device 1 | | | | | | | | |
|---|---|---|---|---|---|---|---|---|
| | Voltage (V) | Current (mA) | Current density (mA/cm²) | Chromaticity x | Chromaticity y | Current efficiency (cd/A) | Power efficiency (lm/W) | External quantum efficiency (%) |
| ref | 3.0 | 0.12 | 3.0 | 0.682 | 0.318 | 37.3 | 39.1 | 29.1 |
| 120° C. | 4.0 | 0.18 | 4.6 | 0.677 | 0.322 | 19.9 | 15.6 | 15.4 |
| 130° C. | 10.4 | 3.81 | 95.4 | 0.620 | 0.372 | 1.1 | 0.3 | 0.6 |

It was found from FIG. 18 to FIG. 38 that the light-emitting devices 1-1 and 1-2 had favorable characteristics without significant degradation even after the preservation test at 130° C. In particular, the light-emitting device 1-1 was found to have heat resistance high enough to withstand the preservation test at 140° C. In contrast, the comparative light-emitting device 1 had significant degradation in the characteristics after both of the preservation tests at 120° C. and 130° C. From the above, it was found that the use of 11mDBtBPPnfpr and 2mPCCzPDBq, both of which is an organic compound having a high Tg, enabled a light-emitting device to have extremely high heat resistance. Note that 11mDBtBPPnfpr is the organic compound represented by General Formula (G100) in Embodiment 1, and 2mPCCzPDBq is the organic compound represented by General Formula (G300) in Embodiment 1. These materials were found to have a great effect particularly when used in combination.

Example 2

In this example, a light-emitting device 2 of one embodiment of the present invention and a comparative light-emitting device 2 are described. Note that the light-emitting device 2 and the comparative light-emitting device 2 each refer to a plurality of light-emitting devices having the same structure. In this example, there are three light-emitting devices 2 and three comparative light-emitting devices 2 (a light-emitting device 2-ref, a light-emitting device 2-120° C., a light-emitting device 2-130° C., a comparative light-emitting device 2-ref, a comparative light-emitting device 2-120° C., and a comparative light-emitting device 2-130° C.), which differ in heating temperature applied in the fabrication. Structural formulae of organic compounds used in this example are shown below.

[Chemical Formula 39]

(i)

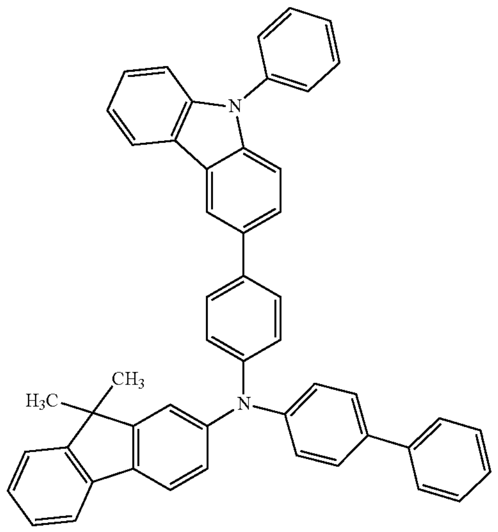

PCBBiF (ii)

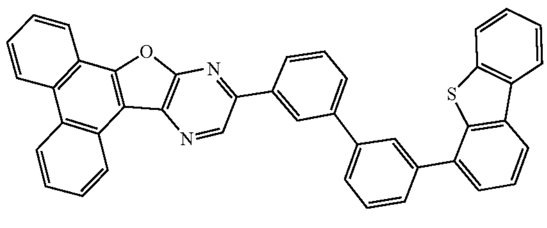

11mDBtBPPnfpr

-continued (iv)

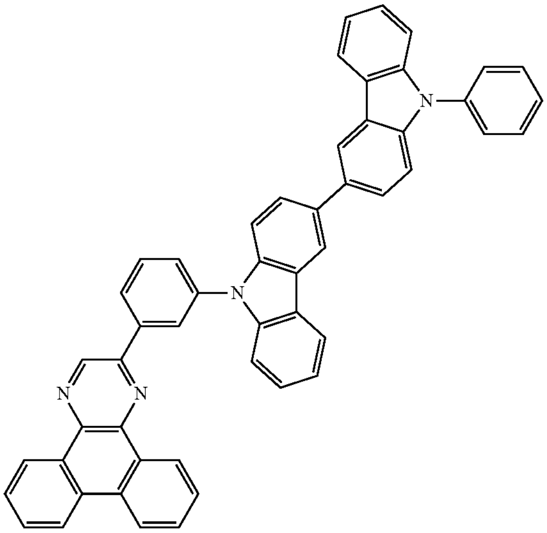

2mPCCzPDBq (v)

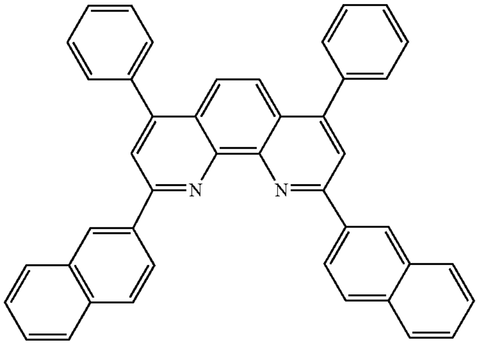

NBPhen (vi)

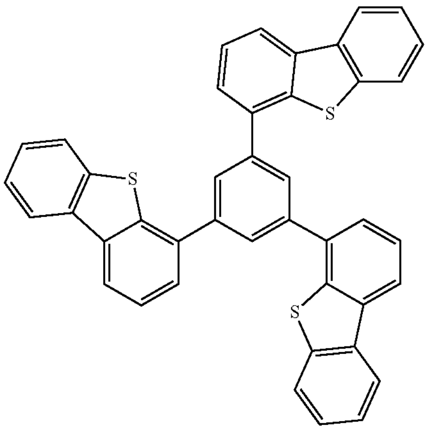

DBT3P-II

-continued (vii)

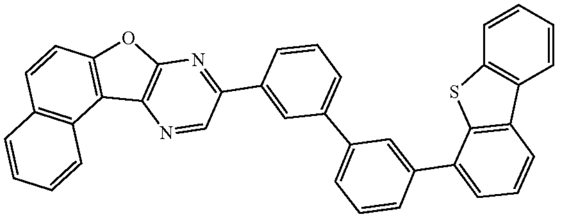

9mDBtBPNfpr (ix)

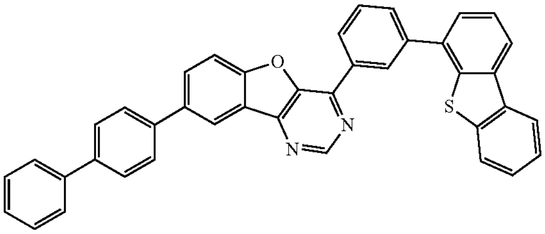

8BP-4mDBtPDfpm (Method for Fabricating Light-Emitting Device 2)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 85 nm by a sputtering method, whereby the anode 101 was formed. The electrode area was set to 4 $mm^2$ (2 mm×2 mm). Note that the transparent electrode functions as the anode, and the transparent electrode and the reflective electrode can be collectively regarded as the anode 101.

Next, in pretreatment for forming the light-emitting device over a substrate, a surface of the substrate was washed with water and baked at 200° C. for one hour, and then UV ozone treatment was performed for 370 seconds.

After that, the substrate was transferred into a vacuum evaporation apparatus where the pressure had been reduced to approximately $1\times10^{-4}$ Pa, and was subjected to vacuum baking at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Over the anode 101, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (viii) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.03, whereby the hole-injection layer 111 was formed.

Then, PCBBiF was deposited by evaporation to a thickness of 115 nm over the hole-injection layer 111, whereby the hole-transport layer 112 was formed.

Subsequently, over the hole-transport layer 112, 11-[(3'-dibenzothiophen-4-yl)biphenyl-3-yl]phenanthro[9',10':4,5]furo[2,3-b]pyrazine (abbreviation: 11mDBtBPPnfpr) represented by Structure Formula (ii), PCBBiF, and the phosphorescent dopant OCPG-006 were deposited by co-evaporation to a thickness of 50 nm such that the weight ratio of 11mDBtBPPnfpr to PCBBiF and OCPG-006 was 0.7:0.3:0.1, whereby the light-emitting layer 113 was formed.

After that, over the light-emitting layer 113, 2-{3-[3-(N-phenyl-9H-carbazol-3-yl)-9H-carbazol-9-yl]phenyl}dibenzo[f,h]quinoxaline (abbreviation: 2mPCCzPDBq) represented by Structural Formula (iv) was deposited by evaporation to a thickness of 10 nm to form a first electron-transport layer, and then 2,9-di(2-naphthyl)-4,7-diphenyl-1,10-phenanthroline (abbreviation: NBPhen) represented by Structural Formula (v) was deposited by evaporation to a thickness of 20 nm to form a second electron-transport layer, whereby the electron-transport layer 114 was formed.

Subsequently, as treatment simulating the fabrication of an MML device, over the light-emitting device 2 fabricated up to the electron-transport layer 114, an aluminum oxide film was formed to a thickness of 30 nm by an atomic layer deposition (ALD) method using trimethyl aluminum (abbreviation: TMA) as a precursor and water vapor as an oxidizer. After that, the light-emitting device 2-ref was not heated, the light-emitting device 2-120° C. was heated at 120° C. for one hour, and the light-emitting device 2-130° C. was heated at 130° C. for one hour.

Next, wet etching treatment was performed for 450 seconds using an aqueous solution containing tetramethyl ammonium hydroxide (TMAH) at 0.2% to 5.0% (manufactured by Tokyo Ohka Kogyo Co., Ltd., Product name: NMD3) to remove the aluminum oxide film, washing with pure water was performed, and then heating was performed at 80° C. under high vacuum for one hour.

After that, lithium fluoride (LiF) and ytterbium (Yb) were deposited by co-evaporation to a thickness of 2 nm such that the weight ratio of LiF to Yb was 1:1 to form the electron-injection layer 115, and lastly silver (Ag) and magnesium (Mg) were deposited by co-evaporation to a thickness of 15 nm such that the volume ratio of Ag to Mg was 1:0.1 to form the cathode 102, whereby the light-emitting device 2 was fabricated. The cathode 102 is a transflective electrode having a function of reflecting light and a function of transmitting light; thus, the light-emitting device 2 is a top-emission device in which light is extracted through the cathode 102. Over the cathode 102, 4,4',4"-(benzene-1,3,5-triyl)tri(dibenzothiophene) (abbreviation: DBT3P-II) represented by Structural Formula (vi) was deposited by evaporation to a thickness of 70 nm as a cap layer so that light extraction efficiency can be improved.

(Method for Fabricating Comparative Light-Emitting Device 2)

A comparative light-emitting device 2 was fabricated in a manner similar to that of the light-emitting device 2 except that Ag in the anode 101 was replaced with an alloy of silver, palladium, and copper (also referred to as Ag—Pd—Cu or APC), 11mDBtBPPnfpr was replaced with 9-[3'-(dibenzothiophen-4-yl)biphenyl-3-yl]naphtho[1',2':4,5]furo[2,3-b]pyrazine (abbreviation: 9mDBtBPNfpr) represented by Structural Formula (vii), and 2mPCCzPDBq was replaced with 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm) represented by Structural Formula (ix).

The stacked-layer structures of the light-emitting device 2 and the comparative light-emitting device 2 are listed in the following tables.

TABLE 8

| Light-emitting device 2 | | | | |
|---|---|---|---|---|
| Functional layer | | Substance | Mixture ratio | Film thickness (nm) |
| Electron-injection layer | | LiF:Yb | — | 2 |
| Electron-transport | 2 | NBPhen | — | 20 |
| layer | 1 | 2mPCCzPDBq | — | 10 |
| Light-emitting layer | | 11mDBtBPPnfpr:PCBBiF:OCPG-006 | 0.7:0.3:0.05 | 50 |
| Hole-transport layer | | PCBBiF | — | 115 |
| Hole-injection layer | | PCBBiF:OCHD-003 | 1:0.03 | 10 |

TABLE 9

| Comparative light-emitting device 2 | | | | |
|---|---|---|---|---|
| Functional layer | | Substance | Mixture ratio | Film thickness (nm) |
| Electron-injection layer | | LiF:Yb | — | 2 |
| Electron-transport | 1 | NBPhen | — | 20 |
| layer | 2 | 8BP-4mDBtPBfpm | — | 10 |
| Light-emitting layer | | 9mDBtBPNfpr:PCBBiF:OCPG-006 | 0.7:0.3:0.05 | 50 |
| Hole-transport layer | | PCBBiF | — | 115 |
| Hole-injection layer | | PCBBiF:OCHD-003 | 1:0.03 | 10 |

The glass transition temperatures (Tg) of the main substances used are listed in the following table.

TABLE 10

| Abbreviation of substance | Tg (° C.) |
|---|---|
| PCBBiF | 127 |
| 11mDBtBPPnfpr | 130 |
| 2mPCCzPDBq | 160 |
| 9mDBtBPNfpr | 110 |
| 8BP-4mDBtPBfpm | 112 |

The light-emitting device 2 and the comparative light-emitting device 2 were sealed with a glass substrate in a glove box containing a nitrogen atmosphere so as not to be exposed to the air (a sealing material was applied to surround the devices and UV treatment and heat treatment at 80° C. for one hour were performed at the time of sealing). Then, the initial characteristics of the light-emitting devices were measured.

Figure 39:
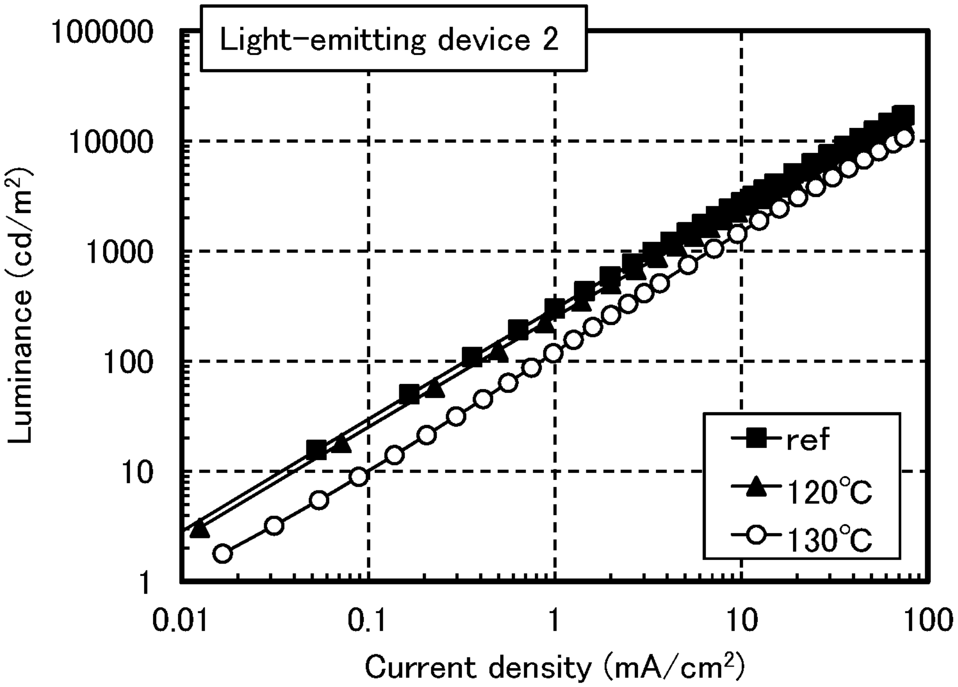
FIG. 39 shows the luminance-current density characteristics of a light-emitting device 2.
Figure 40:
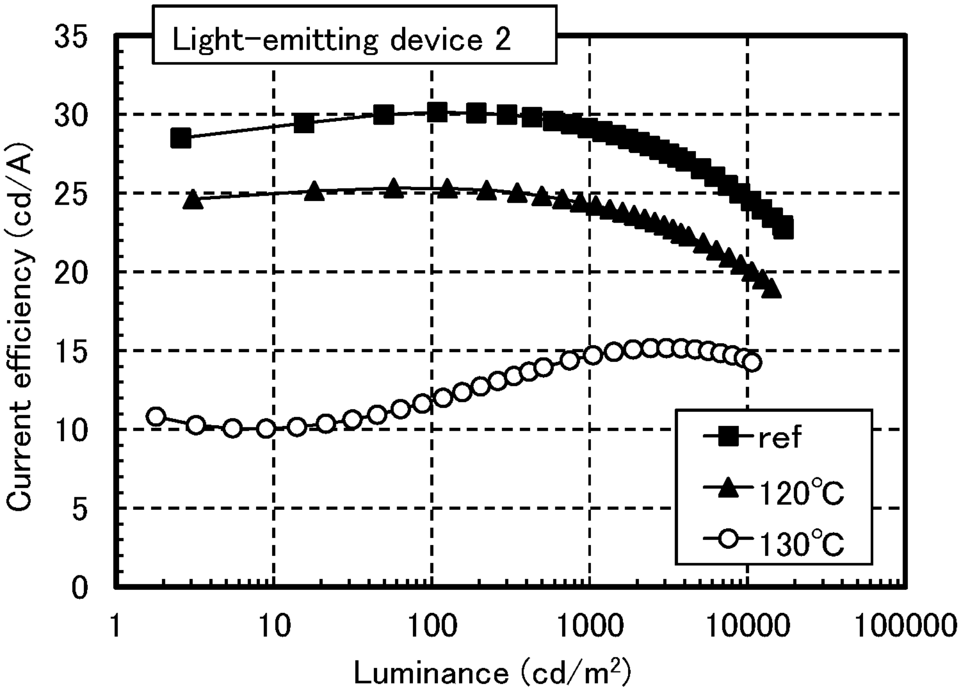
FIG. 40 shows the current efficiency-luminance characteristics of the light-emitting device 2.
Figure 41:
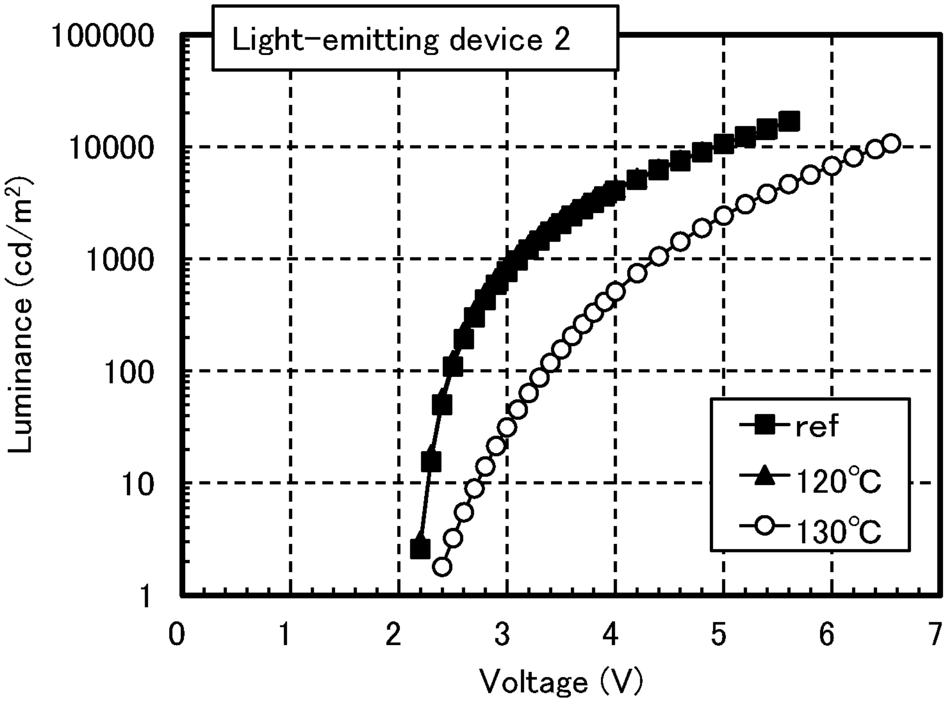
FIG. 41 shows the luminance-voltage characteristics of the light-emitting device 2.
Figure 42:
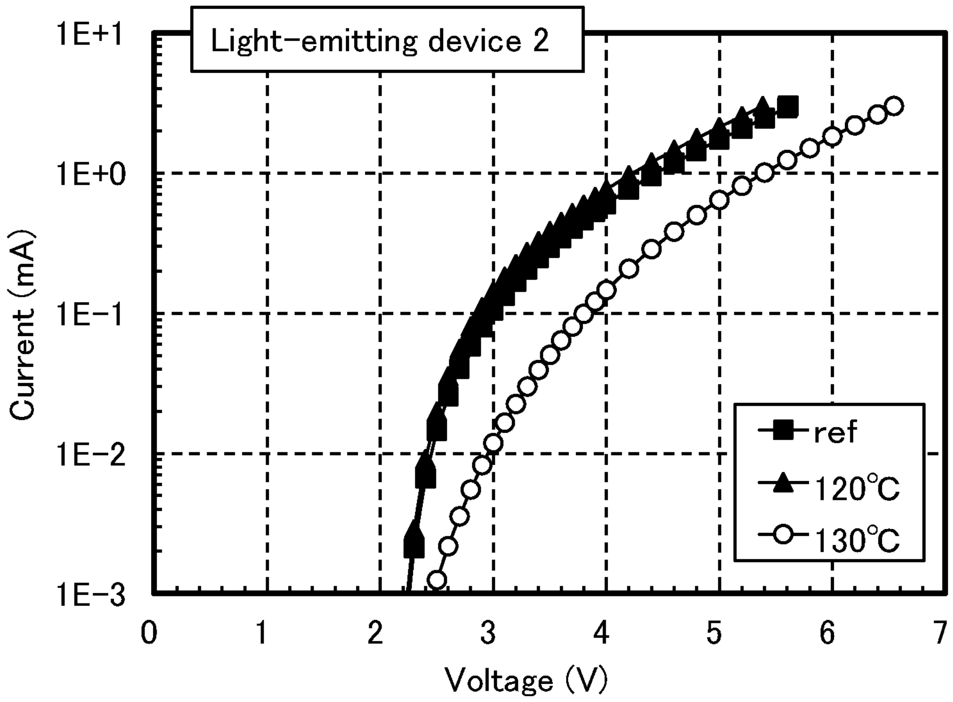
FIG. 42 shows the current-voltage characteristics of the light-emitting device 2.
Figure 43:
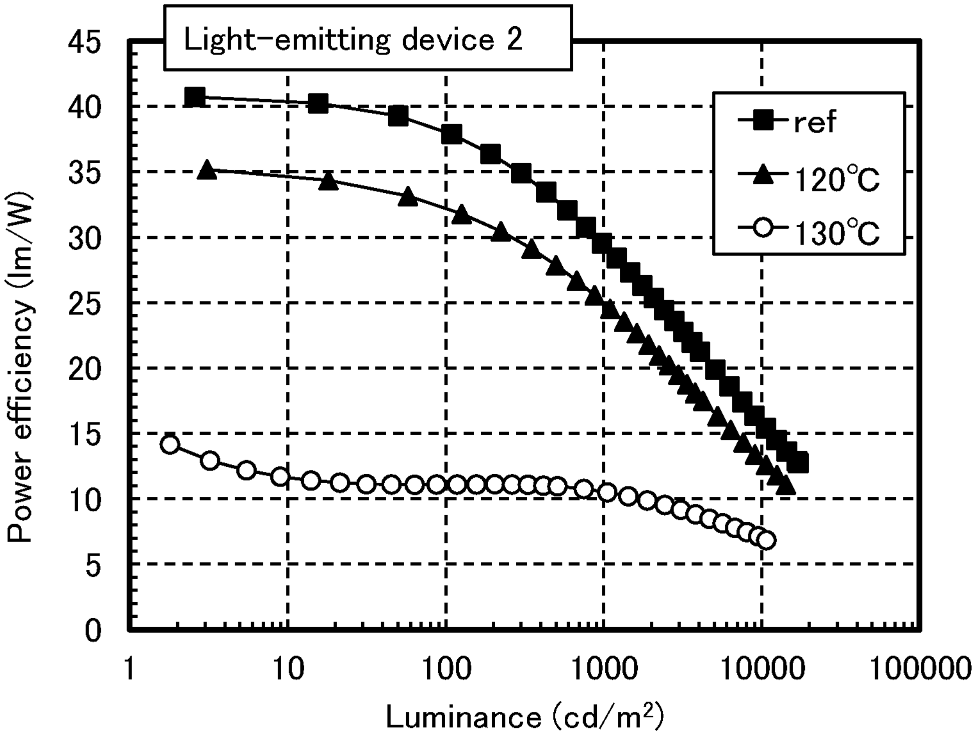
FIG. 43 shows the power efficiency-luminance characteristics of the light-emitting device 2.
Figure 44:
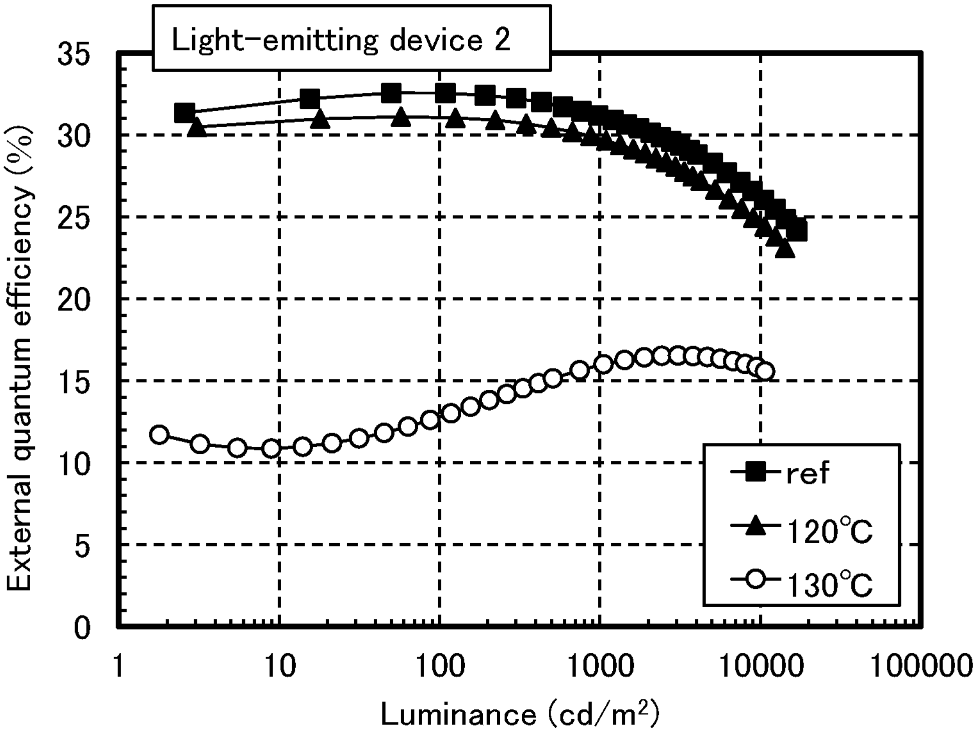
FIG. 44 shows the external quantum efficiency-luminance characteristics of the light-emitting device 2.
Figure 45:
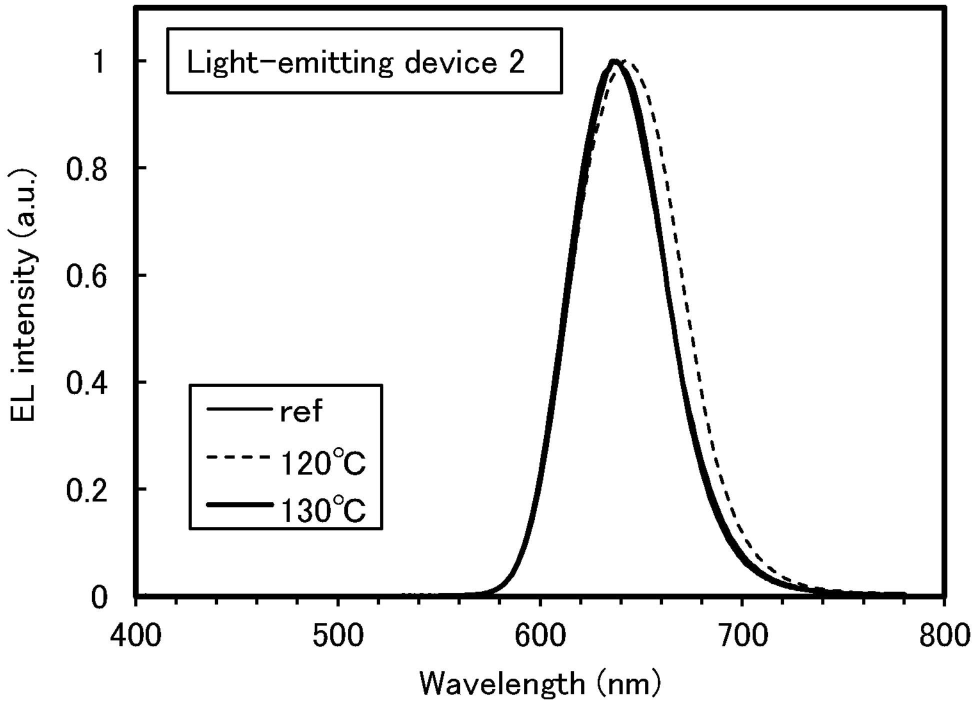
FIG. 45 shows the emission spectra of the light-emitting device 2.
Figure 46:
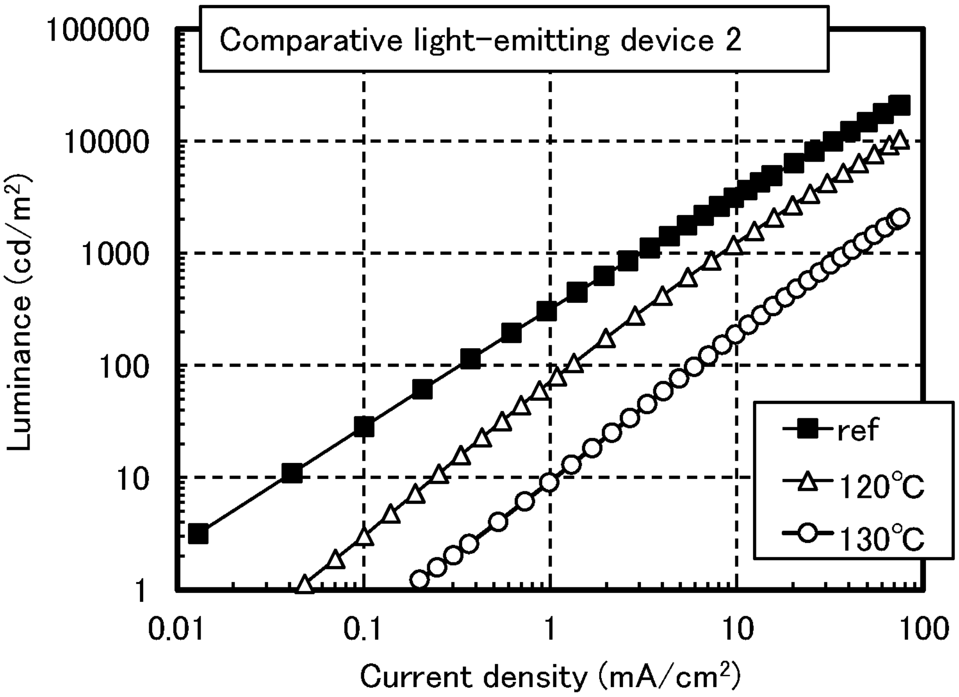
FIG. 46 shows the luminance-current density characteristics of a comparative light-emitting device 2.
Figure 47:
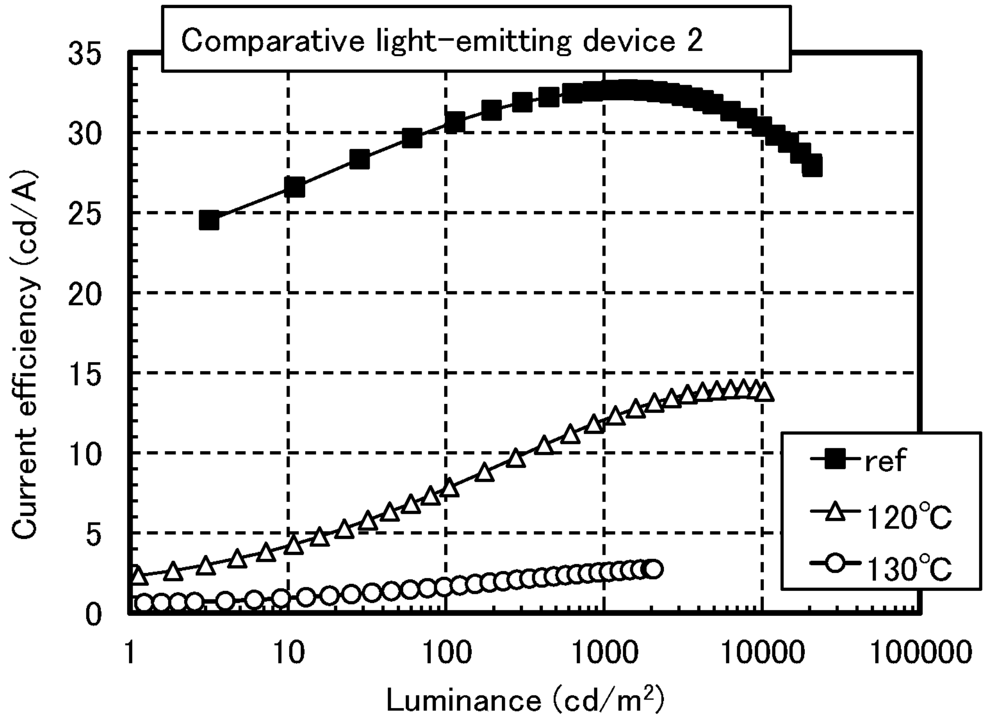
FIG. 47 shows the current efficiency-luminance characteristics of the comparative light-emitting device 2.
Figure 48:
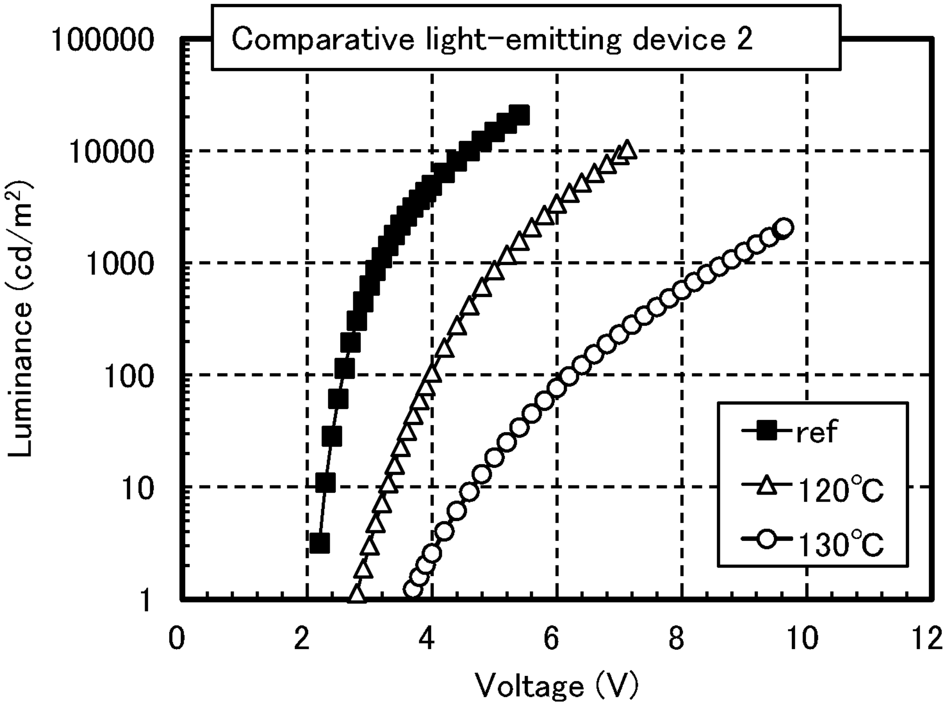
FIG. 48 shows the luminance-voltage characteristics of a comparative light-emitting device 2.
Figure 49:
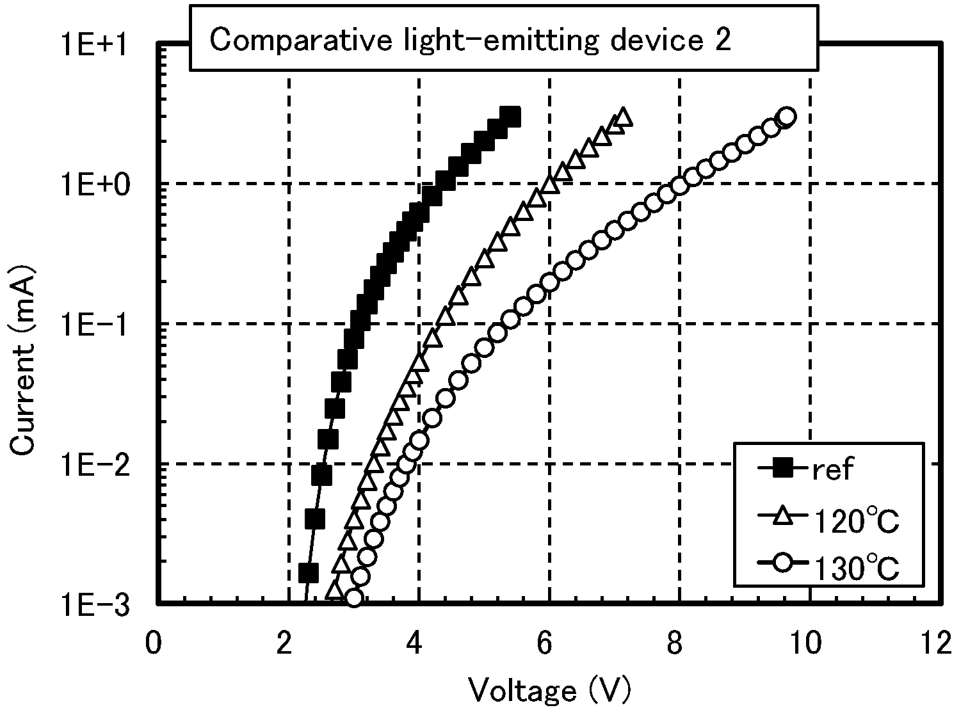
FIG. 49 shows the current-voltage characteristics of a comparative light-emitting device 2.
Figure 50:
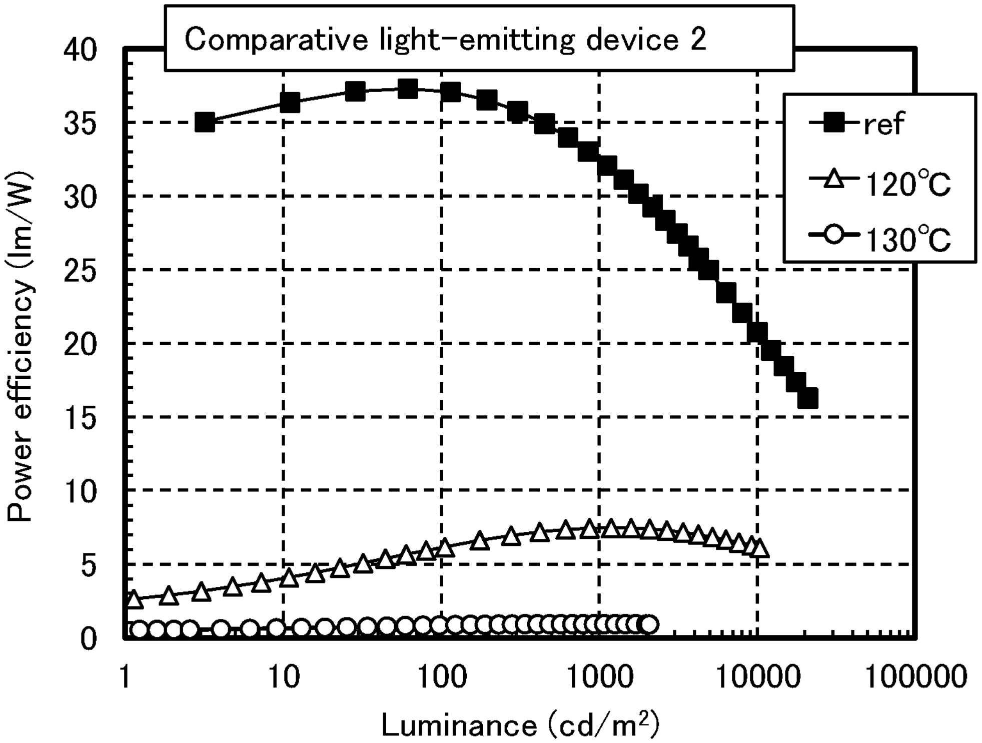
FIG. 50 shows the power efficiency-luminance characteristics of a light-emitting device 2.
Figure 51:
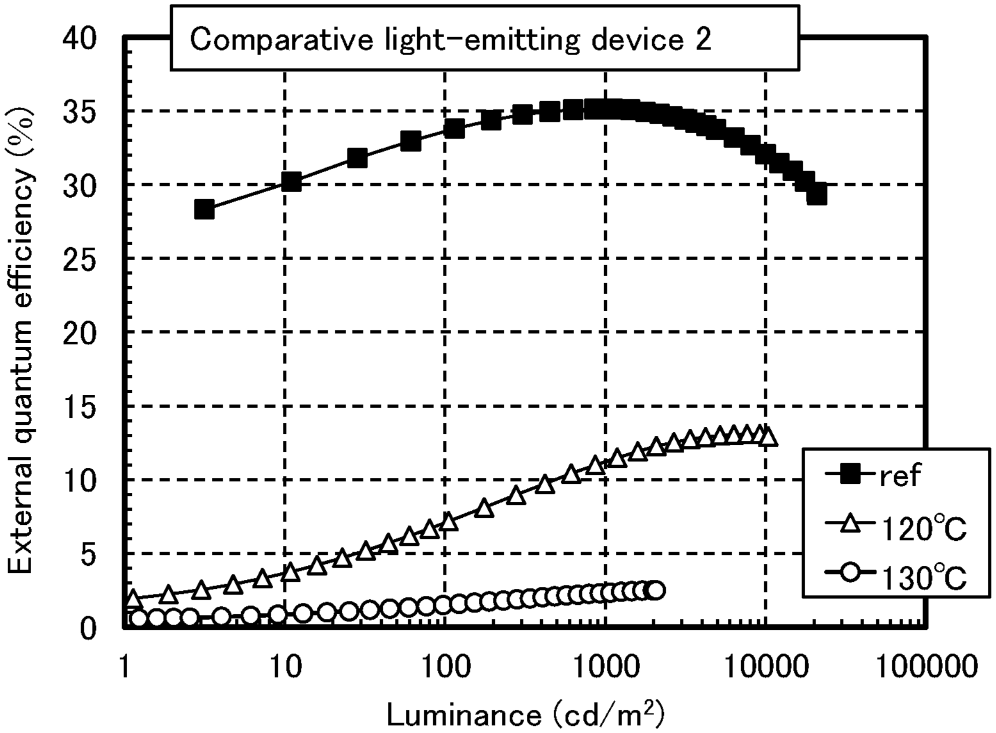
FIG. 51 shows the external quantum efficiency-luminance characteristics of a comparative light-emitting device 2.
Figure 52:
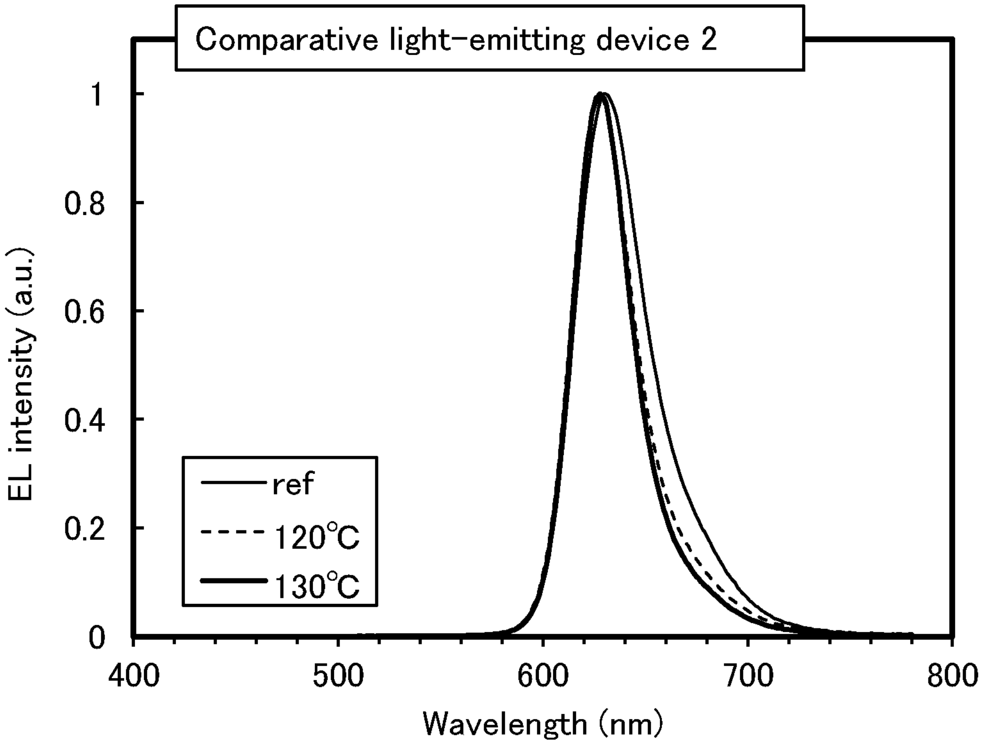
FIG. 52 shows the emission spectra of a comparative light-emitting device 2.

FIG. 39 shows the luminance-current density characteristics of the light-emitting device 2. FIG. 40 shows the current efficiency-luminance characteristics thereof. FIG. 41 shows the luminance-voltage characteristics thereof. FIG. 42 shows the current-voltage characteristics thereof. FIG. 43 shows the power efficiency-luminance characteristics thereof. FIG. 44 shows the external quantum efficiency-luminance characteristics thereof. FIG. 45 shows the emission spectrum thereof. FIG. 46 shows the luminance-current density characteristics of the comparative light-emitting device 2. FIG. 47 shows the current efficiency-luminance characteristics thereof. FIG. 48 shows the luminance-voltage characteristics thereof. FIG. 49 shows the current-voltage characteristics thereof. FIG. 50 shows the power efficiency-luminance characteristics thereof. FIG. 51 shows the external quantum efficiency-luminance characteristics thereof. FIG. 52 shows the emission spectrum thereof.

The main characteristics at a luminance of around 1000 cd/m$^2$ of the light-emitting device 2 and the comparative light-emitting device 2 are shown in Table 11 and Table 12, respectively. Note that luminance, CIE chromaticity, and emission spectra were measured with a spectroradiometer (SR-UL1R manufactured by TOPCON TECHNOHOUSE CORPORATION). The measurement of the light-emitting devices was performed at room temperature (in an atmosphere kept at 23° C.).

TABLE 11

Light-emitting device 2

| | Voltage (V) | Current (mA) | Current density (mA/cm$^2$) | Chromaticity x | Chromaticity y | Current efficiency (cd/A) | Power efficiency (lm/W) | External quantum efficiency (%) |
|---|---|---|---|---|---|---|---|---|
| ref | 3.1 | 0.13 | 3.3 | 0.687 | 0.312 | 29.1 | 29.5 | 31.2 |
| 120° C. | 3.1 | 0.18 | 4.5 | 0.689 | 0.310 | 24.2 | 24.5 | 29.7 |
| 130° C. | 4.4 | 0.29 | 7.1 | 0.688 | 0.311 | 14.7 | 10.5 | 16.0 |

TABLE 12

Comparative light-emitting device 2

| | Voltage (V) | Current (mA) | Current density (mA/cm$^2$) | Chromaticity x | Chromaticity y | Current efficiency (cd/A) | Power efficiency (lm/W) | External quantum efficiency (%) |
|---|---|---|---|---|---|---|---|---|
| ref | 3.2 | 0.14 | 3.4 | 0.695 | 0.305 | 32.7 | 32.1 | 35.1 |
| 120° C. | 5.0 | 0.29 | 7.3 | 0.690 | 0.310 | 11.8 | 7.4 | 11.0 |
| 130° C. | 8.8 | 1.66 | 41.6 | 0.691 | 0.309 | 2.6 | 0.9 | 2.3 |

As shown in FIG. 39 to FIG. 52, the light-emitting device 2 showed favorable results without significant degradation in the conditions of no heating and heating at 120° C. in the treatment simulating the fabrication of the MML device. In contrast, the comparative light-emitting device 2 significantly deteriorated in heating at 120° C. From the above, 11mDBtBPPnfpr and 2mPCCzPDBq used in the light-emitting device 2 were found to be organic compounds having heat resistance high enough to withstand heating at 120° C. in the fabrication. Note that 11mDBtBPPnfpr is the organic compound represented by General Formula (G100) in Embodiment 1, and 2mLPCCzPDBq is the organic compound represented by General Formula (G300) in Embodiment 1.

Note that the light-emitting device 2 and the comparative light-emitting device 2 of this example are fabricated through heat treatment, formation of a mask layer (corresponding to the aluminum oxide film), and removal of the mask layer, which are main stresses applied on the EL layers in the MML process. That is, it can be said that the results of this example are evaluation of the characteristics of the light-emitting device of the light-emitting apparatus fabricated through the MML process.

This application is based on Japanese Patent Application Serial No. 2021-118223 filed with Japan Patent Office on Jul. 16, 2021, the entire contents of which are hereby incorporated by reference.

What is claimed is:

1. A light-emitting apparatus comprising:

a first light-emitting device and a second light-emitting device that are adjacent to each other over an insulating surface, wherein the first light-emitting device comprises a first anode, a first cathode, and a first EL layer interposed between the first anode and the first cathode, wherein the second light-emitting device comprises a second anode, a second cathode, and a second EL layer interposed between the second anode and the second cathode, wherein the first EL layer comprises a first light-emitting layer and a first layer, wherein the first layer is positioned between the first light-emitting layer and the first cathode, wherein the second EL layer comprises a second light-emitting layer, wherein the first light-emitting layer comprises a first organic compound, a second organic compound, and a first light-emitting substance, wherein the first layer comprises a third organic compound, wherein the second light-emitting layer comprises a second light-emitting substance, wherein the first light-emitting substance emits red light, wherein a distance between an end portion of the first light-emitting layer and an end portion of the second light-emitting layer facing each other is greater than or equal to 2 μm and less than or equal to 5 μm, wherein the first organic compound comprises a condensed heteroaromatic ring skeleton comprising a diazine ring, and wherein the third organic compound comprises a bicarbazole skeleton and a heteroaromatic ring skeleton comprising one selected from a pyridine ring, a diazine ring, and a triazine ring.

2. The light-emitting apparatus according to claim 1, wherein the third organic compound comprises a bicarbazole skeleton and a condensed heteroaromatic ring skeleton comprising a pyridine ring or a diazine ring.

3. The light-emitting apparatus according to claim 1, wherein the first organic compound is represented by General Formula (G100), (G100)

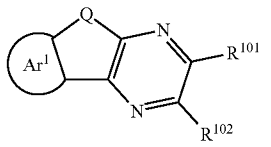

wherein Q represents an oxygen atom or a sulfur atom, wherein $Ar^1$ represents a substituted or unsubstituted aromatic ring or a substituted or unsubstituted condensed aromatic ring, wherein each of $R^{101}$ and $R^{102}$ independently represents hydrogen or a group comprising 1 to 100 carbon atoms in total, and wherein at least one of $R^{101}$ and $R^{102}$ comprises a skeleton having a hole-transport property.

4. The light-emitting apparatus according to claim 1, wherein the third organic compound is represented by General Formula (G300), (G300)

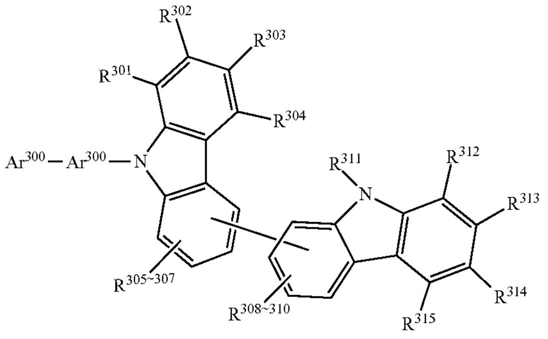

wherein $A^{300}$ represents any of a heteroaromatic ring comprising a pyridine skeleton, a heteroaromatic ring comprising a diazine skeleton, and a heteroaromatic ring comprising a triazine skeleton, wherein each of $R^{301}$ to $R^{315}$ independently represents hydrogen, a substituted or unsubstituted alkyl group comprising 1 to 6 carbon atoms, a substituted or unsubstituted cycloalkyl group comprising 5 to 7 carbon atoms, a substituted or unsubstituted aryl group comprising 6 to 13 carbon atoms in a skeleton, or a substituted or unsubstituted heteroaryl group comprising 3 to 13 carbon atoms in a skeleton, and wherein $Ar^{300}$ represents a substituted or unsubstituted arylene group comprising 6 to 25 carbon atoms, or a single bond.

5. The light-emitting apparatus according to claim 1, wherein the second organic compound is represented by General Formula (G200), (G200)

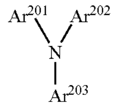

wherein each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group, and wherein $Ar^{203}$ represents a substituent comprising a carbazole skeleton.

6. The light-emitting apparatus according to claim 1, wherein the first light-emitting substance emits phosphorescent light.

7. A light-emitting apparatus comprising:

a first light-emitting device and a second light-emitting device that are adjacent to each other over an insulating surface, wherein the first light-emitting device comprises a first anode, a first cathode, and a first EL layer interposed between the first anode and the first cathode, wherein the second light-emitting device comprises a second anode, a second cathode, and a second EL layer interposed between the second anode and the second cathode, wherein the first EL layer comprises a first light-emitting layer, wherein the second EL layer comprises a second light-emitting layer, wherein the first light-emitting layer comprises a first organic compound, a second organic compound, and a first light-emitting substance, wherein the second light-emitting layer comprises a second light-emitting substance, wherein the first light-emitting substance emits red light, wherein a distance between an end portion of the first light-emitting layer and an end portion of the second light-emitting layer facing each other is greater than or equal to 2 μm and less than or equal to 5 μm, wherein the first organic compound is represented by General Formula (G100), (G100)

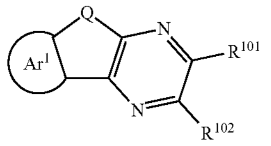

wherein Q represents an oxygen atom or a sulfur atom, wherein $Ar^1$ represents a substituted or unsubstituted aromatic ring or a substituted or unsubstituted condensed aromatic ring, wherein each of $R^{101}$ and $R^{102}$ independently represents hydrogen or a group comprising 1 to 100 carbon atoms in total, and wherein at least one of $R^{101}$ and $R^{102}$ comprises a skeleton having a hole-transport property.

8. The light-emitting apparatus according to claim 7, wherein the second organic compound is represented by General Formula (G200), (G200)

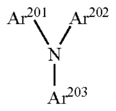

wherein each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group, and wherein $Ar^{203}$ represents a substituent comprising a carbazole skeleton.

9. The light-emitting apparatus according to claim 7, wherein the first light-emitting substance emits phosphorescent light.

10. A light-emitting apparatus comprising:

a first light-emitting device and a second light-emitting device that are adjacent to each other over an insulating surface, wherein the first light-emitting device comprises a first anode, a first cathode, and a first EL layer interposed between the first anode and the first cathode, wherein the second light-emitting device comprises a second anode, a second cathode, and a second EL layer interposed between the second anode and the second cathode, wherein the first EL layer comprises a first light-emitting layer and a first layer, wherein the first layer is positioned between the first light-emitting layer and the first cathode, wherein the second EL layer comprises a second light-emitting layer, wherein the first light-emitting layer comprises a first organic compound, a second organic compound, and a first light-emitting substance, wherein the first layer comprises a third organic compound, wherein the second light-emitting layer comprises a second light-emitting substance, wherein the first light-emitting substance emits red light, wherein a distance between an end portion of the first light-emitting layer and an end portion of the second light-emitting layer facing each other is greater than or equal to 2 μm and less than or equal to 5 μm, wherein the first organic compound is represented by General Formula (G100), (G100)

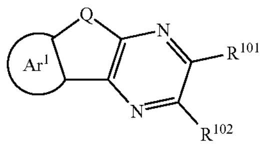

wherein Q represents an oxygen atom or a sulfur atom, wherein $Ar^1$ represents a substituted or unsubstituted aromatic ring or a substituted or unsubstituted condensed aromatic ring, wherein each of $R^{101}$ and $R^{102}$ independently represents hydrogen or a group comprising 1 to 100 carbon atoms in total, wherein at least one of $R^{101}$ and $R^{102}$ comprises a skeleton having a hole-transport property, wherein the second organic compound is represented by General Formula (G200), (G200)

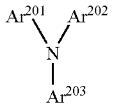

wherein each of $Ar^{201}$ and $Ar^{202}$ independently represents a substituted or unsubstituted fluorenyl group, a substituted or unsubstituted spirofluorenyl group, or a substituted or unsubstituted biphenyl or terphenyl group, wherein $Ar^{203}$ represents a substituent comprising a carbazole skeleton, wherein the third organic compound is represented by General Formula (G300), (G300)

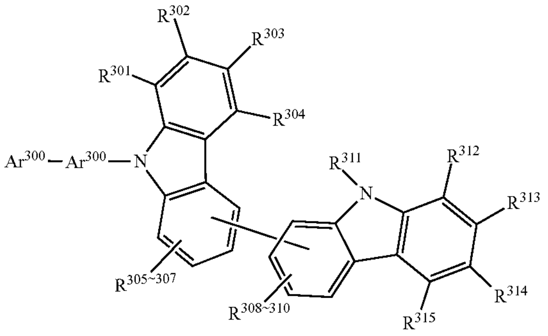

wherein $A^{300}$ represents any of a heteroaromatic ring comprising a pyridine skeleton, a heteroaromatic ring comprising a diazine skeleton, and a heteroaromatic ring comprising a triazine skeleton, wherein each of $R^{301}$ to $R^{315}$ independently represents hydrogen, a substituted or unsubstituted alkyl group comprising 1 to 6 carbon atoms, a substituted or unsubstituted cycloalkyl group comprising 5 to 7 carbon atoms, a substituted or unsubstituted aryl group comprising 6 to 13 carbon atoms in a skeleton, or a substituted or unsubstituted heteroaryl group comprising 3 to 13 carbon atoms in a skeleton, and wherein $Ar^{300}$ represents a substituted or unsubstituted arylene group comprising 6 to 25 carbon atoms, or a single bond.

11. The light-emitting apparatus according to claim 10, wherein the first light-emitting substance emits phosphorescent light.

* * * * *